United States Patent
Kang et al.

(10) Patent No.: US 11,357,117 B2
(45) Date of Patent: Jun. 7, 2022

(54) DISPLAY DEVICE

(71) Applicant: LG ELECTRONICS INC., Seoul (KR)

(72) Inventors: Kitae Kang, Seoul (KR); Dohyeon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/674,976

(22) Filed: Nov. 5, 2019

(65) Prior Publication Data
US 2020/0068728 A1    Feb. 27, 2020

Related U.S. Application Data

(63) Continuation of application No. 15/821,955, filed on Nov. 24, 2017, now Pat. No. 10,506,726.
(Continued)

(30) Foreign Application Priority Data

Mar. 10, 2017  (KR) .................... 10-2017-0030857

(51) Int. Cl.
*H05K 5/00* (2006.01)
*G06F 1/16* (2006.01)
(Continued)

(52) U.S. Cl.
CPC ......... *H05K 5/0017* (2013.01); *B21B 39/008* (2013.01); *G06F 1/1601* (2013.01);
(Continued)

(58) Field of Classification Search
CPC ....................................................... H05K 7/00
See application file for complete search history.

(56) References Cited

U.S. PATENT DOCUMENTS

| 8,031,400 B2 | 10/2011 | Wang et al. |
| 2004/0074123 A1* | 4/2004 | Pritchard ............ G09F 15/0068 40/610 |

(Continued)

FOREIGN PATENT DOCUMENTS

| CN | 102272815 | 12/2011 |
| EP | 0984321 | 3/2000 |
| JP | 2012508402 | 4/2012 |

OTHER PUBLICATIONS

State Intellectual Property Office of the People's Republic of China Application Serial No. 201780033889.5, Office Action dated Jun. 18, 2020, 14 pages.
(Continued)

*Primary Examiner* — Jerry Wu
(74) *Attorney, Agent, or Firm* — Lee, Hong, Degerman, Kang & Waimey PC

(57) ABSTRACT

A display device is disclosed. The display device includes a housing, a flexible display having an upper surface, a lift assembly provided in the housing and coupled to the upper surface of the flexible display screen to extend the flexible display screen outside the housing, a motor provided in the housing and coupled to the lift assembly to raise the flexible display screen, and an elastic member provided adjacent to the upper surface of the flexible display screen, the elastic member configured to apply a vertical force to the upper surface of the flexible display screen.

8 Claims, 69 Drawing Sheets

Related U.S. Application Data

(60) Provisional application No. 62/429,070, filed on Dec. 1, 2016.

(51) Int. Cl.
| | | |
|---|---|---|
| *H05K 5/02* | (2006.01) | |
| *H05K 5/03* | (2006.01) | |
| *G09F 9/30* | (2006.01) | |
| *B21B 39/00* | (2006.01) | |
| *H01L 51/00* | (2006.01) | |
| *H01L 51/52* | (2006.01) | |

(52) U.S. Cl.
CPC ............ *G06F 1/1652* (2013.01); *G09F 9/301* (2013.01); *H01L 51/0097* (2013.01); *H01L 51/5237* (2013.01); *H05K 5/0217* (2013.01); *H05K 5/0247* (2013.01); *H01L 2251/5338* (2013.01); *H05K 5/03* (2013.01)

(56) References Cited

U.S. PATENT DOCUMENTS

| | | |
|---|---|---|
| 2010/0177020 A1 | 7/2010 | Bemelmans et al. |
| 2011/0132557 A1 | 6/2011 | Kuroi et al. |
| 2011/0140995 A1 | 6/2011 | Hamers et al. |
| 2012/0002357 A1* | 1/2012 | Auld .................. G09F 21/04 361/679.01 |
| 2012/0206801 A1 | 8/2012 | Kuroi |
| 2018/0160554 A1 | 6/2018 | Kang et al. |

OTHER PUBLICATIONS

European Patent Office Application Serial No. 17876306.6, Search Report dated Jun. 25, 2020, 10 pages.
Korean Intellectual Property Office Application No. 10-2017-0030857, Office Action dated Dec. 19, 2018, 6 pages.
Korean Intellectual Property Office Application No. 10-2018-0112281, Office Action dated Jan. 22, 2019, 6 pages.
U.S. Appl. No. 15/821,955, Notice of Allowance dated Aug. 1, 2019, 16 pages.

* cited by examiner

DISPLAY DEVICE

CROSS-REFERENCE TO RELATED APPLICATIONS

This application a continuation of U.S. patent application Ser. No. 15/821,955, filed on Nov. 24, 2017, now U.S. Pat. No. 10,506,726, which claims the benefit of earlier filing date and right of priority to U.S. Provisional Application No. 62/429,070, filed on Dec. 1, 2016 and also claims the benefit of Korean Application No. 10-20170030857, filed on Mar. 10, 2017, the contents of which are all incorporated herein in their entirety.

BACKGROUND

1. Field

The present disclosure relates to a display device.

2. Background

Display devices, particularly flexible display devices, and housings for the same are known, but they suffer from various disadvantages.

BRIEF DESCRIPTION OF THE DRAWINGS

Embodiments will be described in detail with reference to the following drawings in which like reference numerals refer to like elements, and wherein.

DETAILED DESCRIPTION

Figure 1:
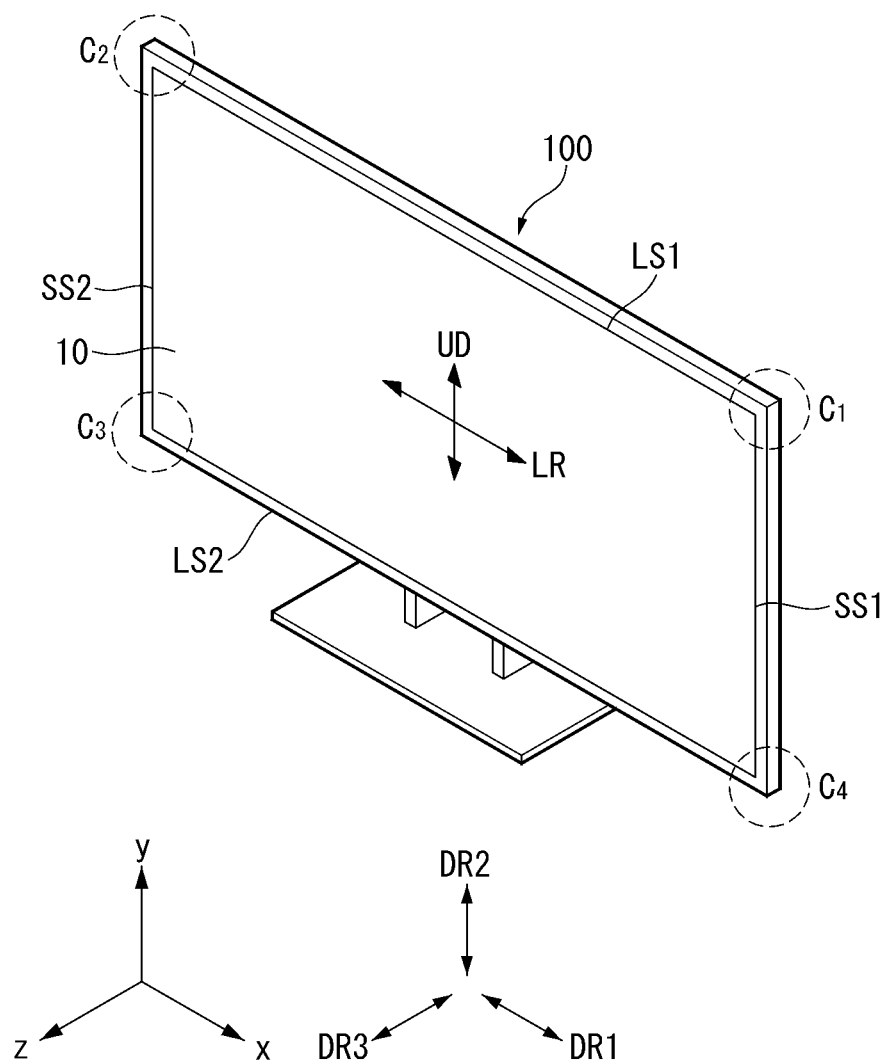
FIGS. 1 to 17K are diagrams showing the configuration of a display device related to an embodiment of the present disclosure.

Reference will now be made in detail embodiments of the disclosure examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical with those used in the context of a related art, and are not to be construed to have ideal or excessively formal meanings unless they are obviously specified in the present application.

The following exemplary embodiments of the present disclosure are provided to those skilled in the art in order to describe the present disclosure more completely. Accordingly, shapes and sizes of elements shown in the drawings may be exaggerated for clarity.

As the information-oriented society is developed, needs for the display device are increased in various forms. In line with the needs, recently, various display devices, such as a liquid crystal display device (LCD), a plasma display panel (PDP), an electro-luminescent display (ELD), and a vacuum fluorescent display (VFD), are researched and used.

From among them, a display device using organic light-emitting diodes (OLED) has advantages in that it has an excellent brightness characteristic and viewing angle characteristic compared to the LCD and it can be implemented in an ultra-thin type because it does not need a backlight unit.

Furthermore, a flexible display may be bent or wound on a roller. A display device spread on the roller or wound on the roller, if necessary, may be implemented using the flexible display. In this case, there is a problem in stably winding or retracting the flexible display on the roller or in stably unwinding or extending the flexible display from the roller.

An organic light-emitting display (OLED) is hereinafter described as an example of a display panel, but the display panel that may be applied to the present disclosure is not limited to a liquid crystal panel and may include a liquid crystal display device (LCD), a plasma display panel (PDP), and a field emission display (FED).

FIGS. 1 to 17K are diagrams showing the configuration of a display device related to an embodiment of the present disclosure.

As shown in FIG. 1, hereinafter, a display device 100 may include a first long side LS1, a second long side LS2 opposite the first long side LS1, a first short side SS1 neighboring the first long side LS1 and the second long side LS2, and a second short side SS2 opposite the first short side SS1.

The first short side area SS1 may be called a first side area. The second short side area SS2 may be called a second side area opposite the first side area. The first long side area LS1 may be called a third side area that neighbors the first side area and the second side area and that is located between the first side area and the second side area. The second long side area LS2 may be called a fourth side area that neighbors the first side area and the second side area, that is located between the first side area and the second side area, and that is opposite the third side area.

Furthermore, for convenience of description, the length of the first and the second long sides LS1 and LS2 has been illustrated as belong longer than that of the first and the second short sides SS1 and SS2, but the length of the first and the second long sides LS1 and LS2 may be approximately the same as that of the first and the second short sides SS1 and SS2.

Furthermore, hereinafter, a first direction DR1 may be a direction parallel to the long sides LS1 and LS2 of the display device 100, and a second direction DR2 may be a direction parallel to the short sides SS1 and SS2 of the display device 100.

A third direction DR3 may be a direction perpendicular to the first direction DR1 and/or the second direction DR2.

The first direction DR1 and the second direction DR2 may be collectively referred to as a horizontal direction. Furthermore, the third direction DR3 may be called a vertical direction.

From another aspect, a side of the display device 100 on which an image is displayed may be called the front or front surface. When an image is displayed on the display device 100, a side on which an image cannot be viewed may be called the back or a back surface. When the display device 100 is viewed from the front or the front surface, the first long side LS1 may be called an upper side or a top surface. In the same manner, the second long side LS2 may be called a lower side or a bottom surface. In the same manner, the first short side SS1 may be called a left side or a left surface, and the second short side SS2 may be called a right side or a right surface.

Furthermore, the first long side LS1, the second long side LS2, the first short side SS1, and the second short side SS2 may be referred to as the edges of the display device 100. Furthermore, points at which the first long side LS1, the second long side LS2, the first short side SS1, and the second short side SS2 are met may be referred to as corners. For example, the point at which the first long side LS1 and the first short side SS1 are met may be a first corner C1. The point at which the first long side LS1 and the second short side SS2 are met may be a second corner C2. The point at which the second short side SS2 and the second long side LS2 are met may be a third corner C3. The point at which the second long side LS2 and the first short side SS1 are met may be a fourth corner C4.

In this case, a direction from the first short side SS1 to the second short side SS1 or a direction from the second short side SS2 to the first short side SS1 may be called a left right direction LR. A direction from the first long side LS1 to the second long side LS2 or a direction from the second long side LS2 to the first long side LS1 may be called an up down direction UD.

An +x-axis direction may be referred to as a right direction or a right-side direction or a right surface direction. A −x-axis direction may be referred to as a left direction or a left-side direction or a left surface direction. A +y-axis direction may be referred to as an upper direction, A −y-axis direction may be referred to as a lower direction, A +z-axis direction may be referred to as a front direction or a front-side direction or a front surface direction. A −z-axis direction may be referred to as a back direction or a backside direction or a back surface direction.

The x-axis direction may be parallel to the first direction. The y-axis direction may be parallel to the second direction. The z-axis direction may be parallel to the third direction.

Figure 2:
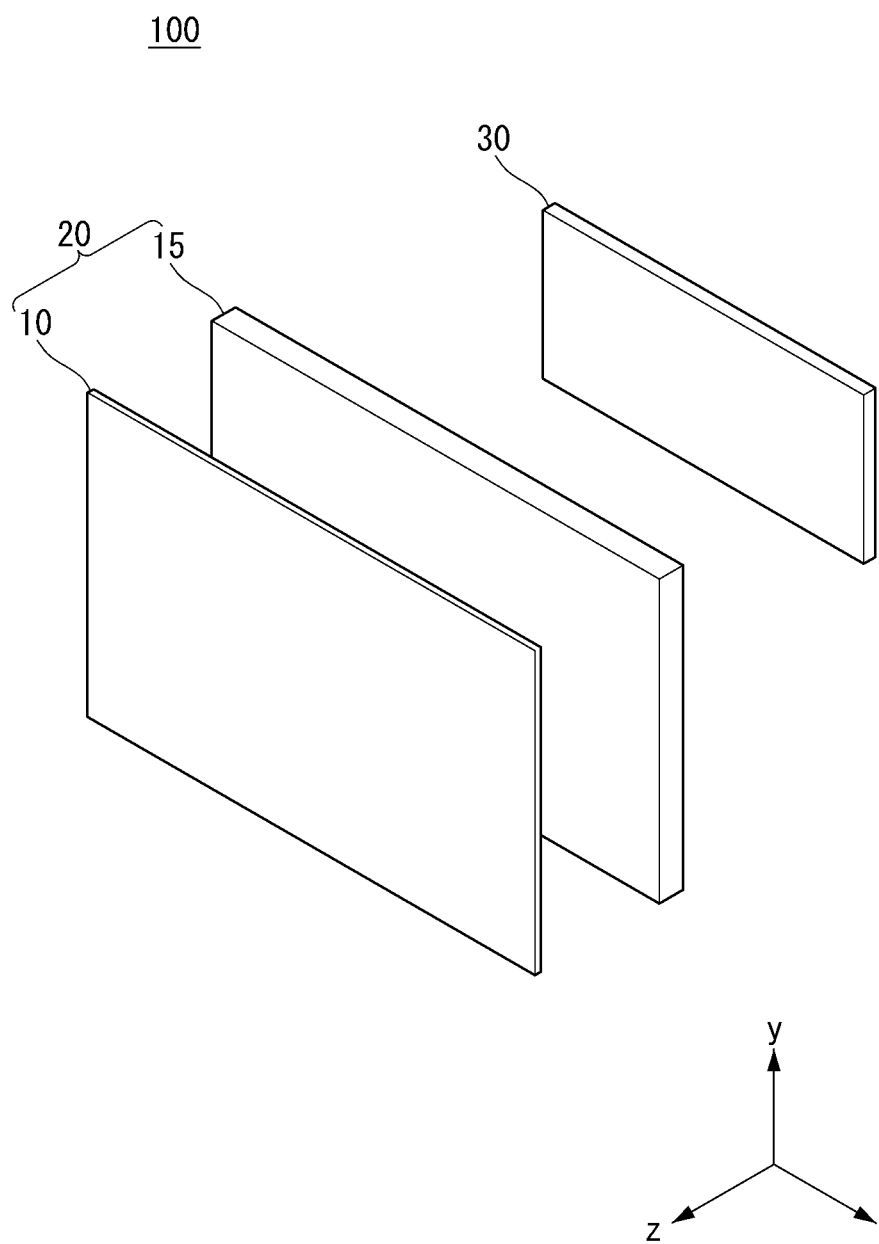

Referring to FIG. 2, a display device 100 according to an embodiment of the present disclosure may include a display portion 20 and a housing 30.

The display portion 20 may include a display panel 10 and a module cover 15. The display panel 10 is provided in the front surface of the display device 100, and an image may be displayed on the display panel 10. The display panel 10 may divide an image into a plurality of pixels, and may display the image by controlling the pixels so that the pixels emit light in accordance with color, brightness, and chroma for each pixel. The display panel 10 may be divided into an active area on which an image is displayed and an inactive area on which an image is not displayed.

If the display panel 10 has flexibility, it may be referred to as a flexible display panel 10.

The display panel 10 may have a rectangle, but is not limited thereto. The display panel 10 may have a shape having specific curvature at a corner. The display panel 10 may be an OLED panel, but is not limited thereto. For example, the display panel 10 may be an LCD panel.

The module cover 15 may be provided in the back surface of the display panel 10. The module cover 15 may be directly attached to the display panel 10. The module cover 15 may have a size equal to or greater than the size of the display panel 10.

The module cover 15 may support the back surface of the display panel 10. Accordingly, the module cover 15 may include a material which is light and has high strength. For example, the module cover 15 may include an aluminum or stainless material.

The housing 30 may be provided in the back surface of the display portion 20. That is, this means that the housing 30 may be provided in the back surface of the module cover 15. The housing 30 may shield at least one PCB. That is, this means that the housing 30 may cover at least one PCB attached to the back surface of the module cover 15. A detailed coupling structure and method of at least one PCB is described later.

Electromagnetic waves emitted by at least one PCB may be transferred to the housing 30. Accordingly, although not shown, the housing 30 may include an inner housing that is made of a conductive material and an outer housing that covers the inner housing. However, the present disclosure is not limited thereto. For example, the housing 30 may be made of a single conductive material.

Figure 3:
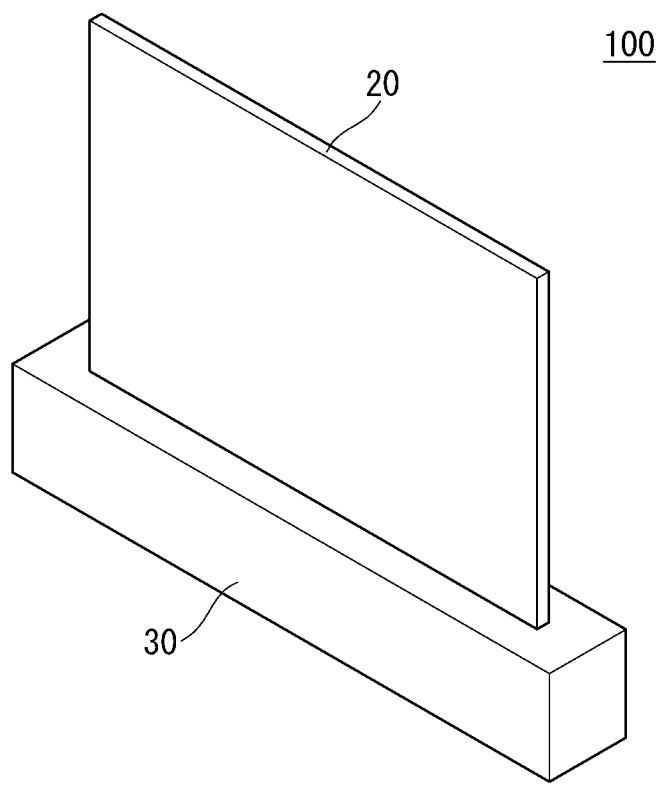
Figure 3:
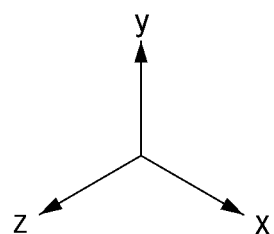

Referring to FIG. 3, in the display device 100 according to an embodiment of the present disclosure, the housing 30 may be located under the display portion 20. More specifically, the housing 30 may have a shape that surrounds the lower portion of the display portion 20. The housing 30 may have several driving devices or driving circuits disposed therein not exposed to the outside.

The width of the housing 30 in the first and the third directions may be greater than that of the display portion 20 in order to protect the display portion 20 within the housing 30. The width of the housing 30 in the second direction may be smaller than that of the display portion 20.

In the display device 100 according to an embodiment of the present disclosure, the housing 30 may not be located in the active area of the display portion 20.

Figure 4:
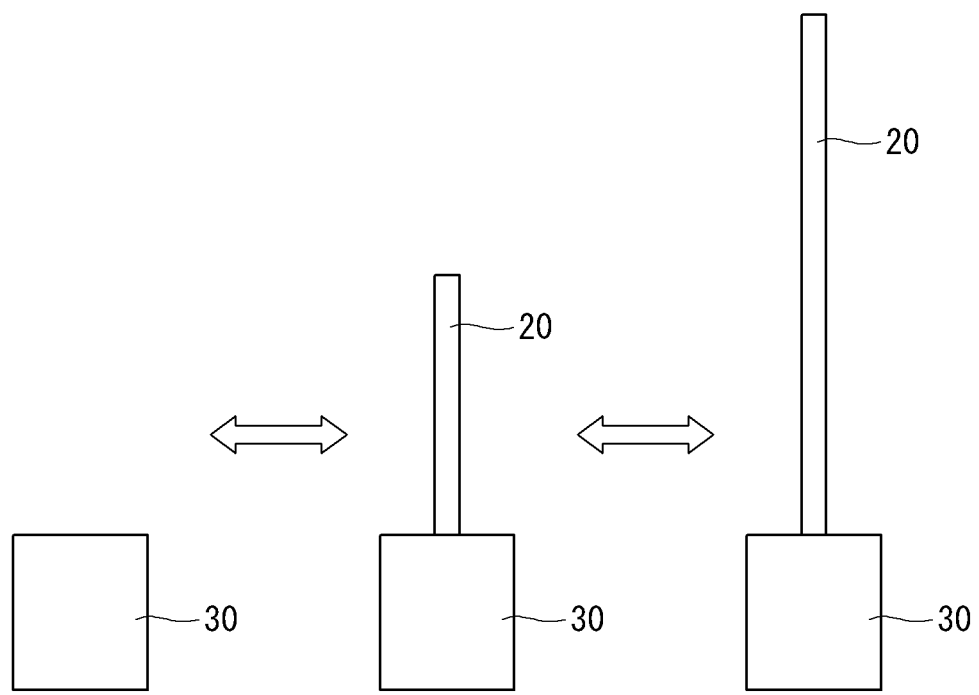

Referring to FIG. 4, the display device 100 according to an embodiment of the present disclosure may have a first state in which the active area of the display portion 20 is located within the housing 30 and a second state in which the active area of the display portion 20 is exposed outside the housing 30.

When the display device 100 is the first state, the active area of the display portion 20 may be located within the housing 30. That is, this means that the display portion 20 may be shielded by the housing 30.

When the display device 100 is the second state, the active area of the display portion 20 may be exposed outside the housing 30. That is, this means that when the display portion 20 is the second state, at least some of the display portion 20 may be protruded upward from the housing 30.

Although not shown, the display portion 20 may change from the first state to the second state by a roller located within the housing 30. More specifically, the display portion 20 may change from the first state in which it has been wound by the roller to the second state in which the display portion 20 has been unwound and exposed to the outside by the roller. To the contrary, when the roller is unwound and wound, the display portion 20 may change from the second state to the first state. A detailed structure and operating method of the roller and the display portion 20 are described later.

In the display device 100 according to an embodiment of the present disclosure, the display portion 20 may have any one of the first state and the second state. Accordingly, the display portion 20 may be exposed outside the housing 30 only when the display device 100 is used, and thus the occupied space may be reduced when not in use.

Figure 5:
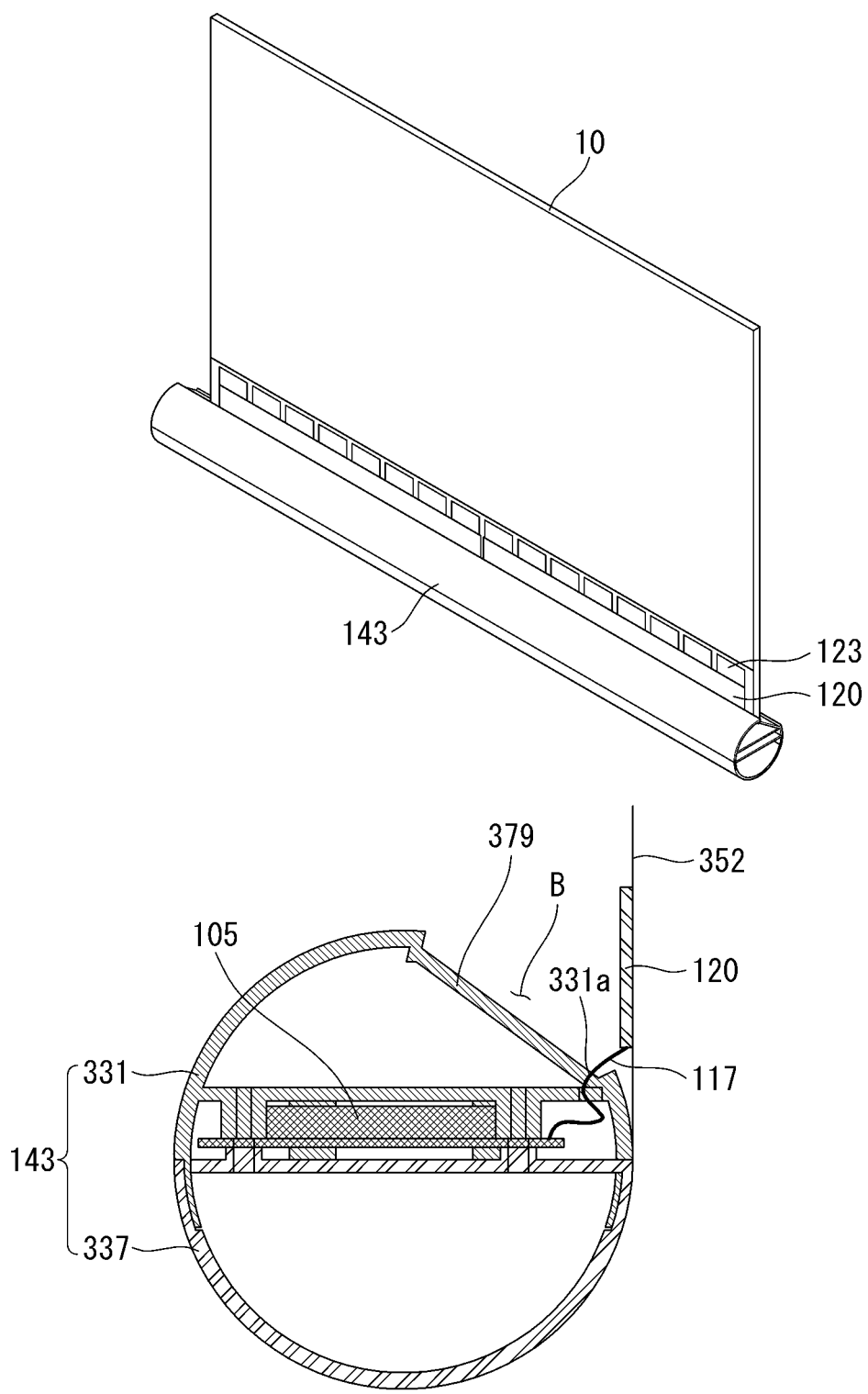

Referring to FIG. 5, in the display device according to an embodiment of the present disclosure, a panel roller 143 may be connected to one end of the display panel 10. The panel roller 143 may wind or unwind the display panel 10 so that the display panel 10 has any one of the first state and the second state. The panel roller 143 may also be referred to as the roller 143.

In the display device according to an embodiment of the present disclosure, at least one source PCB 120 may be located in at least part of the front surface of the display panel 10. The one or more source PCBs 120 may be spaced apart from each other.

Signal lines for transmitting digital video data and timing control signals transmitted by a timing controller board 105 may be located in the at least one source PCB 120. The source PCB 120 may be connected to the display panel 10 by a source chip on film (COF) 123. The source COF 123 connected to one side of the source PCB 120 may be extended to the active area of the display panel 10 and connected to the display panel 10.

A seating portion 379 may be located in the outer circumference of the panel roller 143. The seating portion 379 may form an accommodation space B by stepping part of the outer circumference of the panel roller 143. As the panel roller 143 is wound, the source PCB 120 may be located in a portion of the seating portion 379 where the source PCB 120 comes into contact with the panel roller 143. The seating portion 379 may have a shape in which at least part of the outer circumference of the panel roller 143 has been depressed.

When the panel roller 143 is wound, the source PCB 120 may be accommodated in the accommodation space B of the seating portion 379. Accordingly, although the panel roller 143 is wound, there may be no damage to the source PCB 120.

The timing controller board 105 may be disposed within the panel roller 143. An FFC cable 117 (e.g., a flexible flat cable) electrically connects the timing controller board 105 and the source PCB 120.

The panel roller 143 may include an upper panel roller 331 and a lower panel roller 337. The upper panel roller 331 and the lower panel roller 337 may be coupled together by a screw. The timing controller board 105 may be disposed between the upper panel roller 331 and the lower panel roller 337. The screw may combine the upper panel roller 331, the lower panel roller 337, and the timing controller board 105. The FFC cable 117 may be connected to the timing controller board 105 and the source PCB 120 through a hole 331a located in the upper panel roller 331.

In the display device according to an embodiment of the present disclosure, the FFC cable 117 may not be entangled because the timing controller board 105 is rotated along with the panel roller 143. Furthermore, the space can be reduced because the timing controller board 105 is disposed within the panel roller 143.

Figure 6:
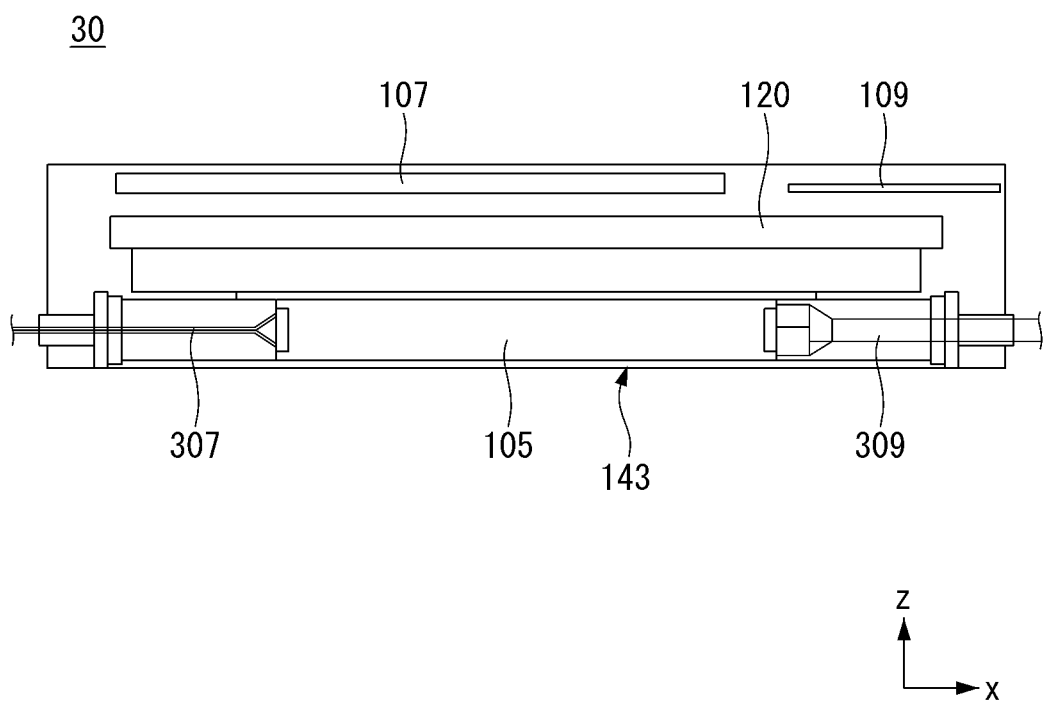

Referring to FIG. 6, in the display device according to an embodiment of the present disclosure, the timing controller board 105 may be disposed in the panel roller 143 on one side of the central part of the housing 30 on which the display panel rises and fall, and a main board 109 and a power supply 107 may be located on the other side of the central part of the housing 30.

The timing controller board 105 may be connected to the main board 109 and the power supply 107. The timing controller board 105 may be connected to the main board 109 and the power supply 107 through a wiring electrode. The wiring electrode may include a first wiring electrode 307 that connects the timing controller board 105 and the power supply 107 and a second wiring electrode 309 that connects the timing controller board 105 and the main board 109.

For example, a plurality of the first wiring electrodes 307 may be used. Furthermore, the first wiring electrode 307 may have a circle. The first wiring electrode 307 may connect the timing controller board 105 and the power supply 107 through the opening portion of the central part of the pivot of the panel roller 143.

The FFC cable by which the timing controller board 105 and the source PCB 120 are connected may be used as the second wiring electrode 309. The second wiring electrode 309 may connect the timing controller board 105 and the main board 109 through the opening portion of the central part of the pivot of the panel roller 143.

The first wiring electrode 307 and the second wiring electrode 309 may be located on the opposite sides of the timing controller board 105. The opening portion through which the first wiring electrode 307 passes and the opening portion through which the second wiring electrode 309 passes may be located on opposite sides.

In the display device according to an embodiment of the present disclosure, the timing controller board 105 is disposed in the panel roller 143, and the power supply 107 and the main board 109 may be located on the opposite sides of the display panel. Accordingly, there is an advantage in that the space within the housing 30 can be reduced.

Figure 7:
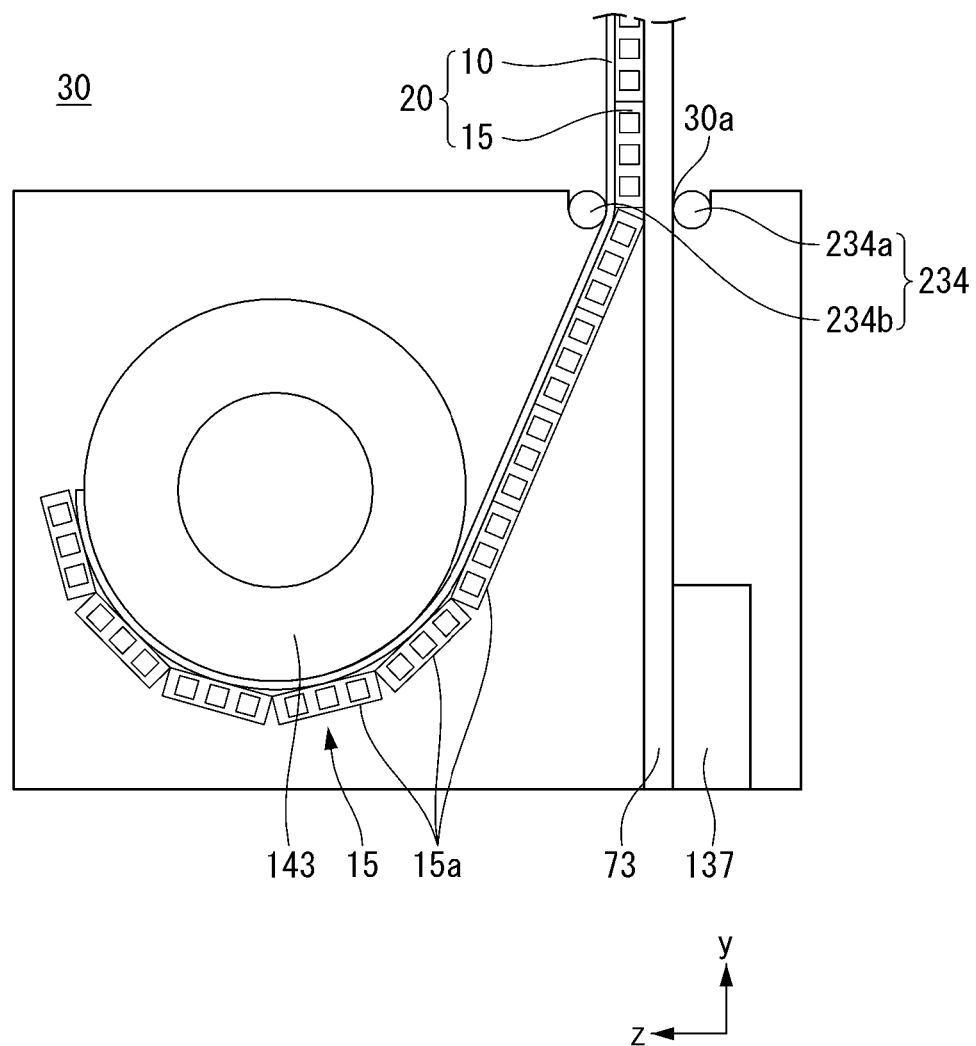

Referring to FIG. 7, the display device according to an embodiment of the present disclosure may include the panel roller 143, a motor assembly 137, and a link 73 within the housing 30.

The link 73 may also be referred to as a support portion 73.

The module cover 15 may include a plurality of segments 15a. The segment 15a may also be referred to as an apron.

The panel roller 143 may be located at the front based on a portion on which the display portion 20 of the housing 30 rises or falls. The panel roller 143 may wind the display panel 10 and the module cover 15 at the same time.

The link 73 may be installed on the housing 30. The link 73 may function to support the display panel 10 and the module cover 15 so that they rise or fall. The link 73 may raise or drop an upper bar 75 (refer to FIG. 9A) connected to the upper part of the module cover 15 and the display panel 10.

The display portion 20 may have a top connected to the upper bar 75 and a bottom connected to the panel roller 143. A portion between the top and bottom of the display portion 20 may be easily bent. The link 73 may support the module cover 15 in the back surface of the module cover 15 so that the module cover 15 is not bent.

The motor assembly 137 may be located in a portion to which the link 73 is connected. The motor assembly 137 may drive the link 73 so that the link rises or falls. The motor assembly 137 may receive an electrical signal and convert it into a physical force. The motor assembly 137 may change the link 73 from the first state to the second state by transferring rotating energy to the link 73. A detailed structure and driving principle of the motor assembly 137 are described later.

A guide bar 234 may be located at an entrance 30a through which the link 73 rises or falls into the housing 30. The guide bar 234 may include first and second guide bars 234a and 234b. The entrance 30a of the housing 30 may be formed between the first and the second guide bars 234a and 234b. The first and the second guide bars 234a and 234b may face each other with the link 73 interposed therebetween. For example, the first guide bar 234a may be located at the back of the link 73, and the second guide bar 234b may be located at the front of the link 73.

The display device according to an embodiment of the present disclosure may wind the display panel 10 and the module cover 15 at the same time using a single roller. Accordingly, the thickness of the housing 30 can be reduced.

Figure 8:
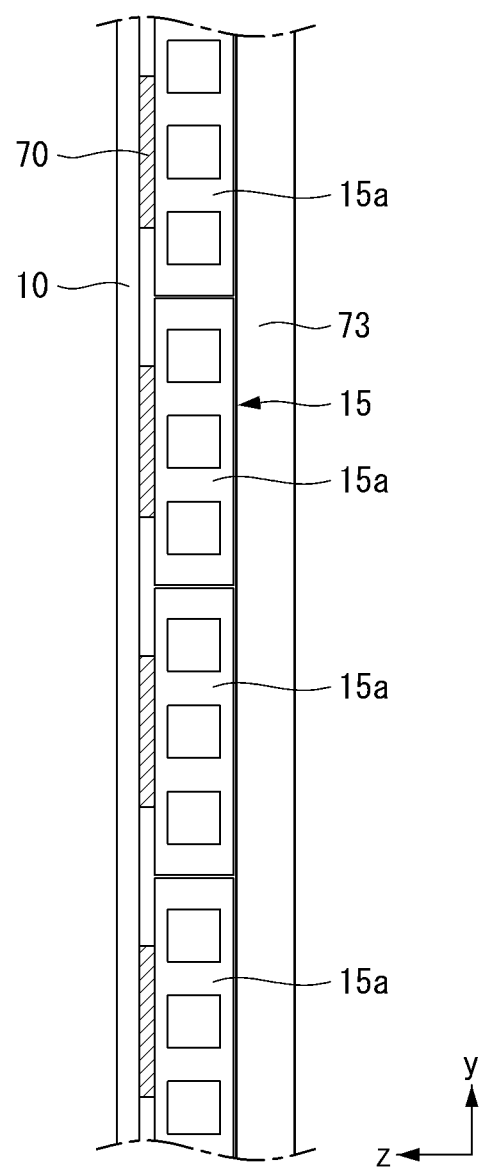

Referring to FIG. 8, the segment 15a may have a rectangle. The segments 15a may be separated in the y-axis direction, and may be attached to the back surface of the display panel 10. The module cover 15 includes the plurality of segments 15a and may be wound or unwound by the roller. The module cover 15 may include a plastic or aluminum material. Accordingly, the module cover 15 can protect the display panel 10 against an external impact.

The display panel 10 and the module cover 15 may be combined through adhesive layers 70. The adhesive layer 70 may be a double-sided tape. The module cover 15, together with the display panel 10, may be wound on by the adhesive layers 70. The adhesive layers 70 may be located on the segments 15a and attached to the display panel 10. The adhesive layers 70 may have been spaced apart from each other. Accordingly, the shape of the module cover 15 may be easily changed when the module cover 15 is wound or unwound by the roller. If the width of the adhesive layer 70 in the second direction becomes thin, the display panel 10 is not wrinkled and may be naturally unwound from or wound on the panel roller 143 (refer to FIG. 7).

Furthermore, as the width of the segment 15a in the second direction increases, the segment 15a can stably support the display panel 10 due to enhanced stiffness.

If the width of the adhesive layer 70 in the second direction is 30% or less the width of the segment 15a in the second direction, the wrinkling of the display screen can be reduced because an external force is less applied to the display panel 10.

Furthermore, if the width of the adhesive layer 70 in the second direction is 15% or more the width of the segment 15a in the second direction, the wrinkling of the display panel 10 can be significantly reduced because the stiffness of the display panel 10 is improved.

Furthermore, as the width of the adhesive layer 70 in the third direction increases, the display panel 10 may be less deformed with respect to an external force. More specifically, as the width of the adhesive layer 70 in the third direction increases, the display panel 10 and the module cover 15 can be stably attached due to enhanced flexibility.

Furthermore, as the width of the segment 15a in the third direction decreases, the wrinkling of the display panel 10 can be reduced. More specifically, as the width of the segment 15a in the third direction decreases, the wrinkling of the display panel 10 can be reduced due to enhanced stiffness.

Accordingly, if the width of the adhesive layer 70 in the third direction is 3% or more the width of the segment 15a in the third direction, the wrinkling of the display panel 10 can be significantly reduced because the stiffness of the display panel 10 is enhanced.

Furthermore, if the width of the adhesive layer 70 in the third direction is 6% or less the width of the segment 15a in the third direction, the wrinkling of the display panel 10 can be significantly reduced because the stiffness of the display panel 10 is increased.

In the display device according to an embodiment of the present disclosure, the module cover 15 includes the plurality of the segments 15a, and the adhesive layers 70 may be located on the segments 15a, respectively.

Figure 9A:
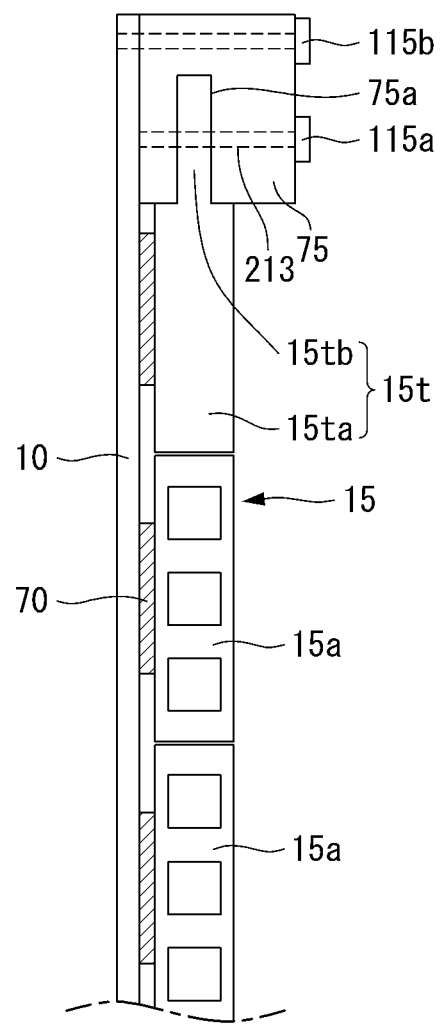
Figure 9B:
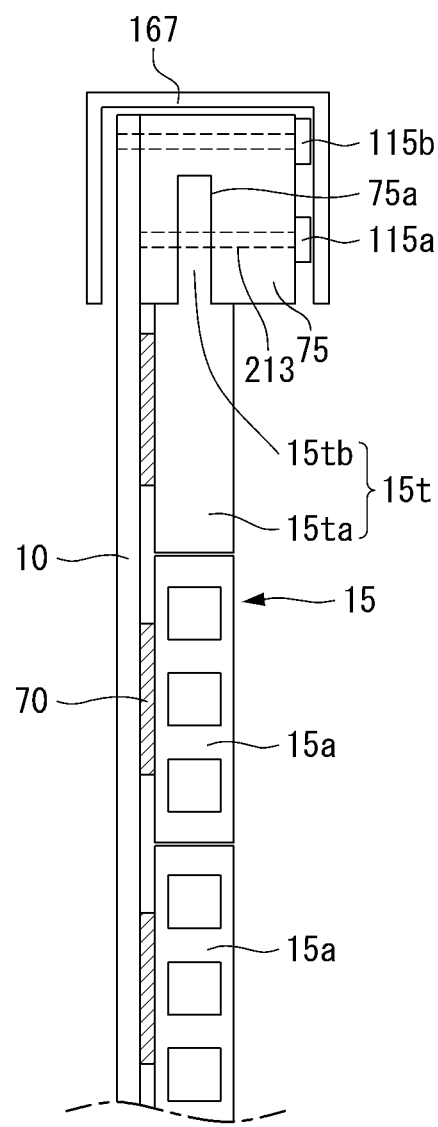
Figure 9B:
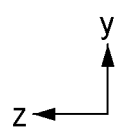

Referring to FIGS. 9A and 9B, in the display device according to an embodiment of the present disclosure, the module cover 15 and the display panel 10 may be coupled to the upper bar 75. The module cover 15, the display panel 10, and the upper bar 75 may be coupled together by screws 115a and 115b.

The screws 115a and 115b may enable the upper bar 75, the module cover 15, and the display panel 10 to rise or fall together. The screw 115a may couple the upper bar 75 and the module cover 15 together. Alternatively, the screw 115b may couple the upper bar 75 and the display panel 10 together, but the present disclosure is not limited thereto. For example, the one or more screws 115a and 115b may couple the module cover 15, the upper bar 75, and the display panel 10 together.

The upper part of the module cover 15 may have a shape to be coupled to the upper bar 75. An upper segment 15t may be located at the top of the module cover 15. The upper segment 15t may have a shape different from those of the remaining segments 15a. The upper segment 15t may also be referred to as the upper module cover 15t.

The upper segment 15t may include a first body 15ta connected to another segment 15a and a second body 15tb connected to the upper bar 75. The bottom of the first body 15ta may be connected to another segment 15a, and the second body 15tb may be formed at the upper part of the first body 15ta.

The upper bar 75 may include a groove 75a formed in the +y-axis direction. The second body 15tb may be inserted into the groove 75a. The screw 115a may penetrate the second body 15tb in the z-axis direction.

The thickness of the first body 15*ta* in the z-axis direction may be formed to be thicker than that of the second body 15*tb* in the z-axis direction, Referring to 9B, a top casing 167 may shield the upper bar 75, the module cover 15, and the display panel 10. The upper bar 75, the module cover 15, and the display panel 10 may not be exposed outside the top casing 167. Accordingly, an external appearance of the display device may become neat and trim.

The top casing 167 may be coupled to upper bar 75, the module cover 15 or the display panel 10 by a screw.

Referring to 10A, the display device according to an embodiment of the present disclosure may have a shape in which both sides of the upper bar 75 are supported by the links 73. The upper bar 75 may rise or fall by the links 73. Each of the links 73 may include a first arm 73*a* and a second arm 73*b*.

The first arm 73*a* may also be referred to as an upper link 73*a*. The second arm 73*b* may also be referred to as a lower link 73*b*.

The first arm 73*a* and the second arm 73*b* may be connected by an arm joint 152. The arm joint 152 may also be referred to as the hinge 152 or the joint 152.

The top of the first arm 73*a* may be coupled to the upper bar 75. The other end of the first arm 73*a* may be coupled to the arm joint 152. The top of the second arm 73*b* may be coupled to the motor assembly. The bottom of the second arm 73*b* may be coupled to the arm joint 152.

A guide bar 234 may be located at the entrance 30*a* through which the link 73 rises or fall into the housing 30. The guide bar 234 may include first and second guide bars 234*a* and 234*b*. The entrance 30*a* of the housing 30 may be formed between the first and the second guide bars 234*a* and 234*b*. The first and the second guide bars 234*a* and 234*b* may face each with the link 73 interposed therebetween. For example, the first guide bar 234*a* may be located at the back of the link 73, and the second guide bar 234*b* may be located at the front of the link 73.

The panel roller 143 may be located at the front of the link 73. The base 31 of the housing 30 may include a plurality of brackets 221. The base 31 may also be referred to as a bottom surface 31.

The plurality of brackets 221 may be formed under the panel roller 143. The plurality of brackets 221 may be spaced apart from each other in the length direction of the panel roller 143. Alternatively, the plurality of brackets 221 may be spaced apart from each other in the length direction of the base 31. Each of the brackets 221 may be fixed to the base 31 through a screw.

Referring to 10B, the display device according to an embodiment of the present disclosure may have a gear shape in which the other side of the first arm 73*a* and one side of the second arm 73*b* located within the arm joint 152 correspond to each other and are geared. The arm joint 152 may also be referred to as a connecting portion 152. The first arm 73*a* may also be referred to as the upper support link 73*a*. The second arm 73*b* may also be referred to as the lower support link 73*b*.

The first arm 73*a* may be pivotally connected to the upper part of the arm joint 152. The second arm 73*b* may be pivotally connected to the lower part of the arm joint 152.

A gear st1 may be formed at the lower part of the first arm 73*a*. A gear st2 may be formed at the lower part of the second arm 73*b*. The gear st1 of the first arm 73*a* and the gear st2 of the second arm 73*b* may gear together.

The angle HRA1 of the first arm 73*a* from the ground and the angle HRA2 of the second arm 73*b* from the ground may be the same because the first arm 73*a* and the second arm 73*b* have the gear shape in which they are engaged. Furthermore, the angles between the first arms 73*a* and the second arms 73*b* on both sides may be the same because the first arm 73*a* and the second arm 73*b* have the gear shape in which they are engaged. Accordingly, both sides of the upper bar 75 may rise or fall while maintaining horizontality without leaning to one side. That is, the angles between the first arms 73*a* and second arms 73*b* of the links 73 on both sides may be the same regardless of the height of the upper bar 75 from the ground.

Referring to 11, the display device according to an embodiment of the present disclosure may further include a module cover roller 141 within the housing 30 in addition to the panel roller 143. The module cover roller 141 may also be referred to as an apron roller 141.

The panel roller 143 may be located at the front of the link 73, and the module cover roller 141 may be located at the back of the link 73. That is, the panel roller 143 and the module cover roller 141 may face each other based on the link 73.

The panel roller 143 may wind the display panel 10, and the module cover roller 141 may wind the module cover 15.

The module cover 15 may have a thicker thickness than the display panel 10. The module cover roller 141 on which the module cover 15 is wound may occupy more space within the housing 30 than the panel roller 143 on which the display panel 10 is wound. Accordingly, the motor assembly 137 may be located at the front of the link 73, which has a relatively marginal space, but the present disclosure is not limited thereto. For example, the motor assembly 137 may be located at the back of the link 73.

Since the display panel 10 and the module cover 15 are separated and wound within the housing 30, a force by which the panel roller 143 winds the display panel 10 may be greater than adhesive power between the display panel 10 and the module cover 15. Furthermore, a force by which the module cover roller 141 winds the module cover 15 may be greater than adhesive power between the display panel 10 and the module cover 15.

In an embodiment of the present disclosure, the display panel 10 and the module cover 15 may be wound by the two rollers, respectively. Accordingly, smaller weight may be applied to each roller compared to a case where the display panel 10 and the module cover 15 are wound by a single roller. Accordingly, the sagging of the display panel 10 wound on the panel roller 143 can be prevented. Furthermore, the sagging of the module cover 15 wound on the module cover roller 141 can be prevented.

Figure 12:
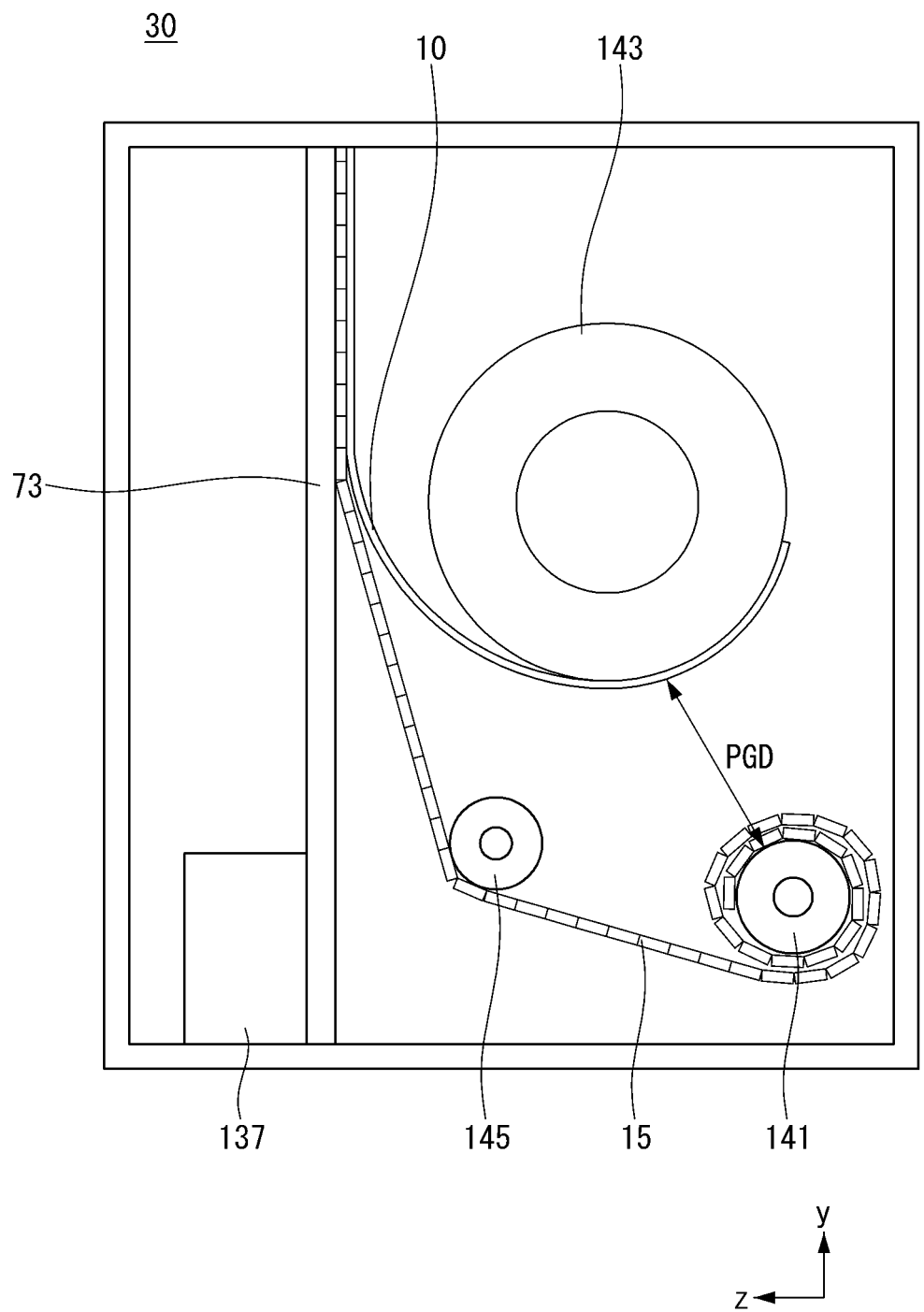

Referring to FIG. 12, the panel roller 143 and the module cover roller 141 may be located on the same side of the link 73. For example, the panel roller 143 and the module cover roller 141 may be located at the back of the link 73, but the present disclosure is not limited thereto. For example, the panel roller 143 and the module cover roller 141 may be located at the front of the link 73.

The module cover roller 141 may be located under the panel roller 143. Interference may be generated between the module cover roller 141 on which the module cover 15 has been wound and the panel roller 143 on which the display panel 10 has been wound. Accordingly, the module cover roller 141 may be separated from the panel roller 143 at a first interval PGD or more, thereby preventing the mutual interference.

The first interval PGD may be a distance by which interference between the display panel 10 wound on the panel roller 143 and the module cover 15 wound on the module cover roller 141 is prevented.

A guide roller 145 may be located under the panel roller 143. The guide roller 145 may guide the location of the module cover 15 so that the module cover 15 does not interfere with the panel roller 143.

Figure 13:
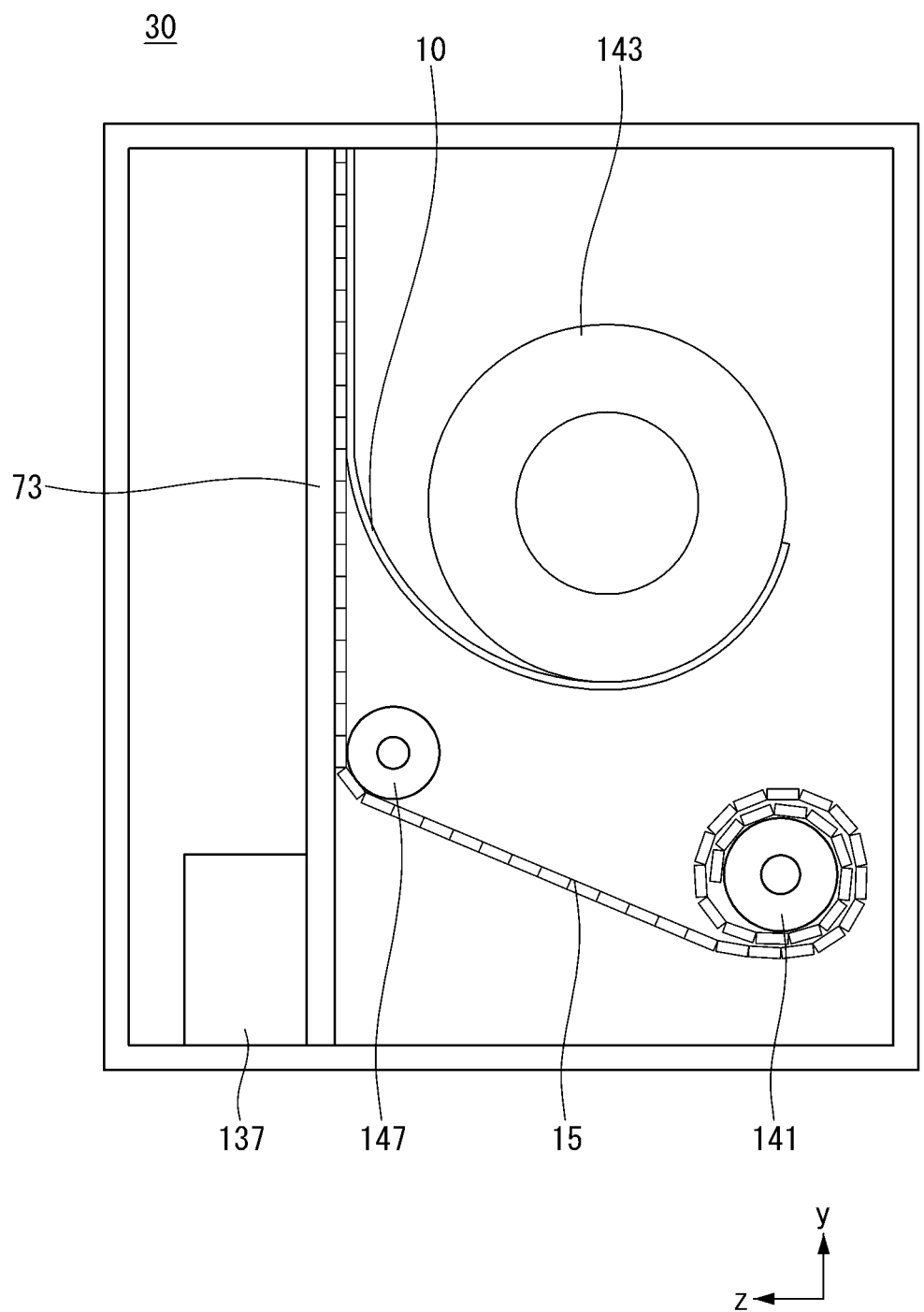
Figure 14:
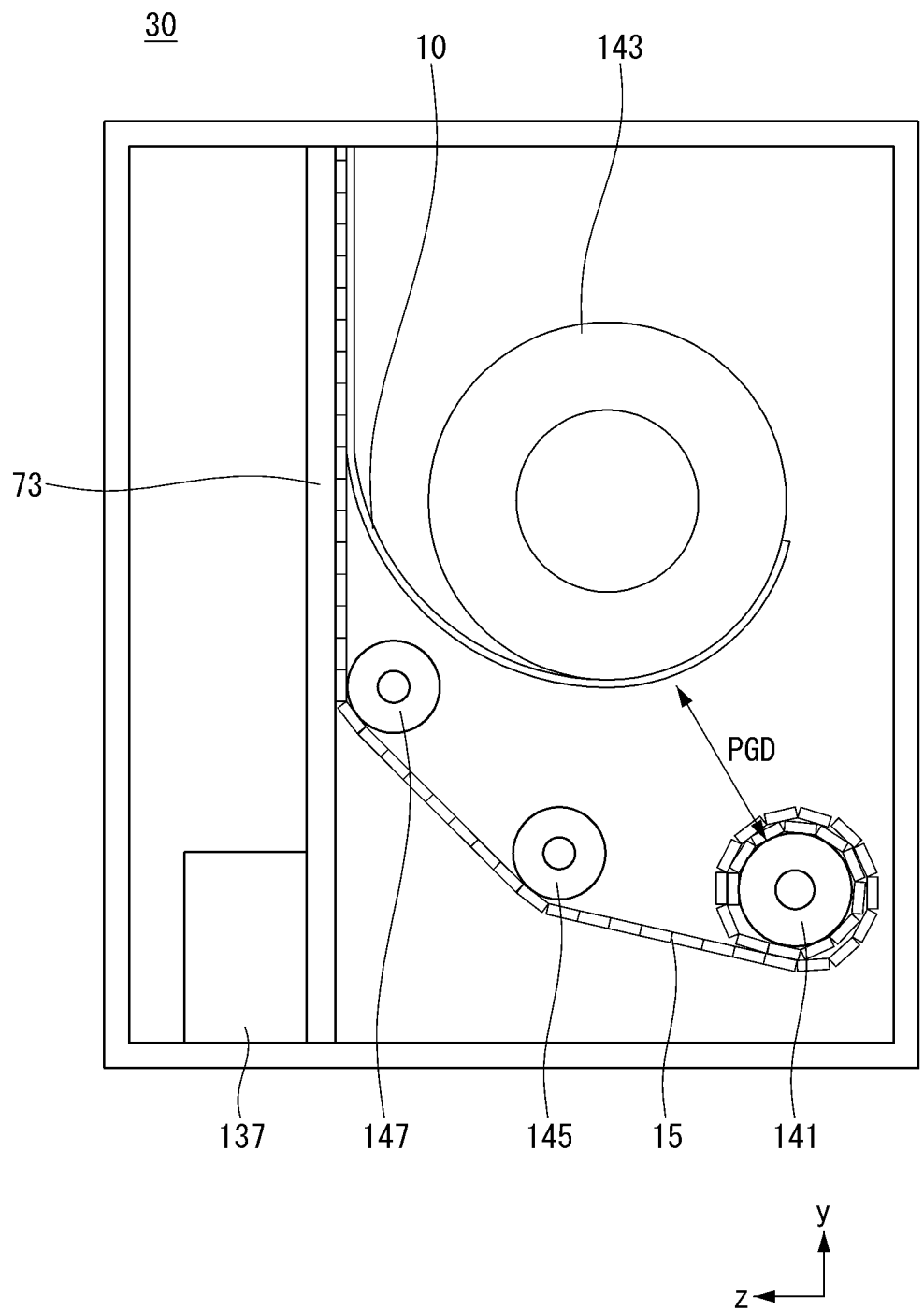

Referring to FIG. 13, a pressurization roller 147 may be located under the panel roller 143. The pressurization roller 147 may press the module cover 15 so that the module cover 15 comes into contact with the link 73. Accordingly, the sagging or bending of the module cover 15 can be prevented. The pressurization roller 147 may be located adjacent to the link 73. The pressurization roller 147 may guide the module cover 15 so that the module cover 15 and the display panel 10 interfere with each other, Referring to FIG. 14, the guide roller 145 and the pressurization roller 147 may be located may be located under the panel roller 143. The guide roller 145 may guide the location of the module cover 15 so that the module cover 15 does not interfere with the panel roller 143. The pressurization roller 147 may press the module cover 15 so that the module cover 15 comes into contact with the link 73.

Accordingly, a malfunction of the display device attributable to the sagging or bending of the module cover 15 can be prevented. Furthermore, a malfunction of the display device attributable to interference between the module cover 15 and the display panel 10 can be prevented.

Figure 15:
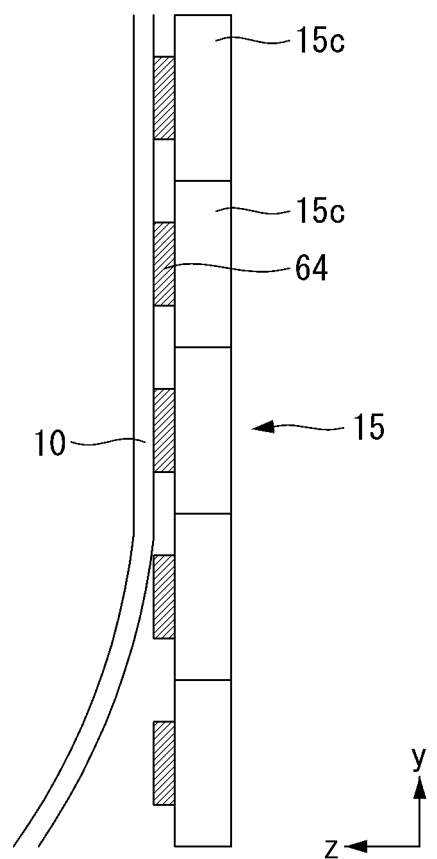

Referring to FIG. 15, in the display device according to an embodiment of the present disclosure, the segments 15c on both sides of the module cover may be attached to the display panel 10. The segment 15c may also be referred to as a third module cover 15c.

A magnet 64 may be attached to the front surface of the segment 15c. The magnet 64 may be attached to the segment 15c through a double-sided tape or another appropriate type of attachment. The magnet 64 may be provided at each of the segments 15c.

The display panel 10 may include a metal material. Accordingly, the display panel 10 and the magnets 64 may adhere together by their own forces. Furthermore, the display panel 10 and the segments 15c may be attached by the magnets 64.

The display panel 10 may include an Fe—Ni Invar alloy on its back surface. Accordingly, the display panel 10 may strongly adhere to the magnets 64.

A production cost can be reduced because the display panel 10 and the module cover 15 are attached by the magnets 64 only on both sides of the module cover 15 and thus many magnets 64 are not required.

Figure 16:
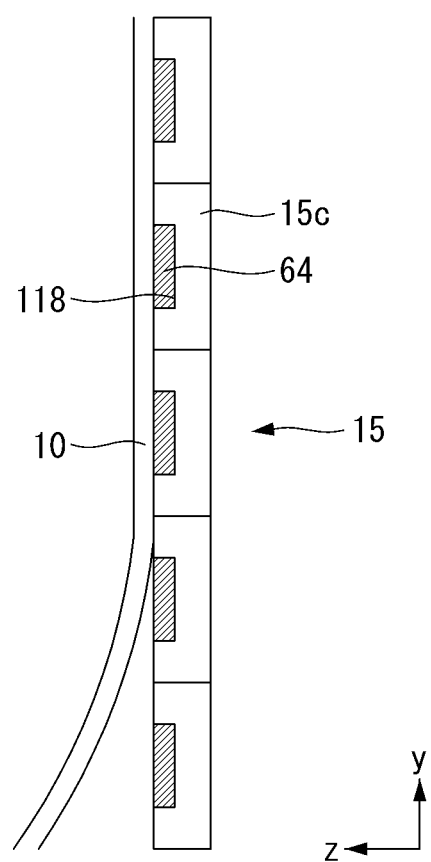

Referring to FIG. 16, in the display device according to an embodiment of the present disclosure, the magnet 64 may be located within the recess 118 of the segment 15c.

The recess 118 may be located in a surface that belongs to the segment 15c and that faces the display panel 10. The recess 118 may be located in the front surface of each of the segments 15c. The magnet 64 may not be protruded outside the segment 15c because the magnet 64 is accommodated within the recess 118. Accordingly, the display panel 10 may be flat without being wrinkled although it comes into contact with the segment 15c.

The thickness of the segment 15c can be reduced because the magnet 64 is accommodated within the recess 118. Furthermore, the thickness of the display device can be reduced.

Figure 17A:
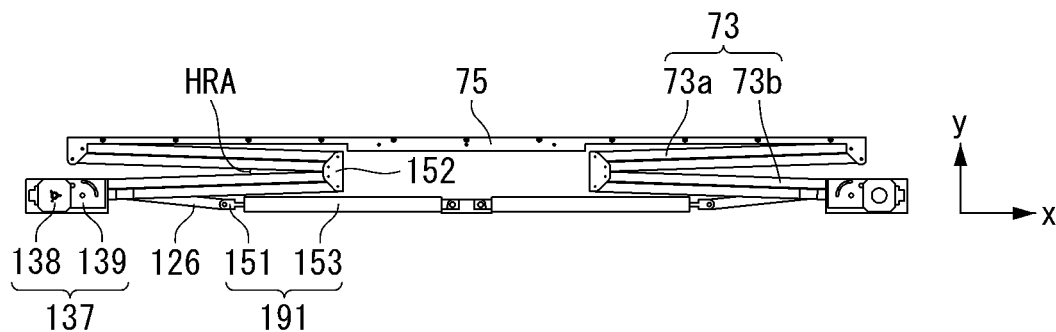
Figure 17B:
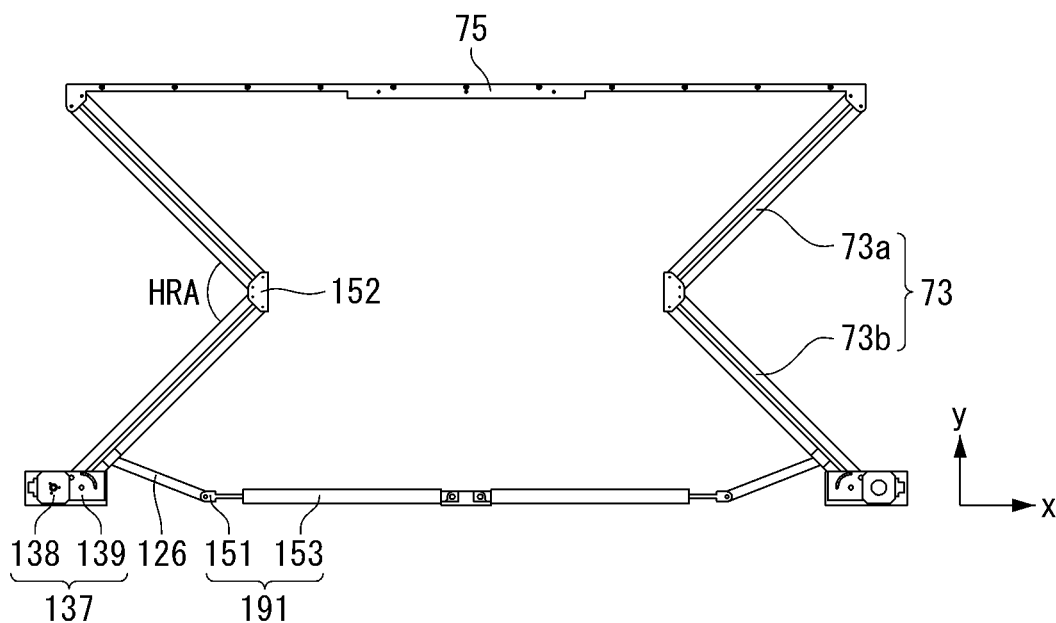
Figure 17C:
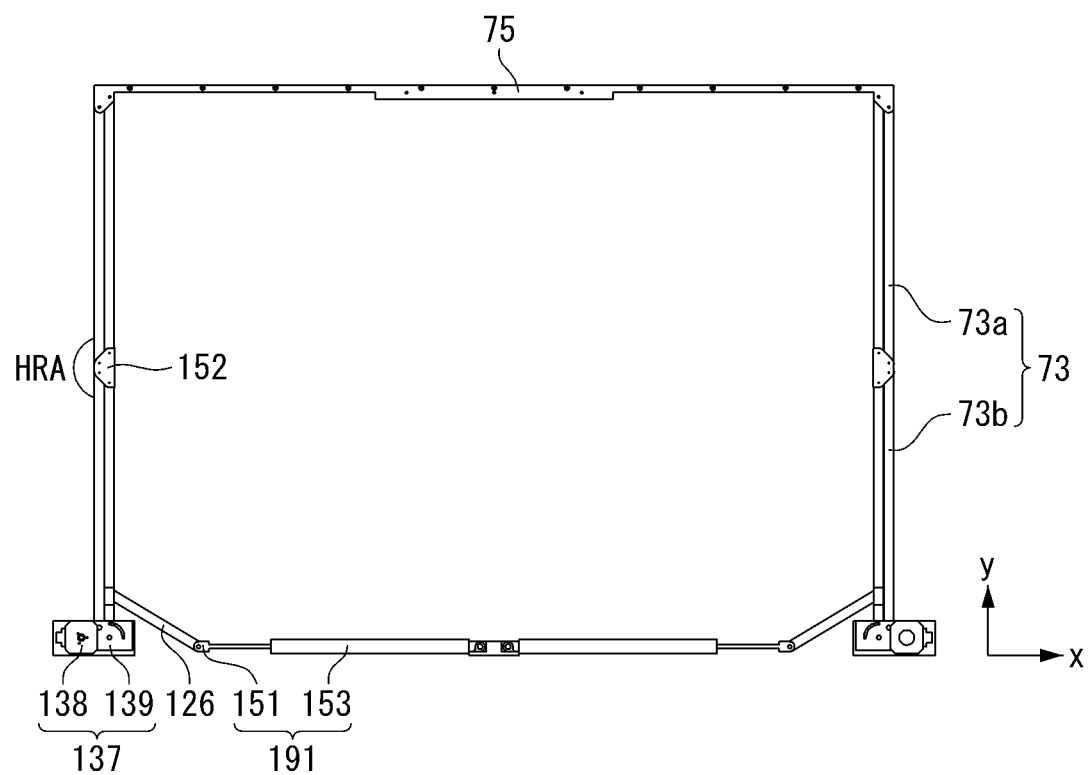

Referring to FIGS. 17A to 17C, as the display device according to an embodiment of the present disclosure changes from the first state to the second state, the upper bar 75 may rise. The upper bar 75 may rise up or fall down by the link 73 connected to both ends of the upper bar.

As shown in FIG. 17A, in the first state, the angle HRA between the first arm 73a and the second arm 73b may be very small. Accordingly, the upper bar 75 may not rise. Furthermore, the display panel and the module cover may have been wound on the panel roller.

As shown in FIG. 17B, when the motor assembly 137 rotates, the angle HRA between the first arm 73a and the second arm 73b may increase. As the angle HRA between the first arm 73a and the second arm 73b increases, the upper bar 75 may rise. Accordingly, the display panel and the module cover wound on the panel roller may be gradually unwound.

As shown in FIG. 17C, in the second state, the first arm 73a and the second arm 73b may be located on a straight line. That is, the angle HRA between the first arm 73a and the second arm 73b may become 180 degrees. Accordingly, the upper bar 75 may rise to a maximum height. Furthermore, the display panel and the module cover may be unwound from the panel roller.

Figure 17D:
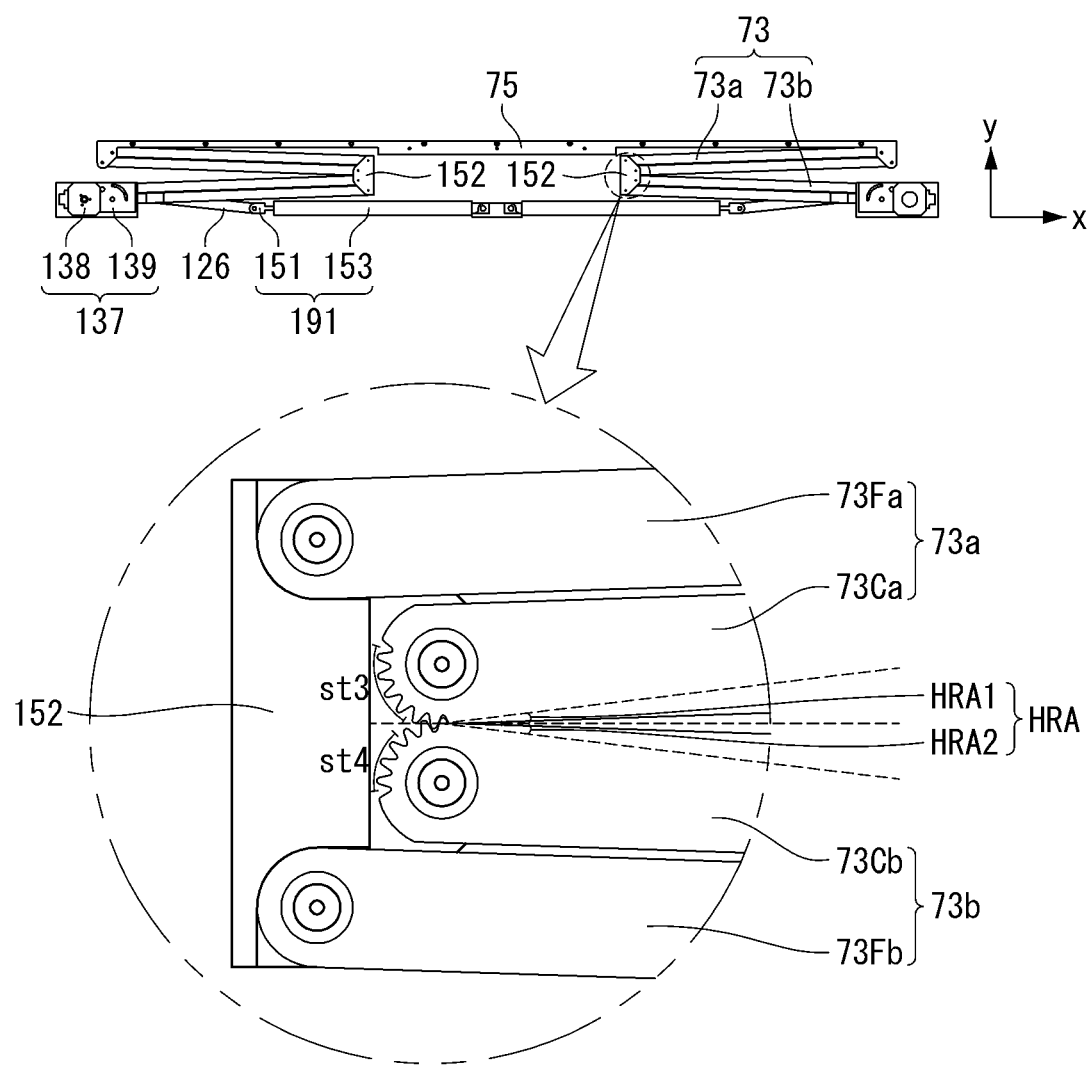

Referring to FIG. 17D, the display device according to an embodiment of the present disclosure may include a plurality of the first arms 73a and the second arms 73b.

More specifically, the first arm 73a may include a first upper arm 73Ca and a second upper arm 73Fa. Furthermore, the second arm 73b may include a first lower arm 73Cb and a second lower arm 73Fb.

The first upper arm 73Ca may also be referred to as a first upper link 73Ca. The second upper arm 73Fa may also be referred to as a second upper link 73Fa. The first lower arm 73Cb may also be referred to as a first lower link 73Cb. The second lower arm 73Fb may also be referred to as a second lower link 73Fb.

The first arm 73a may be pivotally connected to the upper part of the arm joint 152. The second arm 73b may be pivotally connected to the lower part of the arm joint 152.

More specifically, the second upper arm 73Fa may be connected over the first upper arm 73Ca. The second lower arm 73Fb may be connected under the first lower arm 73Cb.

A gear st3 may be formed at the lower part of the first upper arm 73Ca. A gear st4 may be formed at the upper part of the first lower arm 73Cb. The gear st3 of the first upper arm 73Ca and the gear st4 of the first lower arm 73Cb may gear together.

The angle HRA1 of the first upper arm 73Ca from the ground and the angle HRA2 of the first lower arm 73Cb from the ground may be the same because the first upper arm 73Ca and the first lower arm 73Cb gear together. Furthermore, the angles between the first upper arms 73Ca and the first lower arms 73Cb on both sides may be the same because the first upper arm 73Ca and the first lower arm 73Cb on each of both sides gear together. Accordingly, the upper bar 75 can rise or fall while maintaining horizontality without learning to one side. That is, the angles between the first upper arms 73Ca and the first lower arms 73Cb on both sides may be the same regardless of the height of the upper bar 75 from the ground.

A gear may not be formed in the second upper and lower arms 73Fa and 73Fb. The angle between the second upper arm 73Fa and the second lower arm 73Fb is the same as that between the first upper arm 73Ca and the first lower arm 73Cb.

Figure 17E:
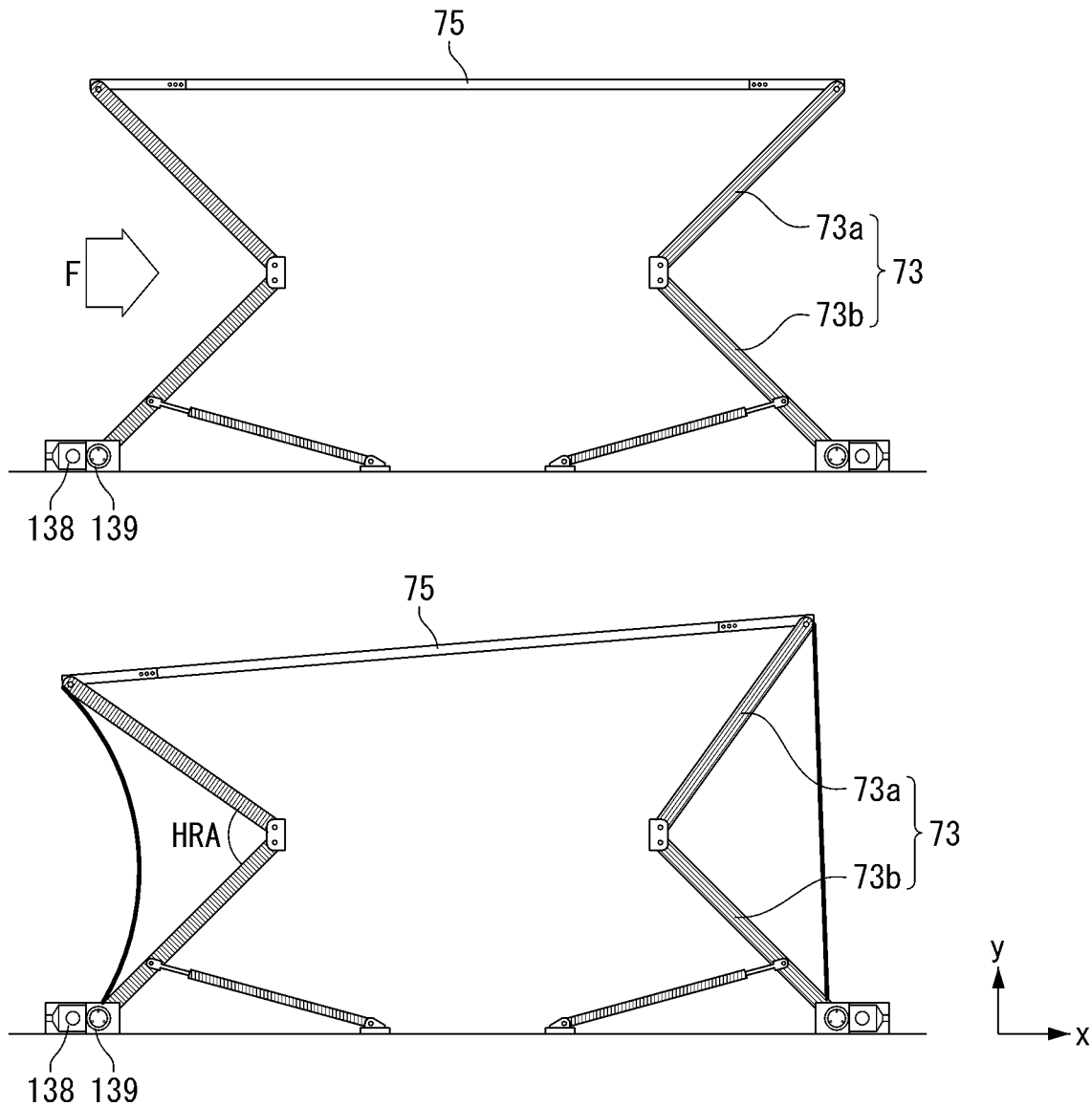

As shown in FIG. 17E, in a display device according to one embodiment, upper and lower arms 73a and 73b may be formed of a single arm. Accordingly, when an external force F is applied to one side, the angle HLA between the upper and lower arms 73a and 73b may be changed. In this case, the display panel may incline toward one side.

Figure 17F:
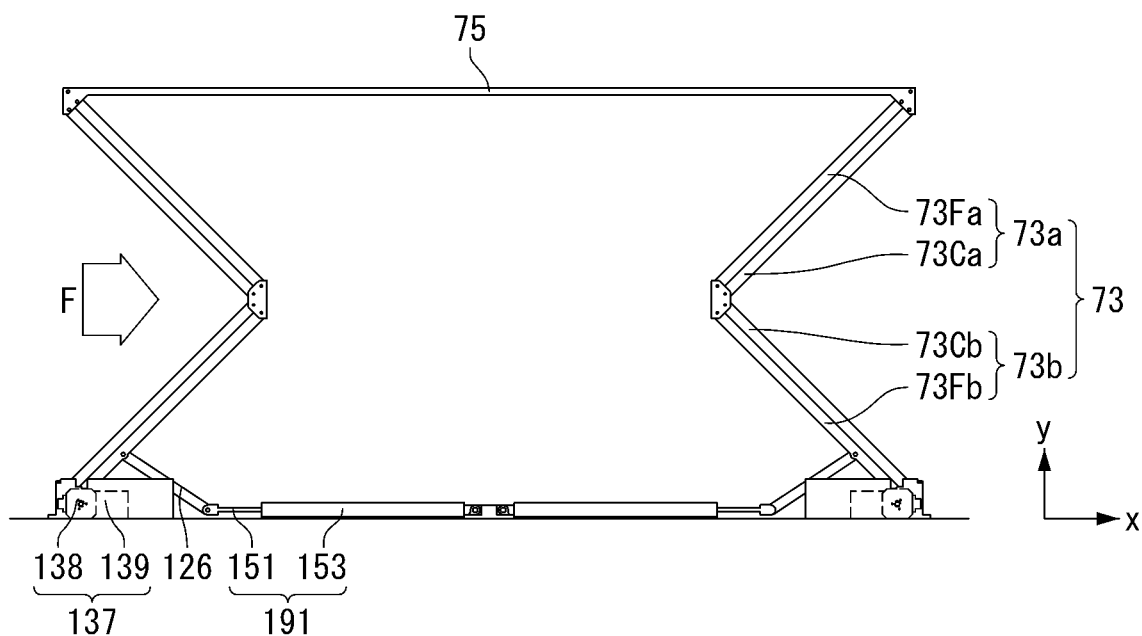

In contrast, as shown in FIG. 17F, when the gear st3 of the first upper arm 73Ca and the gear st4 of the first lower arm 73Cb gear together, although an external force F is applied to one side of the display device, the angle HLA between the upper and lower arms 73a and 73b may not be changed. Accordingly, damage attributable to the inclination of the display panel can be prevented.

Figure 17G:
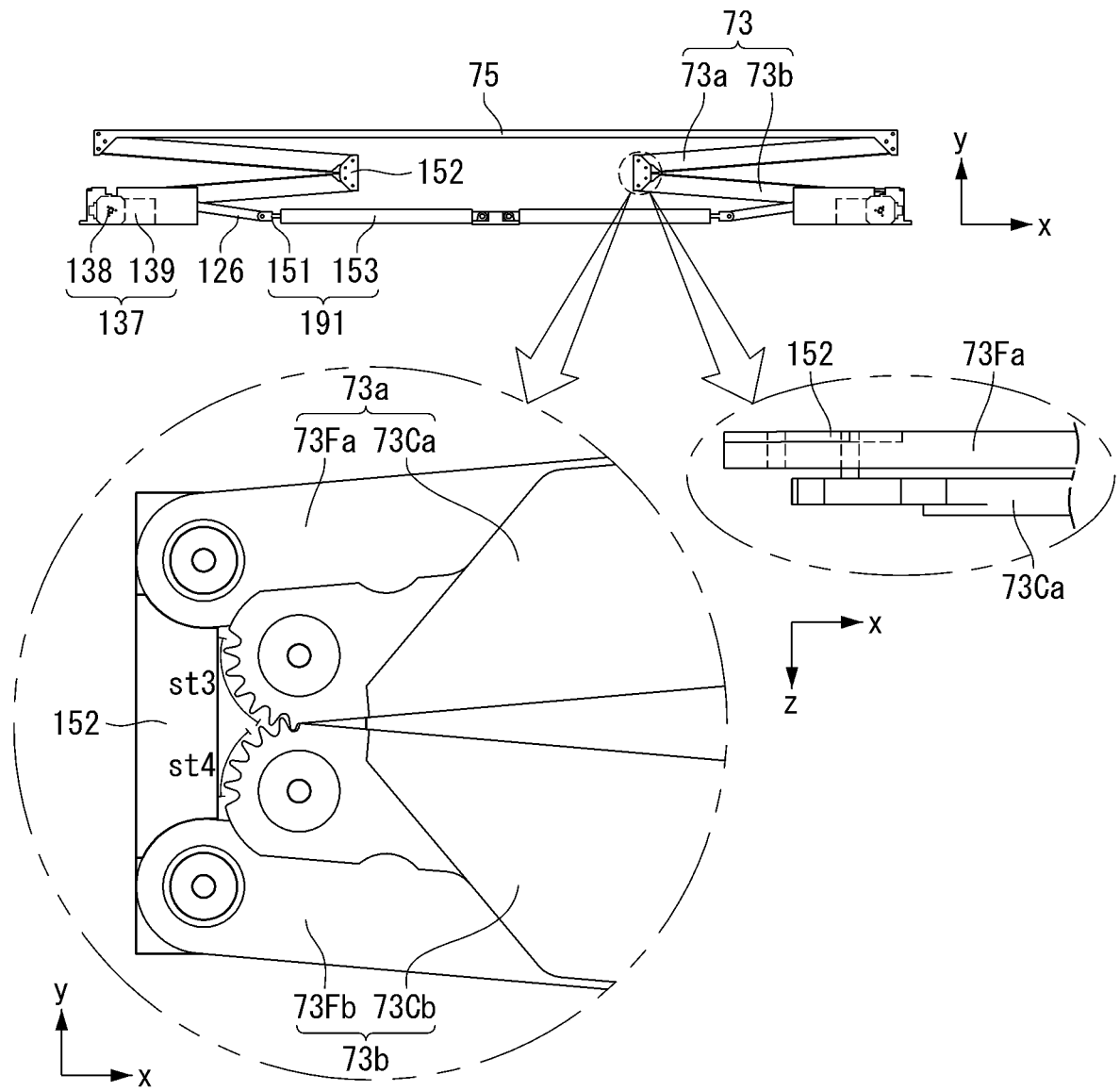

Referring to FIG. 17G, one side of the first upper and lower arms 73Ca and 73Cb may extend in a direction toward the second upper and lower arms 73Fa and 73Fb. That is, the width of the first upper and lower arms 73Ca and 73Cb may increase. Accordingly, when the link 73 is viewed from the front of the display device, the first upper and lower arms 73Ca and 73Cb may shield the second upper and lower arms 73Fa and 73Fb at the front surface. Alternatively, the first upper arm 73Ca and the second upper arm 73Fa may be superimposed. Alternatively, the first lower arm 73Cb and the second lower arm 73Fb may be superimposed.

The pivot of the first upper arm 73Ca, the pivot of the second upper arm 73Fa, the pivot of the first lower arm 73Cb, and the pivot of the second lower arm 73Fb may be spaced apart from each other.

The height of the arm joint 152 in the vertical direction at a portion connected to the first upper and lower arms 73Ca and 73Cb may be different from the height of the arm joint 152 in the vertical direction at a portion connected to the second upper and lower arms 73Fa and 73Fb.

Although not shown, one side of the second upper and lower arms 73Fa and 73Fb may extend in a direction toward the first upper and lower arms 73Ca and 73Cb. That is, when viewed from the back surface, the width of the second upper and lower arms 73Fa and 73Fb may increase. Accordingly, the second upper and lower arms 73Fa and 73Fb may shield the first upper and lower arms 73Ca and 73Cb at the front surface.

Figure 17H:
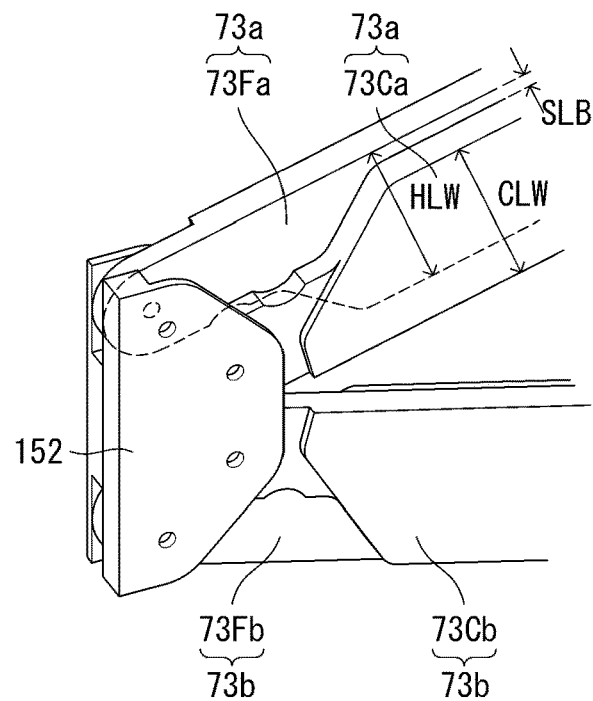

As shown in FIG. 17H, in the first state, the width of at least part of the first upper and lower arms 73Ca and 73Cb may overlap or superimpose the second upper and lower arms 73Fa and 73Fb. For example, the first upper and lower arms 73Ca and 73Cb may be isolated from the second upper and lower arms 73Fa and 73Fb at a specific distance SLB, and may overlap the second upper and lower arms 73Fa and 73Fb. Accordingly, the total width HLW of the first arm 73a may be greater than the width of the second upper arm 73Fa or the width CLW of the first upper arm 73Ca.

Figure 17I:
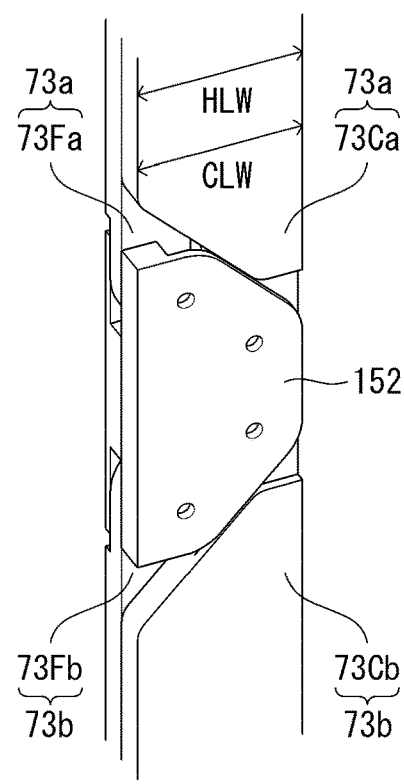

In some embodiments, as shown in FIG. 17I, in the second state, a total width of the first upper and lower arms 73Ca and 73Cb may superimpose the second upper and lower arms 73Fa and 73Fb. Accordingly, the total width HLW of the first arm 73a may be the same as the width of the second upper arm 73Fa or the width CLW of the first upper arm 73Ca.

Figure 17J:
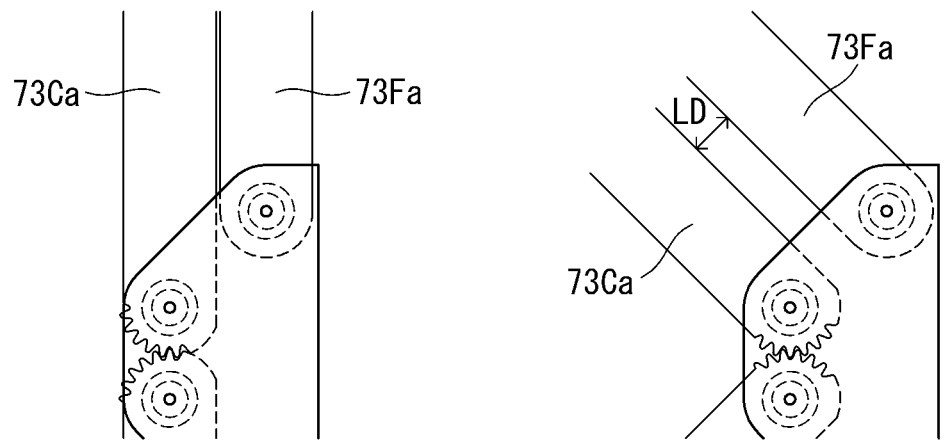

As shown in FIG. 17J, if one side of the first upper arm 73Ca has not extended, when the first upper arm 73Ca changes from the second state to the first state, the first upper arm 73Ca and the second upper arm 73Fa may be spaced apart from each other at a specific interval LD. As the first upper arm 73Ca changes from the second state to the first state, the interval LD between the first upper arm 73Ca and the second upper arm 73Fa may increase.

In this case, when the first upper arm 73Ca changes from the first state to the second state, there is a problem in that a user's hand may be injured because the hand is caught between the first upper arm 73Ca and the second upper arm 73Fa.

Figure 17K:
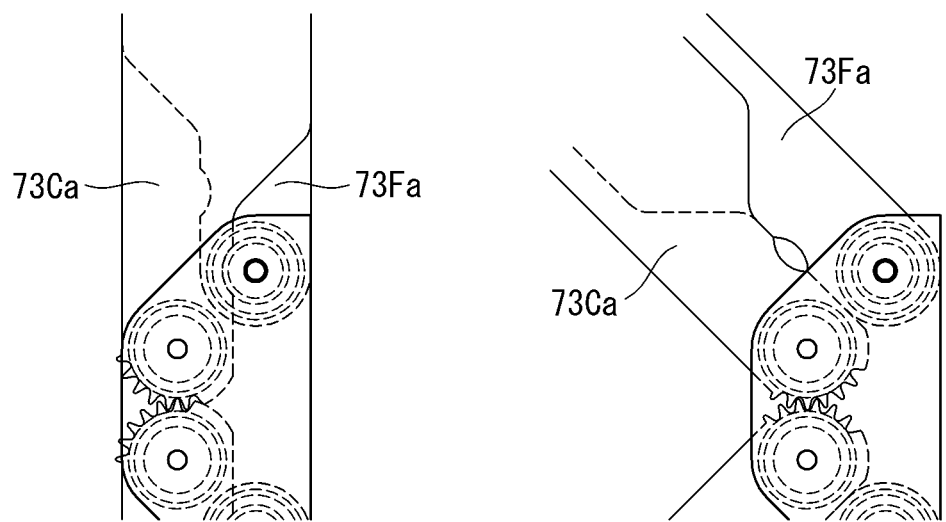

In some embodiments, as shown in FIG. 17K, when one side of the first upper arm 73Ca extends and overlaps the second upper arm 73Fa, although the first upper arm 73Ca changes from the second state to the first state, the interval between the first upper arm 73Ca and the second upper arm 73Fa may not be exposed. Accordingly, a danger that a user's hand is caught between the first upper arm 73Ca and the second upper arm 73Fa while the first upper arm 73Ca changes from the first state to the second state can be prevented.

Figure 18:
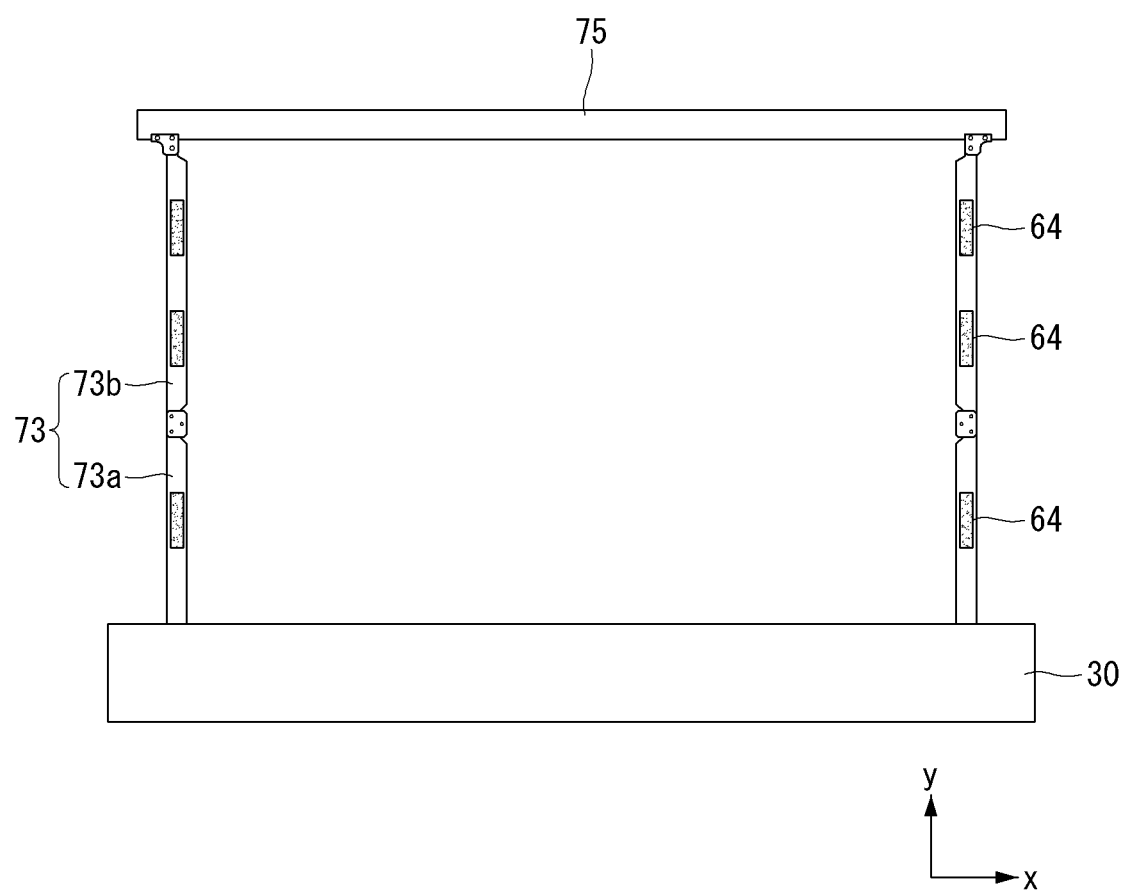
FIGS. 18 to 29 are diagrams showing a display device according to an embodiment of the present disclosure.

Referring to FIG. 18, the plurality of magnets 64 may be located on the link 73. For example, at least one magnet 64 may be located on the first arm 73a, and at least one magnet 64 may be located on the second arm 73b. The plurality of magnets 64 may be spaced apart from each other.

The display portion may include a metal material. The display portion may be closely attached to the link 73 by the magnets 64. Although the magnetic force of any one of the plurality of magnets 64 is weakened, the close adhesion of the display panel and module cover to the link 73 can be maintained by the remaining magnets 64.

Figure 19:
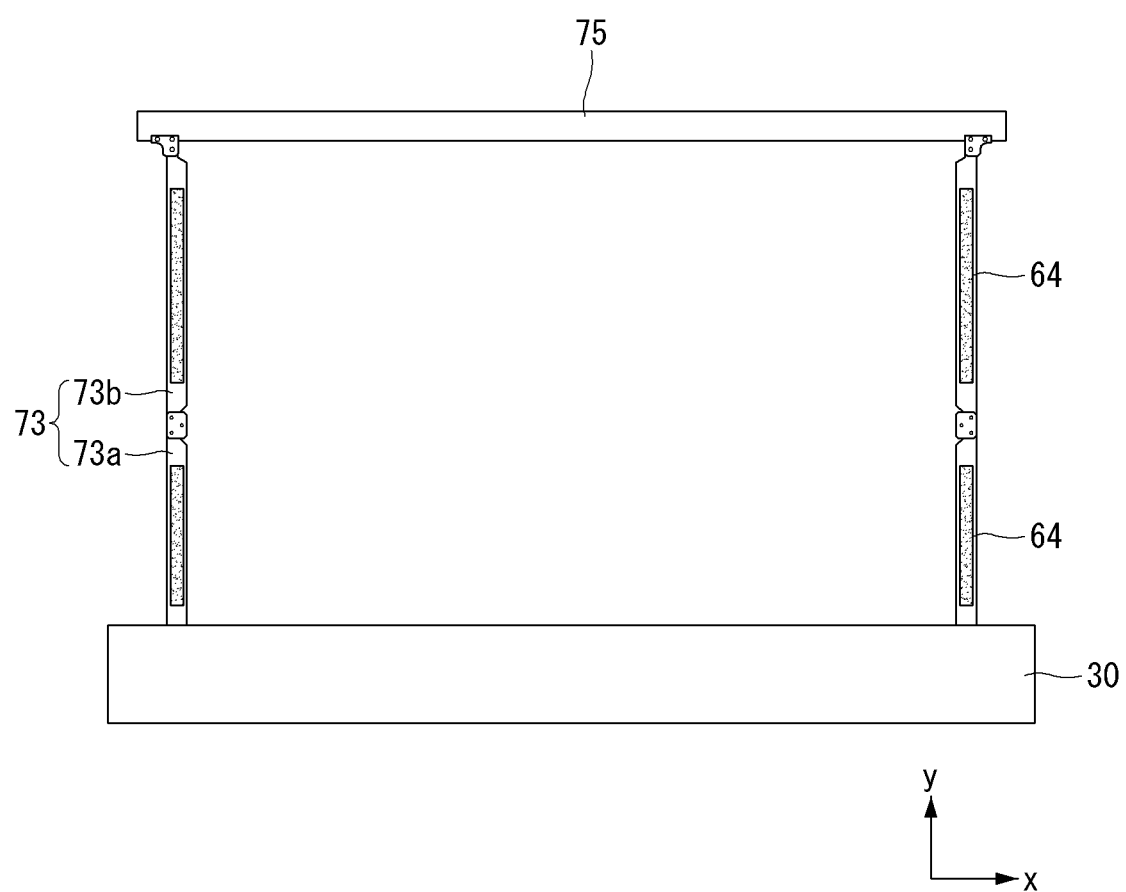

Referring to FIG. 19, one magnet 64 may be located on each of the first arm 73a and the second arm 73b. In this case, the magnet 64 may have a shape that lengthily extends in the long-side direction of the first arm 73a and the second arm 73b.

Since the magnet 64 has the shape that lengthily extends in the long-side direction of the first arm 73a and the second arm 73b, the area of a portion where the link 73 closely adheres to the display panel and the module cover can be increased. Accordingly, an adhesion force between the link 73 and the display panel and the module cover can be further increased.

Figure 20:
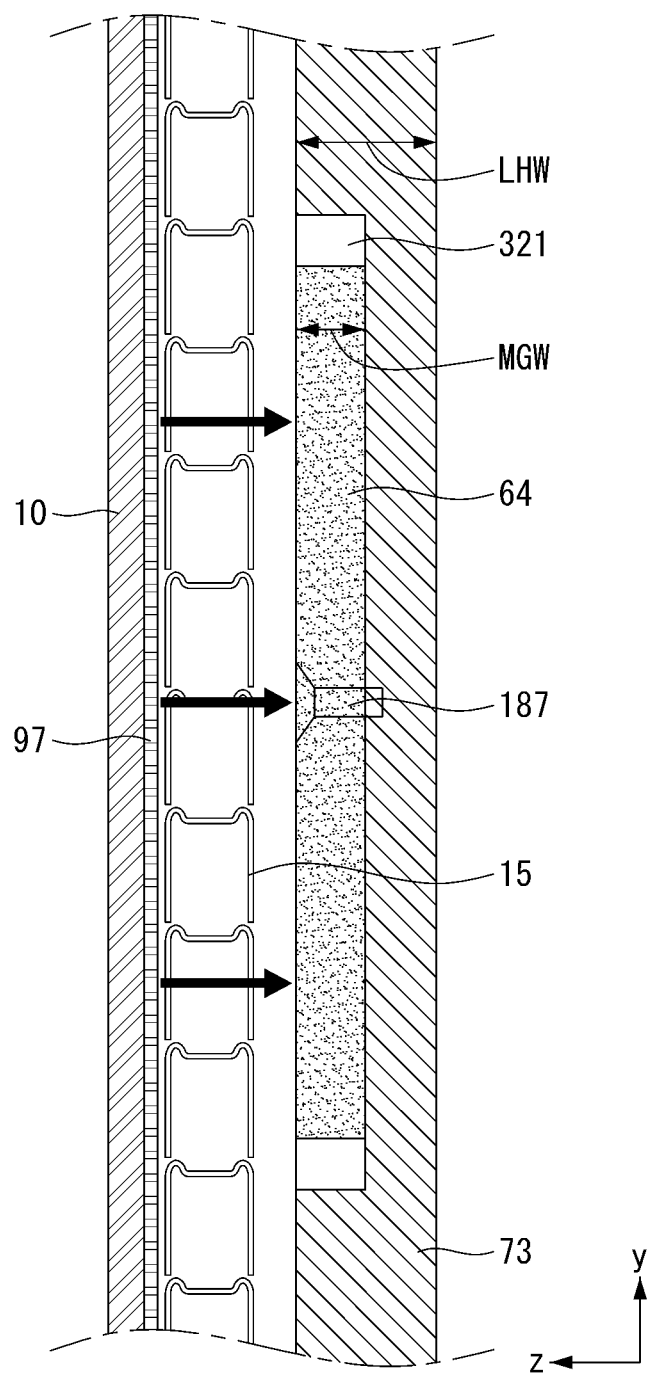

Referring to FIG. 20, the magnet 64 may be located in a depressed portion 321 formed in the link 73. The depressed portion 321 may have a shape depressed toward the inside of the link 73. The magnet 64 may be combined with the link 73 by at least one screw 187.

The width LHW of the depressed portion 321 depressed toward the link 73 may be the same as or greater than the thickness MGW of the magnet 64. If the thickness MGW of the magnet 64 is greater than the width LHW of the depressed portion 321, the display panel 10 and the module cover 15 may not close adhere to the link 73. In this case, the display panel 10 may be wrinkled or may not be flat.

A panel protection portion 97 may be disposed on the back surface of the display panel 10. The panel protection portion 97 may prevent an impact on the display panel 10, which is attributable to friction with the module cover 15. The panel protection portion 97 may include a metal material. The panel protection portion 97 may have a very thin thickness. For example, the panel protection portion 97 may have a thickness of about 0.1 mm.

Mutual attraction may act between the panel protection portion 97 and the magnet 64 because the panel protection portion 97 includes a metal material. The module cover 15 located between the panel protection portion 97 and the link 73 may closely adhere to the magnet 64 although it does not include a metal material.

Figure 21:
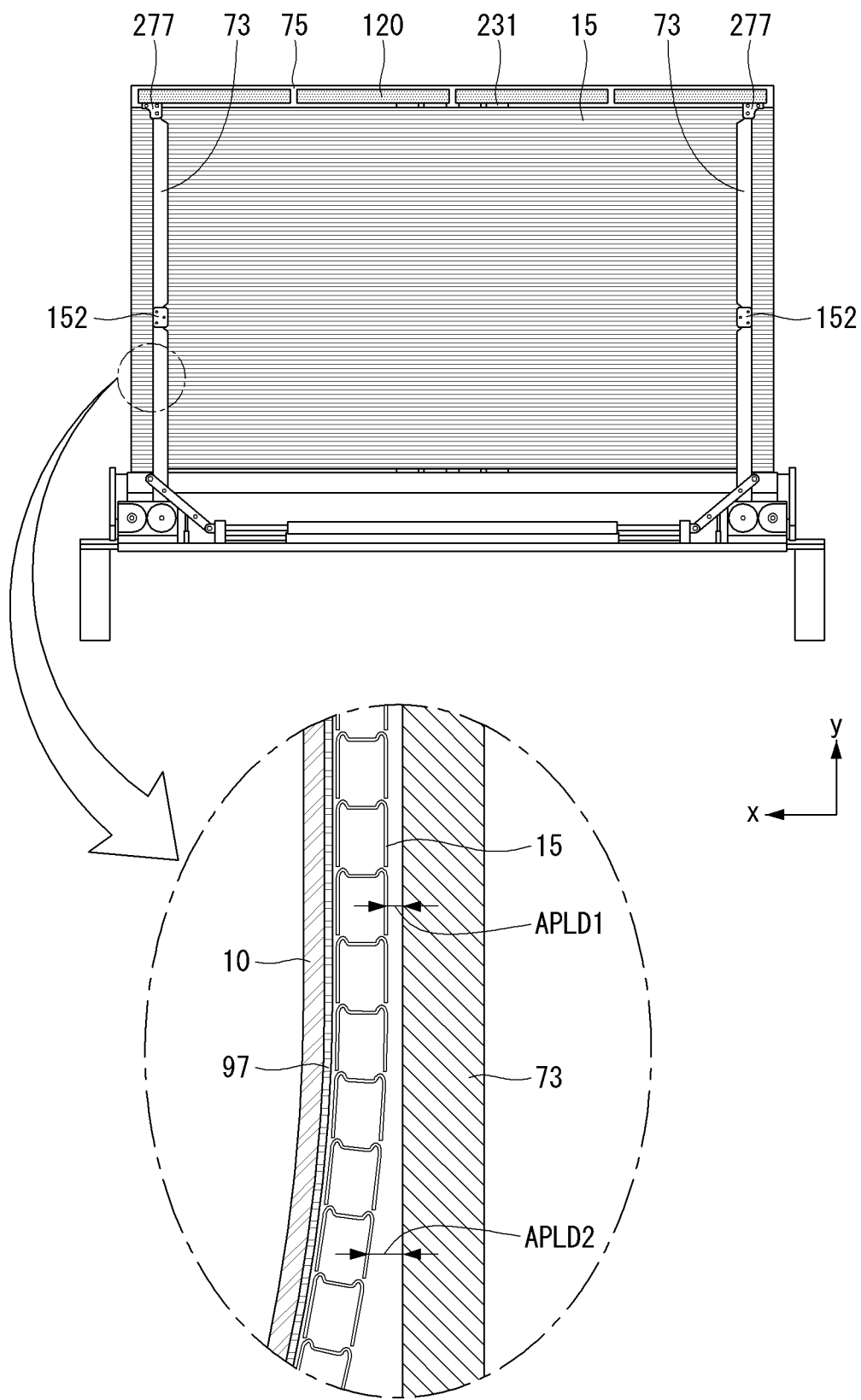

Referring to FIG. 21 if a magnet is not provided on the link 73, the module cover 15 may be closely attached to the link 73 by the upper bar 75 on the upper side and the guide bar (refer to 234 of FIG. 10) on the lower side. A portion that belongs to the link 73 and that is located between the upper bar 75 and the guide bar may not closely adhere to the module cover 15. Alternatively, the central part of the link 73 may not closely adhere to the module cover 15. The central part of the link 73 may be a portion adjacent to the arm joint 152. In this case, distances APRD1 and APLD2 between the module cover 15 and the link 73 may not be constant. In this case, the display panel 10 may be bent or curved.

Figure 22:
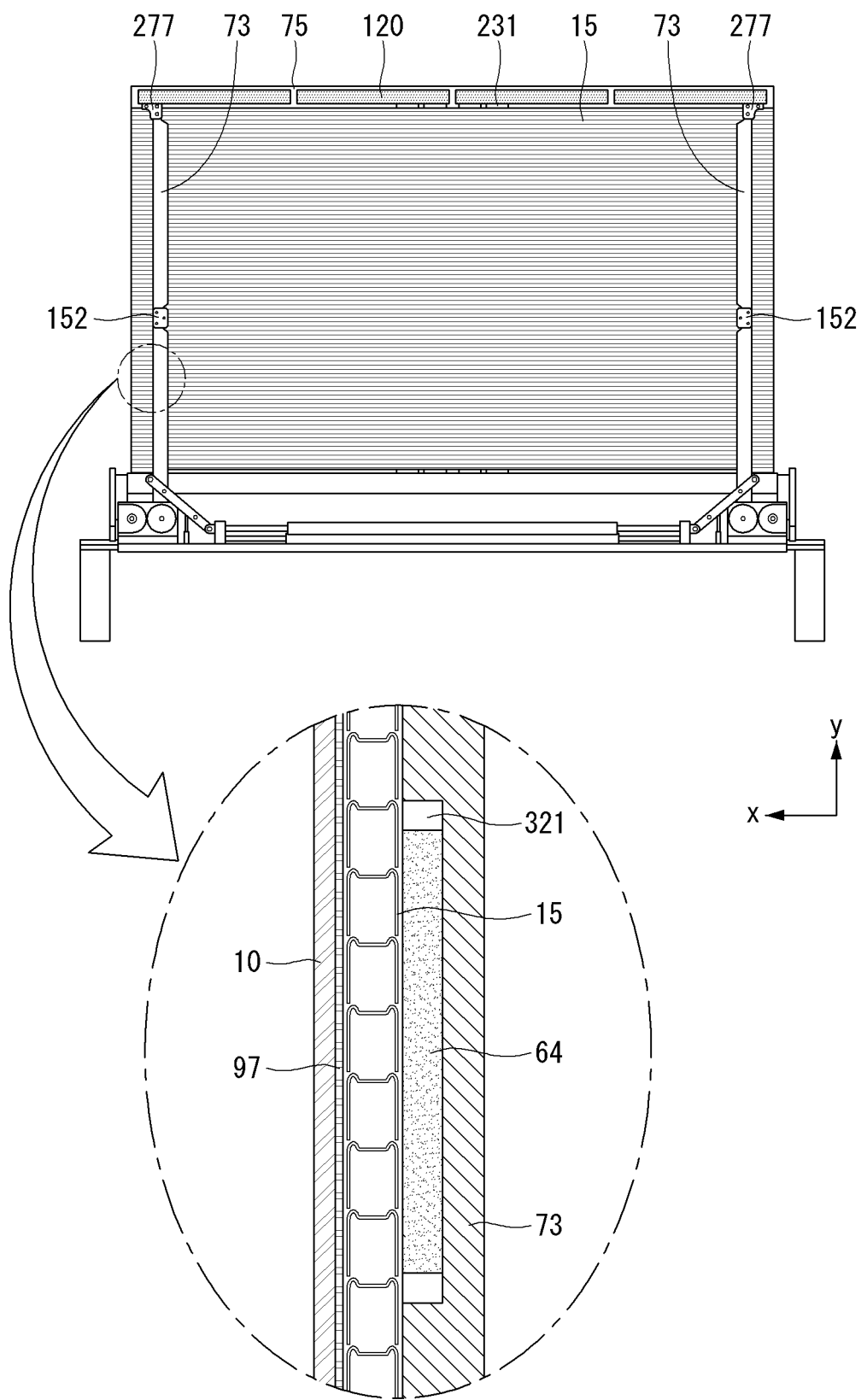

Referring to FIG. 22, if the magnet 64 is located in the depressed portion 321 of the link 73, the module cover 15 may also be closely attached to the magnet 64 because the magnet 64 attracts the panel protection portion 97. That is, the central part of the link 73 may be closely attached to the module cover 15.

Figure 23A:
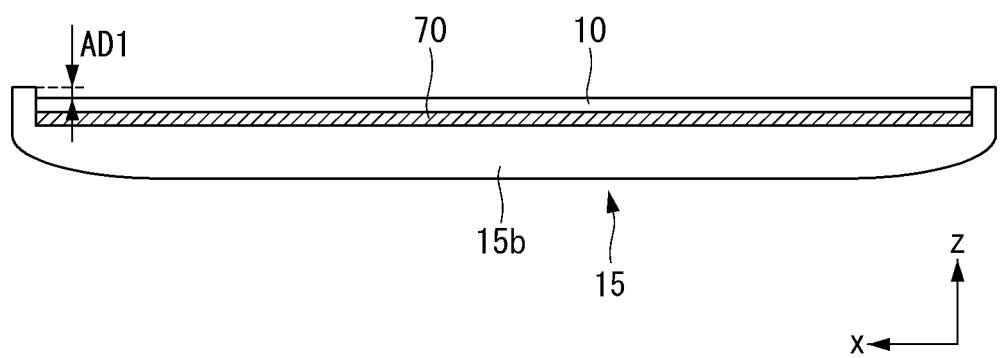
Figure 23B:
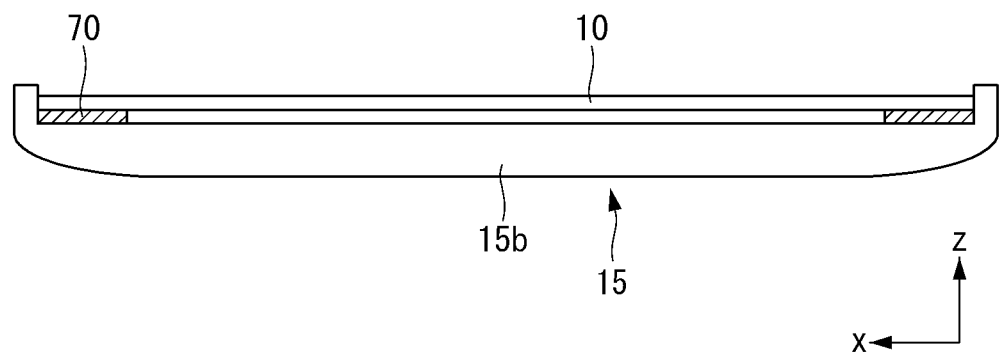

Referring to FIGS. 23A to 23B, both ends of the module cover 15 may be bent in the +z-axis direction. The display panel 10 may be attached to a portion that belongs to the module cover 15 and that has not been bent. The length of both ends of the module cover 15 that have been bent in the +z-axis direction may be greater than the sum of the thicknesses of the display panel 10 and the adhesive layer 70. That is, the bent length of the module cover 15 may be more protruded than the display panel 10 in the +z-axis direction at a specific distance AD1. Accordingly, when the module cover 15 is viewed in the x-axis direction, the display panel 10 may be covered.

Referring to FIG. 23A, the adhesive layer 70 may be disposed between the display panel 10 and the module cover 15. The adhesive layer 70 may be lengthily disposed in the x-axis direction. The entire display panel 10 may be attached to the module cover 15. In this case, the module cover 15 and the display panel 10 may not be separated because an adhesive force between them is very strong.

Referring to FIG. 23B, the adhesive layer 70 may be disposed between the display panel 10 and the module cover 15. The adhesive layer 70 may be disposed in a portion between the display panel 10 and the module cover 15. For example, the adhesive layers 70 may be disposed at one end and the other end of the display panel 10, respectively. Accordingly, the adhesive layer 70 may be less used compared to a case where the adhesive layer 70 is disposed lengthwise in the x-axis direction. Accordingly, a production cost for a display device can be reduced.

The display panel 10 and the module cover 15 have been illustrated as being attached through the adhesive layer 70, but the present disclosure is not limited thereto. For example, the display panel 10 and the module cover 15 may be attached through a magnet.

Figure 24:
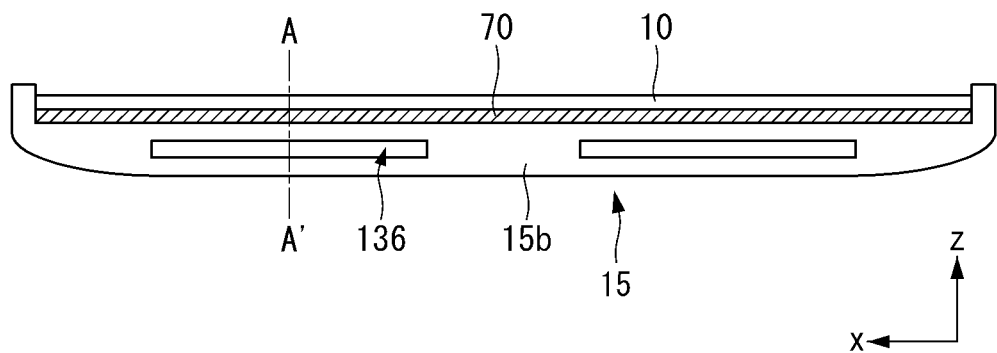
Figure 24:
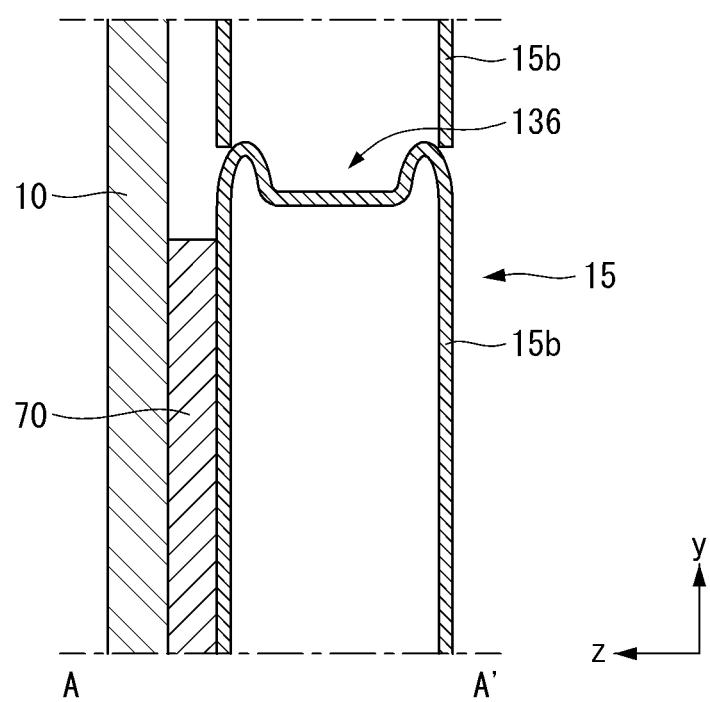

Referring to FIG. 24, a bead 136 may be formed on the top surface of the segment 15b. The bead 136 may have a shape depressed into the segment 15b. The bead 136 may have a shape depressed in the −y-axis direction. A plurality of the beads 136 may be formed on the segment 15b. The plurality of beads 136 may be spaced apart from each other. The bead 136 can enhance the stiffness of the segment 15b. For example, the bead 136 can prevent the shape of the segment 15b from being deformed by an external impact.

Figure 25:
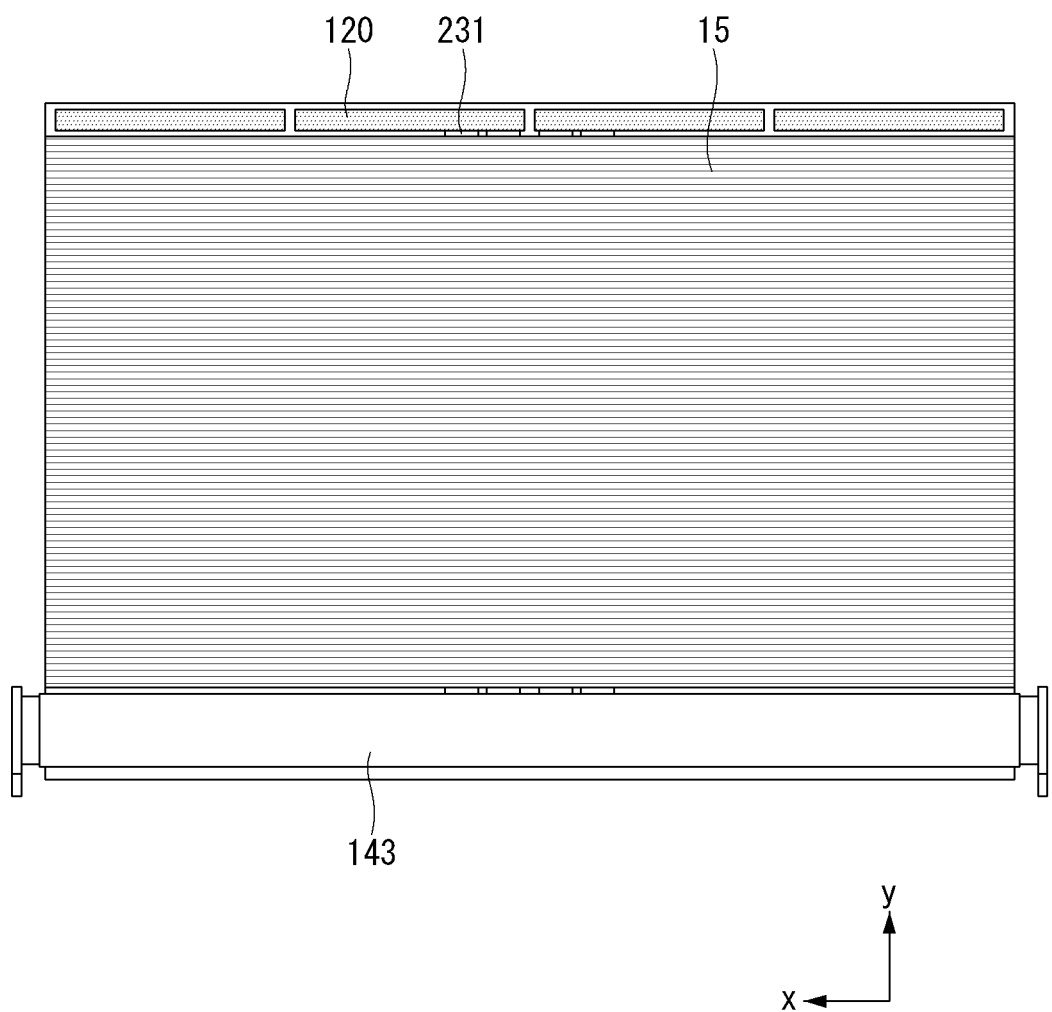

Referring to FIG. 25, the source PCB 120 may be located over the module cover 15. The location of the source PCB 120 may be changed along with a movement of the module cover 15 when the display device changes from the first state to the second state.

The FFC cable 231 may be located at the central part of the module cover 15 based on the first direction, but the present disclosure is not limited thereto. For example, the FFC cables 231 may be located on both ends of the module cover 15 based on the first direction.

Figure 26:
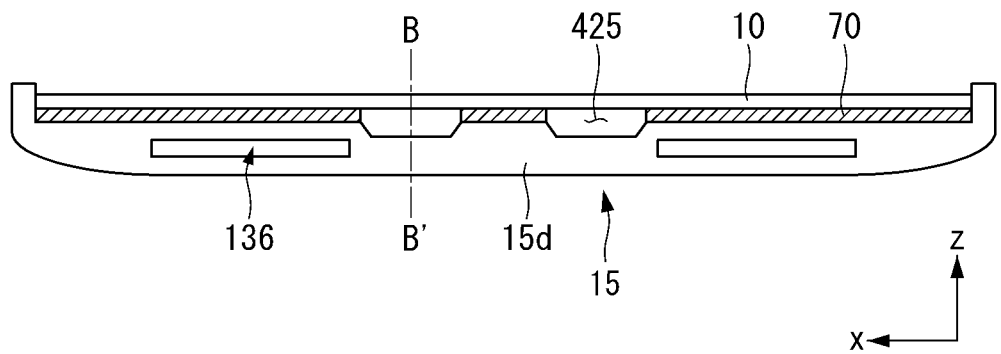
Figure 26:
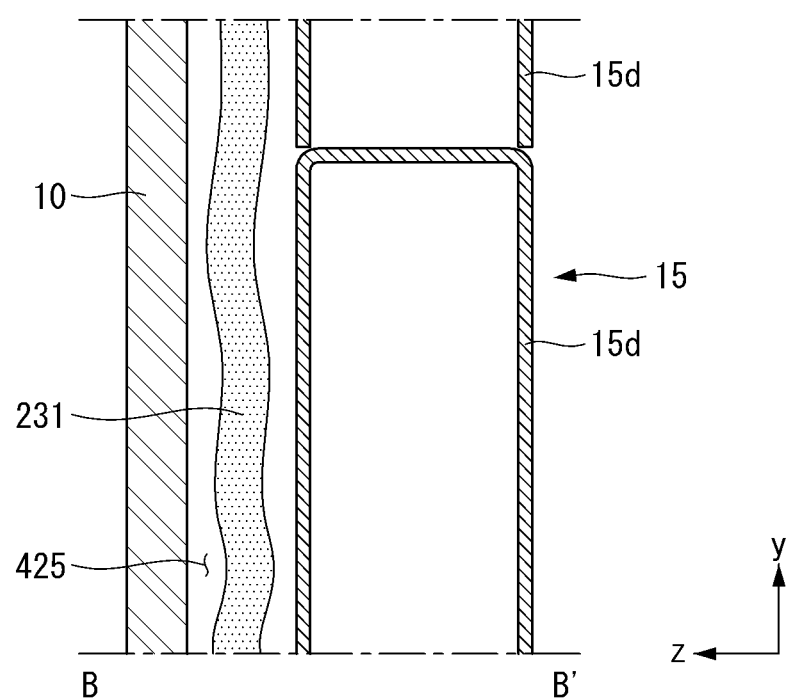

Referring to FIG. 26, the segment 15d may include a depressed portion 425 depressed in the +z-axis direction. The depressed portion 425 may form the space between the display panel 10 and the module cover 15. The FFC cable 231 may be accommodated in the space formed by the depressed portion 425. Furthermore, the depressed portion 425 can enhance the stiffness of the segment 15d.

The bead 136 may be located on the segment 15d other than the portion where the depressed portion 425 is located. A bead 136 may not be located in the portion where the depressed portion 425 is located because the thickness of the segment 15d in the third direction is thin in the portion where the depressed portion 425 is located. However, the present disclosure is not limited thereto. For example, the bead 136 may be located in any portion where the depressed portion 425 is located.

Figure 27:
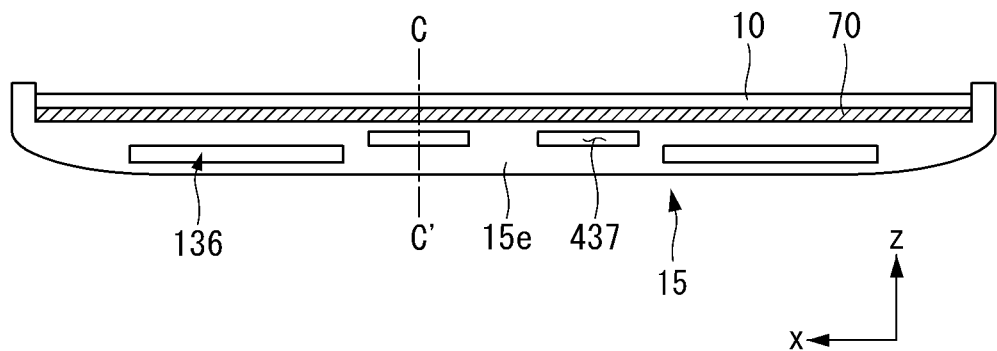
Figure 27:
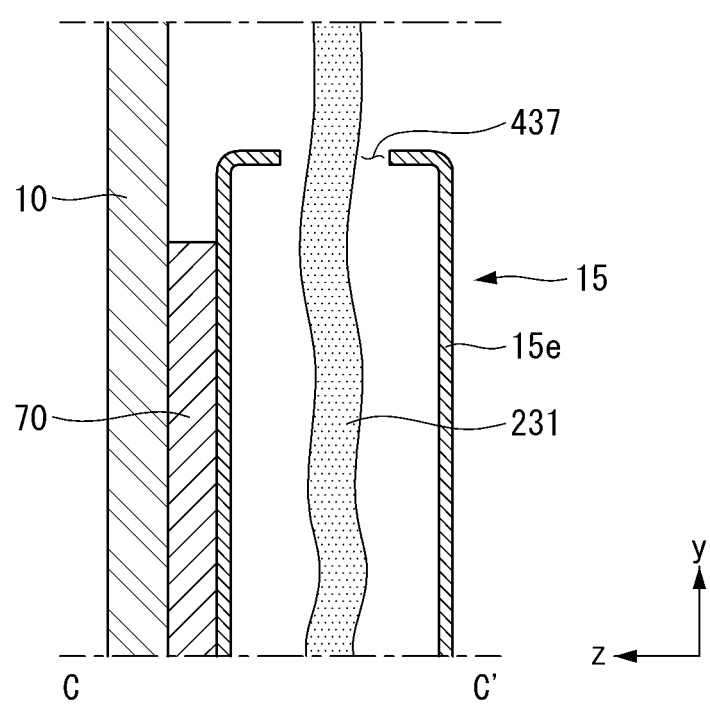

Referring to FIG. 27, a penetration portion 437 may be located at the central part of the segment 15e based on the first direction. The penetration portion 437 may pass through the central part of the segment 15e in the second direction. That is, the penetration portion 437 may be a hole located within the segment 15e. The penetration portion 437 may be a portion where the FFC cable 231 is located. The thickness of the segment 15e can be reduced compared to a case where the FFC cable 231 is located in the depressed portion 425 because the penetration portion 437 is formed within the segment 15e.

The bead 136 may be located on the segment 15e other than the portion where the penetration portion 437 is located. A bead 136 may not be located in the portion where the penetration portion 437 is located because the thickness of the segment 15e in the third direction is thin in the portion where the penetration portion 437 is located, but the present disclosure is not limited thereto. For example, the bead 136 may be located in the portion where the penetration portion 437 is located.

Figure 28:
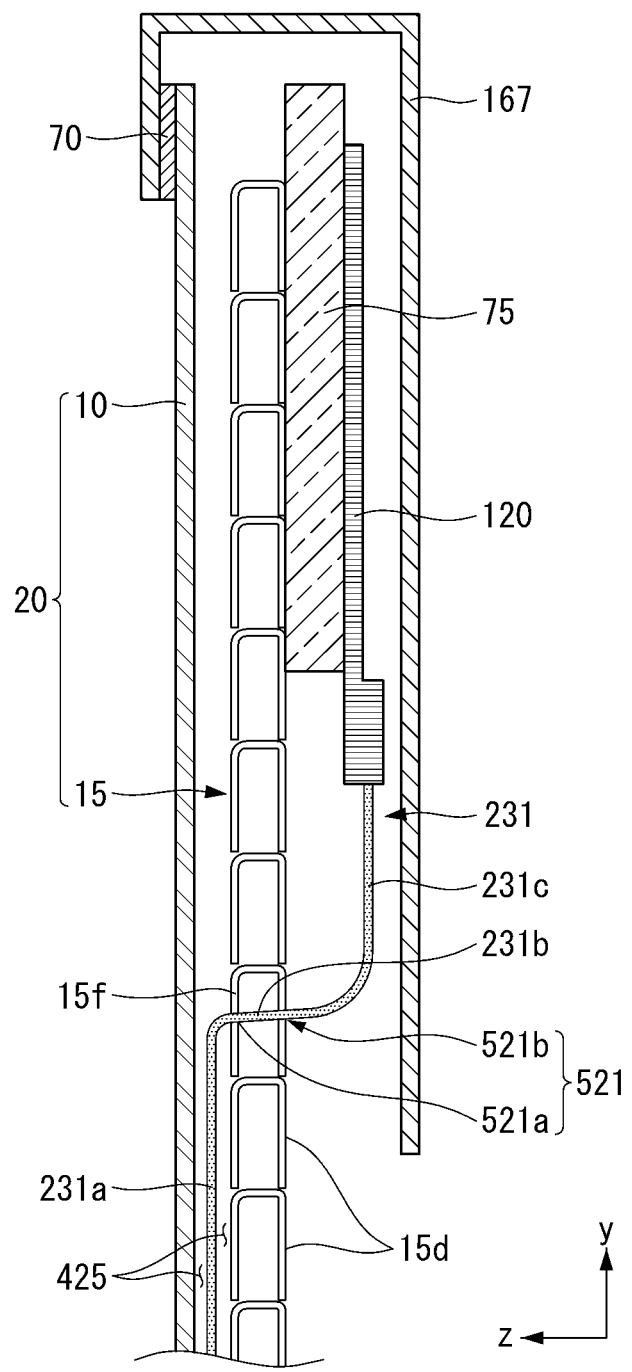

Referring to FIG. 28, in the display device according to an embodiment of the present disclosure, the top casing 167 can shield the source PCB 120 and the upper bar 75 in addition to the display panel 10 and the module cover 15. Accordingly, an external appearance of the display device may become neat and tidy because the source PCB 120 is not exposed to the outside.

The upper bar 75 may have one side coupled to the back surface of the module cover 15 and the other side coupled to the source PCB 120. The upper bar 75 may be fixed to the module cover 15 and may support the source PCB 120.

Figure 29:
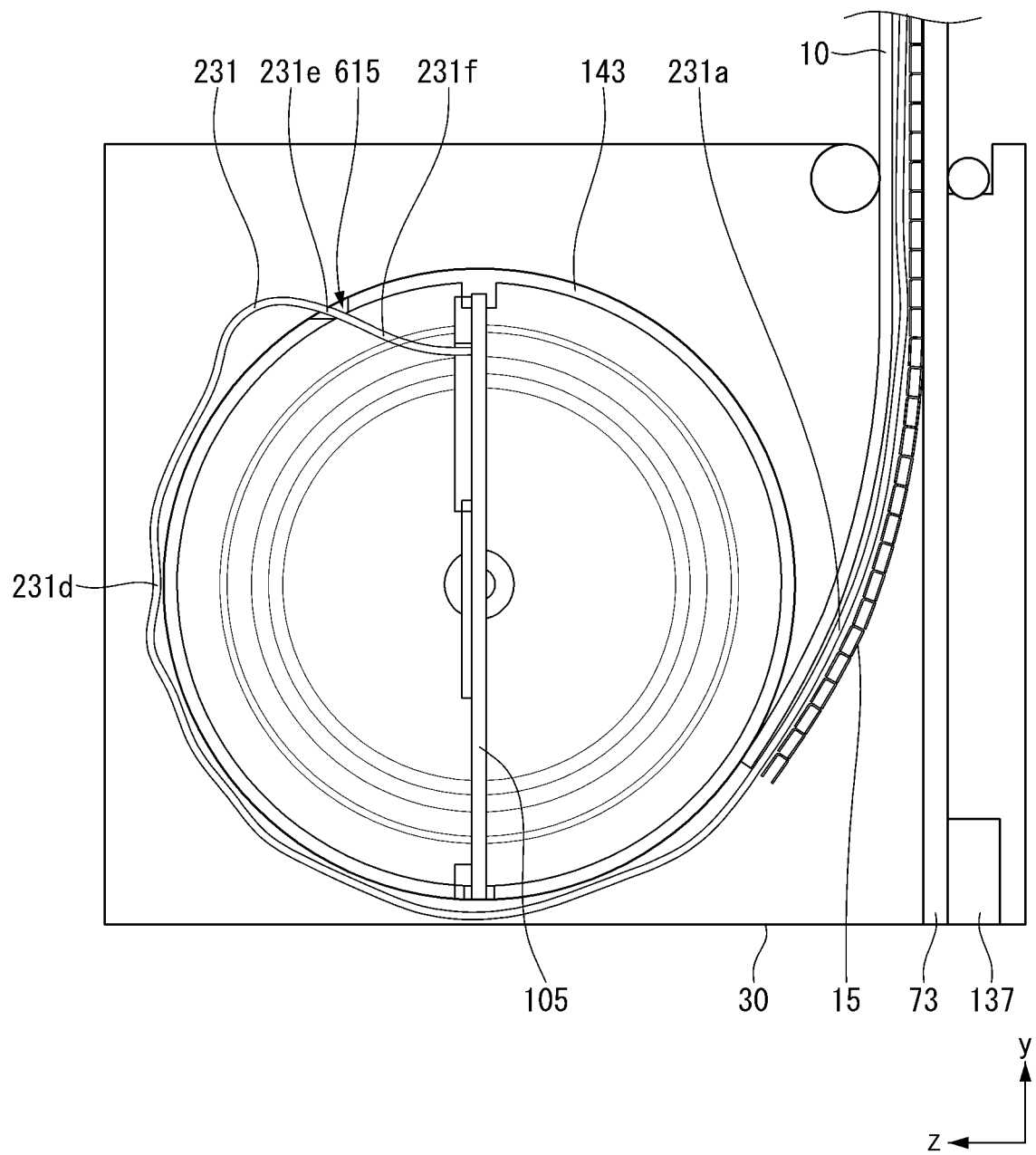

The bottom end of the FFC cable 231 may be connected to the timing controller board 105 (refer to FIG. 29) within the panel roller 143 (refer to FIG. 29). The FFC cable 231, together with the display portion 20, may be wound on or unwound from the panel roller 143.

Part of the FFC cable 231 may be located between the display panel 10 and the module cover 15. A portion that belongs to the FFC cable 231 and that is located between the display panel 10 and the module cover 15 may be referred to as a first portion 231a. The first portion 231a may be located in the depressed portion 425 formed by the plurality of segments 15d. Alternatively, the first portion 231a may be accommodated in the depressed portion 425 formed by the plurality of segments 15d.

Part of the FFC cable 231 may pass through the segment 15f. A portion that belongs to the FFC cable 231 and that passes through the segment 15f may be referred to as a second portion 231b. The segment 15f may include a first hole 521a formed in the front surface and a second hole 521b formed in the back surface. The first hole 521a and the second hole 521b may be connected to form a single hole 521. The hole 521 may pass through the segment 15f in the third direction. The second portion 231b may pass through the hole 521. The hole 521 may also be referred to as a connecting hole 521.

The top end of the FFC cable 231 may be electrically connected to the source PCB 120. Part of the FFC cable 231 may be located in the back surface of the module cover 15. A portion that belongs to the FFC cable 231 and that is located in the back surface of the module cover 15 may be referred to as a third portion 201c. The third portion 231c may be electrically connected to the source PCB 120.

The third portion 231c may be shielded by the top casing 167. Accordingly, the third portion 231c may not be exposed to the outside.

Referring to FIG. 29, in the display device according to an embodiment of the present disclosure, the FFC cable 231 may be connected to the timing controller board 105 mounted on the panel roller 143. A through hole 615 may be located on the panel roller 143. The FFC cable 231 may be connected to the timing controller board 105 through the through hole 615.

The through hole 615 is located on one side of the panel roller 143, and may pass through the outer portion of the panel roller 143. The FFC cable 231 may be connected to one side of the timing controller board 105 through the through hole 615.

In the display device according to an embodiment of the present disclosure, although the FFC cable 231 is located on the outer circumference of the panel roller 143, it can maintain connection with the timing controller board 105 through the through hole 615. Accordingly, the FFC cable 231 may not be twisted because it rotates along with the panel roller 143.

Part of the FFC cable 231 may be wound on the panel roller 143. A portion that belongs to the FFC cable 231 and that is wound on the panel roller 143 may be referred to as a fourth portion 231d. The fourth portion 231d may come into contact with the outer surface of the panel roller 143.

Part of the FFC cable 231 may pass through the through hole 615. A portion that belongs to the FFC cable 231 and that passes through the through hole 615 may be referred to as a fifth portion 231e.

The bottom end of the FFC cable 231 may be electrically connected to the timing controller board 105. Part of the FFC cable 231 may be located within the panel roller 143. A portion that belongs to the FFC cable 231 and that is located within the panel roller 143 may be referred to as a sixth portion 231f. The sixth portion 231f may be electrically connected to the timing controller board 105.

Figure 30:
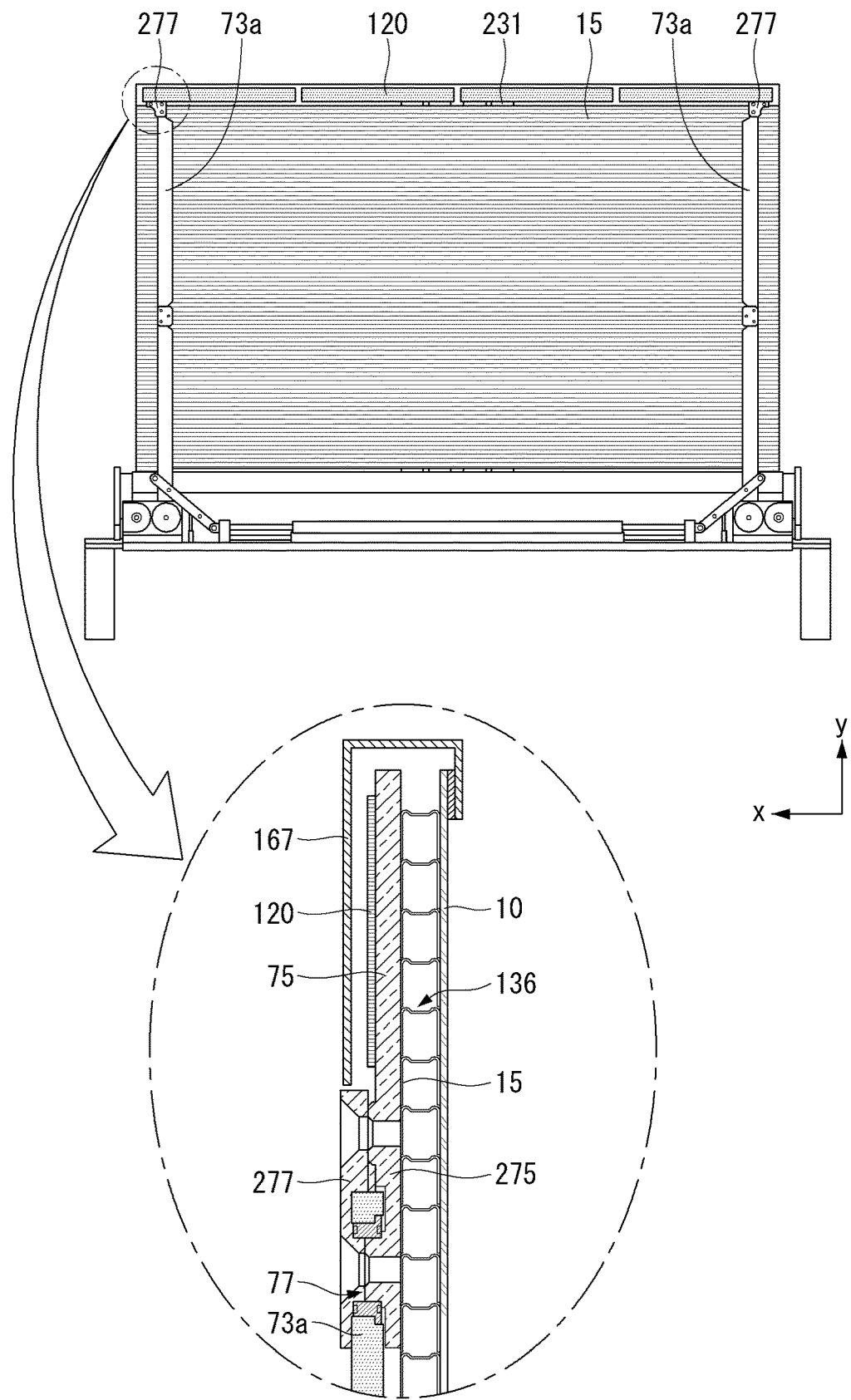
FIGS. 30 to 34 are diagrams showing a display device according to another embodiment of the present disclosure.

Referring to FIG. 30, the first arms 73a may be connected to both ends of the upper bar 75. The first arm 73a may be pivotally connected to a link bracket 277 through a coupling hole 77 located in the first arm 73a. The link bracket 277 may be coupled to the connecting portion 275 of the upper bar 75. The link bracket 277 may be spaced apart from the top casing 167 downward (i.e., in the −y-axis direction). The link bracket 277 may couple the first arm 73a to the connecting portion 275 through at least one screw.

A small display device can be implemented because the module cover 15, the source PCB 120, and the first link 73a are coupled to the upper bar 75.

Figure 31A:
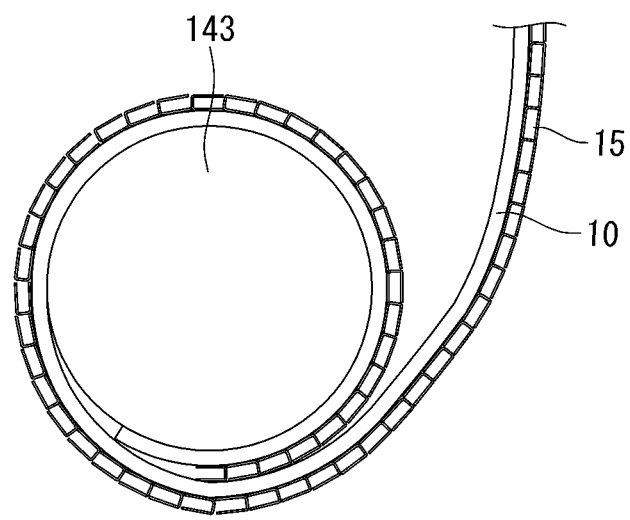
Figure 31B:
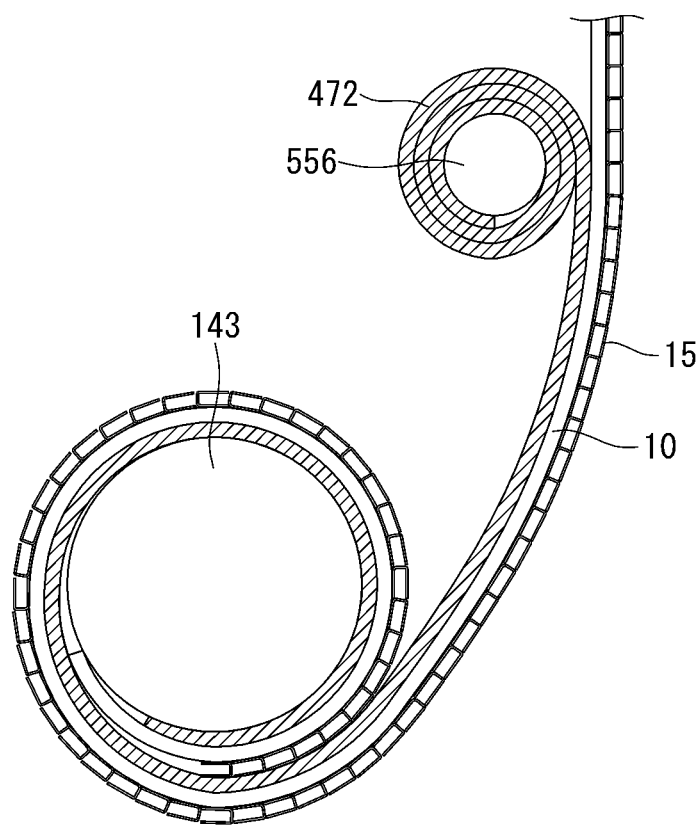

Referring to FIGS. 31A and 31B, an assistant roller 556 may be spaced apart from the panel roller 143. The assistant roller 556 may be connected to a protection sheet 472. The protection sheet 472 may have one end connected to the assistant roller 556 and the other end connected to the display panel 10. The assistant roller 556 may be wound or unwound by the protection sheet 472. The protection sheet 472 may include non-woven fabric.

The assistant roller 556 may be located adjacent to a portion on which the panel roller 143 is wound. The assistant roller 556 may be rotated in a direction opposite the direction in which the panel roller 143 is rotated. That is, when the panel roller 143 unwinds the display panel 10, the assistant roller 556 may wind the protection sheet 472. Furthermore, when the panel roller 143 winds the display panel 10, the assistant roller 556 unwinds the protection sheet 472.

Referring to FIG. 31A, if the protection sheet 472 is not used, when the panel roller 143 winds the module cover 15 and the display panel 10, the module cover 15 and the display panel 10 may rub against each other. The display panel 10 may be damaged due to frication with the module cover 15.

Referring to FIG. 31B, the display panel 10, the module cover 15, and the protection sheet 472 may be together wound on or unwound from the panel roller 143. When the display panel 10, the module cover 15, and the protection sheet 472 are wound on the panel roller 154, the protection sheet 472 may be located between the module cover 15 and the display panel 10. The protection sheet 472 can prevent friction between the module cover 15 and the display panel 10. Damage to the display panel 10 can be prevented because the protection sheet 472 prevents friction between the module cover 15 and the display panel 10.

Figure 32:
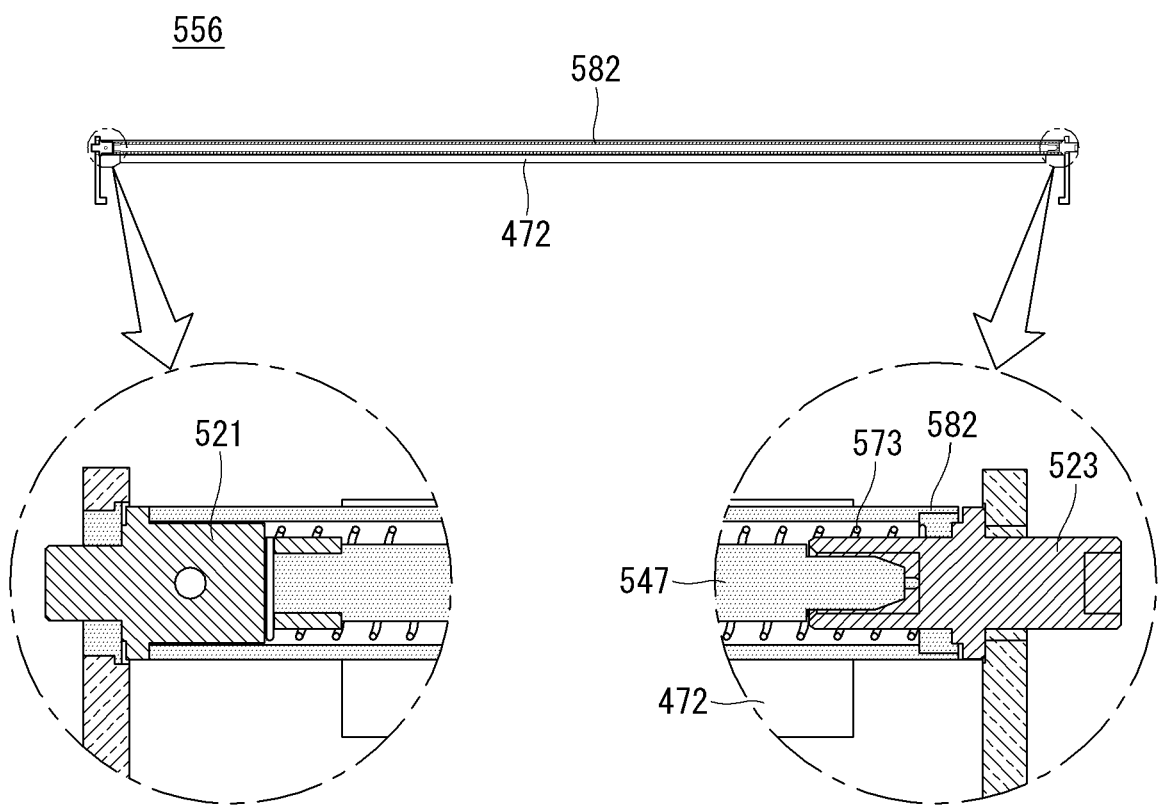

Referring to FIG. 32, the assistant roller 556 may include a fixing cap 521, a rotating cap 523, a shaft 547, a coil spring 573, and a roller cover 582.

The coil spring 573 may be disposed within the assistant roller 556. The length direction of the coil spring 573 and the length direction of the assistant roller 556 may be parallel.

The fixing cap 521 may be located at one end of the assistant roller 556. The fixing cap 521 may be coupled to one end of the coil spring 573. The fixing cap 521 may be fixed regardless of the rotation of the roller cover 582. The fixing cap 521 may not rotate.

The rotating cap 523 may be located at the other end of the assistant roller 556. The rotating cap 523 may be coupled to the other end of the coil spring 573. The rotating cap 523, together with the roller cover 582, may be rotated when the roller cover 582 is rotated.

When the roller cover 582 rotates, the fixing cap 521 on one side does not rotate, the rotating cap 523 may rotate along with the roller cover 582, and the coil spring 573 may be elastically deformed. The coil spring 573 may store energy while being elastically deformed, and may apply a restoring force to the rotating cap 523. The restoring force of the coil spring 573 may act in a direction opposite the rotating direction of the rotating cap 523.

Accordingly, as the protection sheet 472 is unwound from the assistant roller 556, a force that winds the protection sheet 472 on the assistant roller 556 again may act on the assistant roller 556. That is, when the display panel is unwound from the panel roller, the protection sheet 472 may be wound on the assistant roller 556.

Furthermore, as the protection sheet 472 is wound on the assistant roller 556, a force that unwinds the protection sheet 472 from the assistant roller 556 again may act on the assistant roller 556. That is, when the display panel is wound on the panel roller, the protection sheet 472 may be unwound from the assistant roller 556.

The shaft 547 may be the central axis of the assistant roller 556. The shaft 547 may be connected to the fixing cap 521. The coil spring 573 may be fit into the shaft 547. The shaft 547 may assist the coil spring 573 so that it is stably located within the assistant roller 556.

The roller cover 582 may form an external appearance of the assistant roller 556. The roller cover 582 may accommodate the fixing cap 521, the rotating cap 523, the shaft 547, and the coil spring 573. The roller cover 582 may be connected to one end of the protection sheet 472. That is, the protection sheet 472 may be wound on the roller cover 582.

Figure 33:
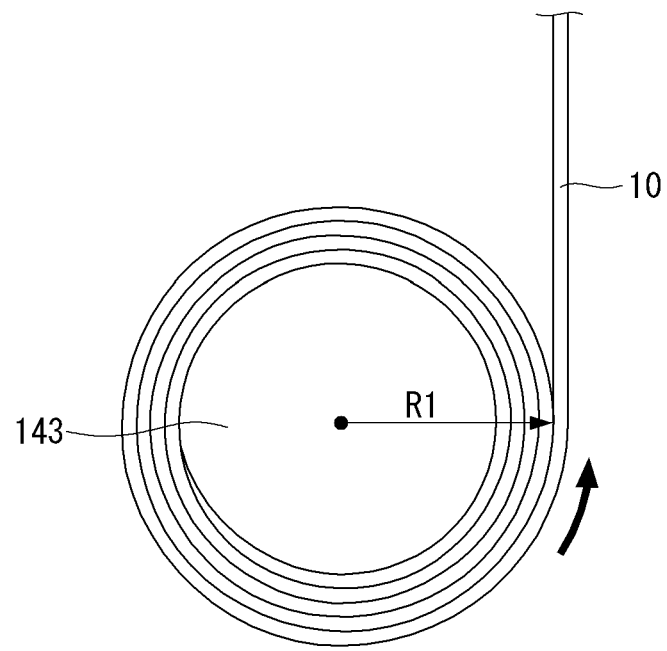
Figure 33:
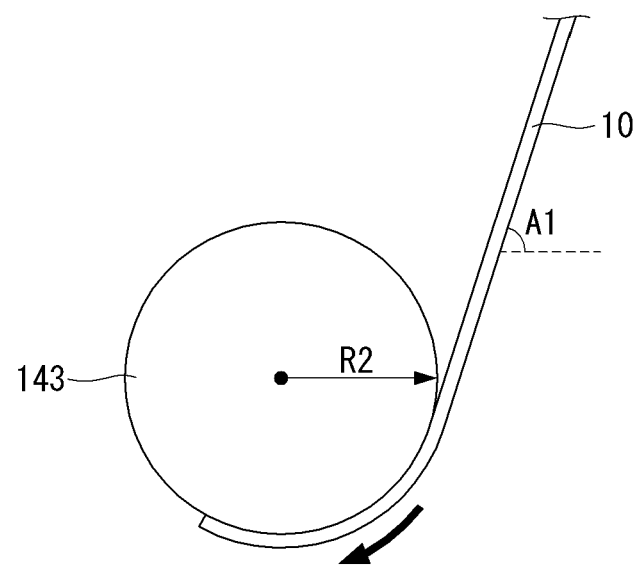

Referring to FIG. 33, a radius formed by the panel roller 143 and the display panel 10 wound on the panel roller 143 may be referred to as R1. A value of R1 may vary depending on the degree that the display panel 10 is wound on the panel roller 143. The radius of the panel roller 143 may be referred to as R2.

The panel roller 143 may be fixed within the housing 30 (refer to FIG. 7). Furthermore, the entrance 30a (refer to FIG. 7) of the housing through which the display panel passes may be fixed within the housing 30. Accordingly, an angle formed by the display panel 10 unwound from the panel roller 143 and the base 31 (refer to FIG. 10A) within the housing may vary depending on R1.

If the display panel 10 has been sufficiently unwound from the panel roller 143, a radius formed by the panel roller 143 and the display panel 10 wound on the panel roller 143 may be R2. In this case, the display panel 10 may be inclined against the base at an angle A1 If the display panel 10 is inclined against the base, the rising or falling of the display panel 10 may become unstable.

Figure 34:
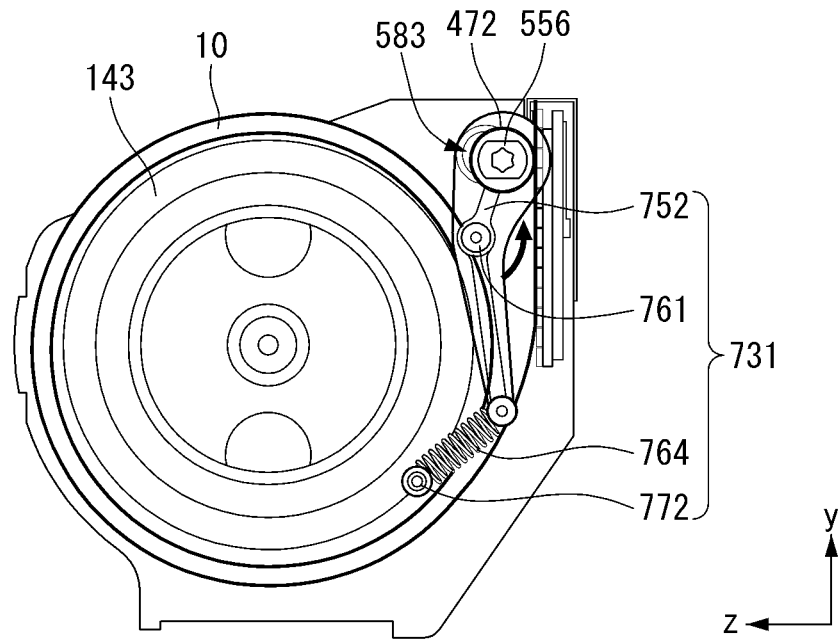
Figure 34:
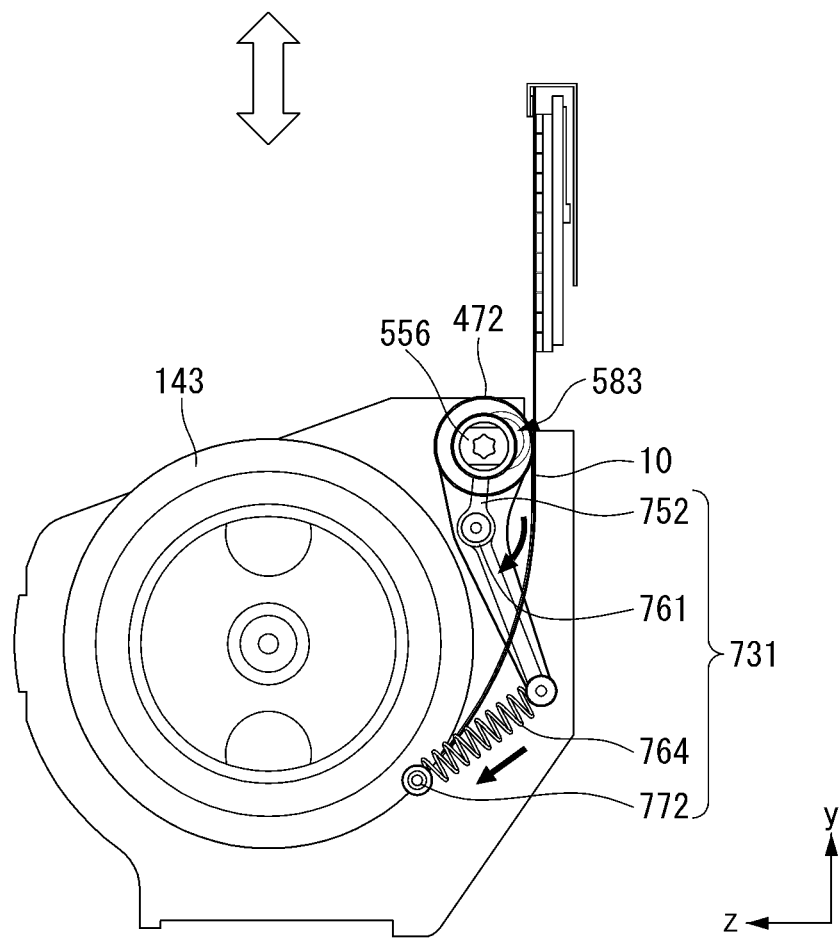

Referring to FIG. 34, the guide assembly 731 may be coupled to the assistant roller 556.

Figure 10A:
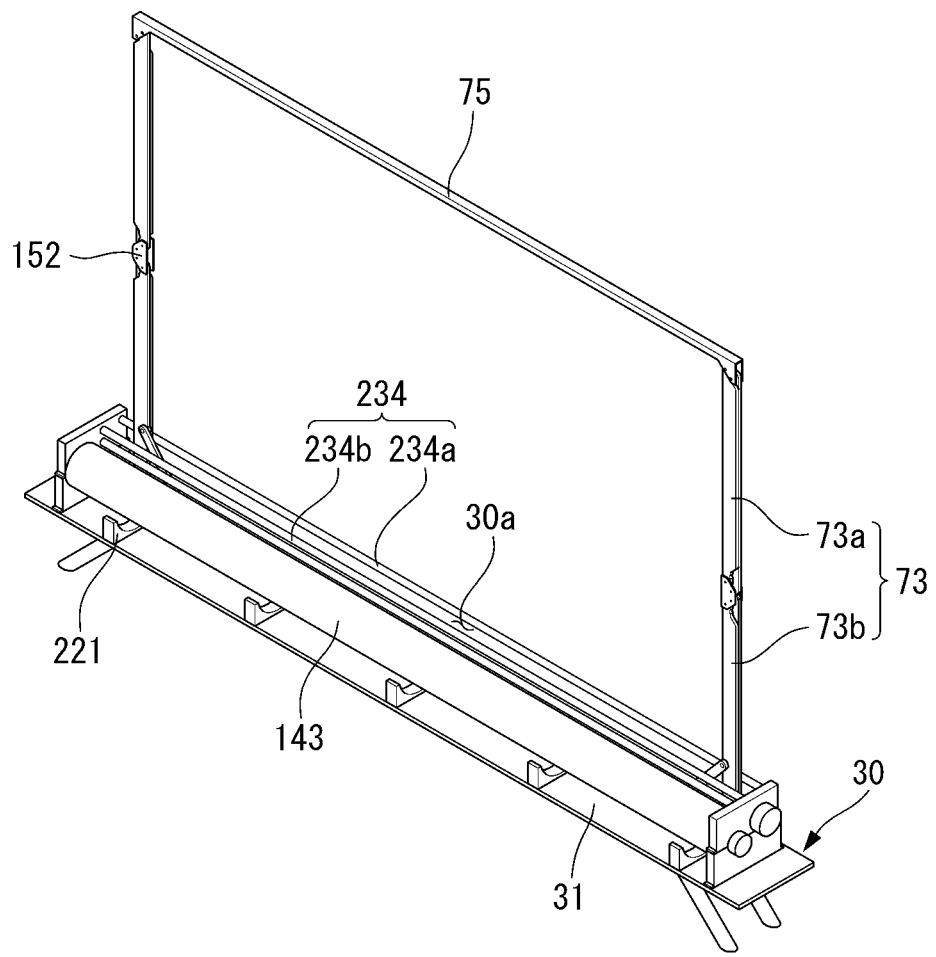
Figure 10B:
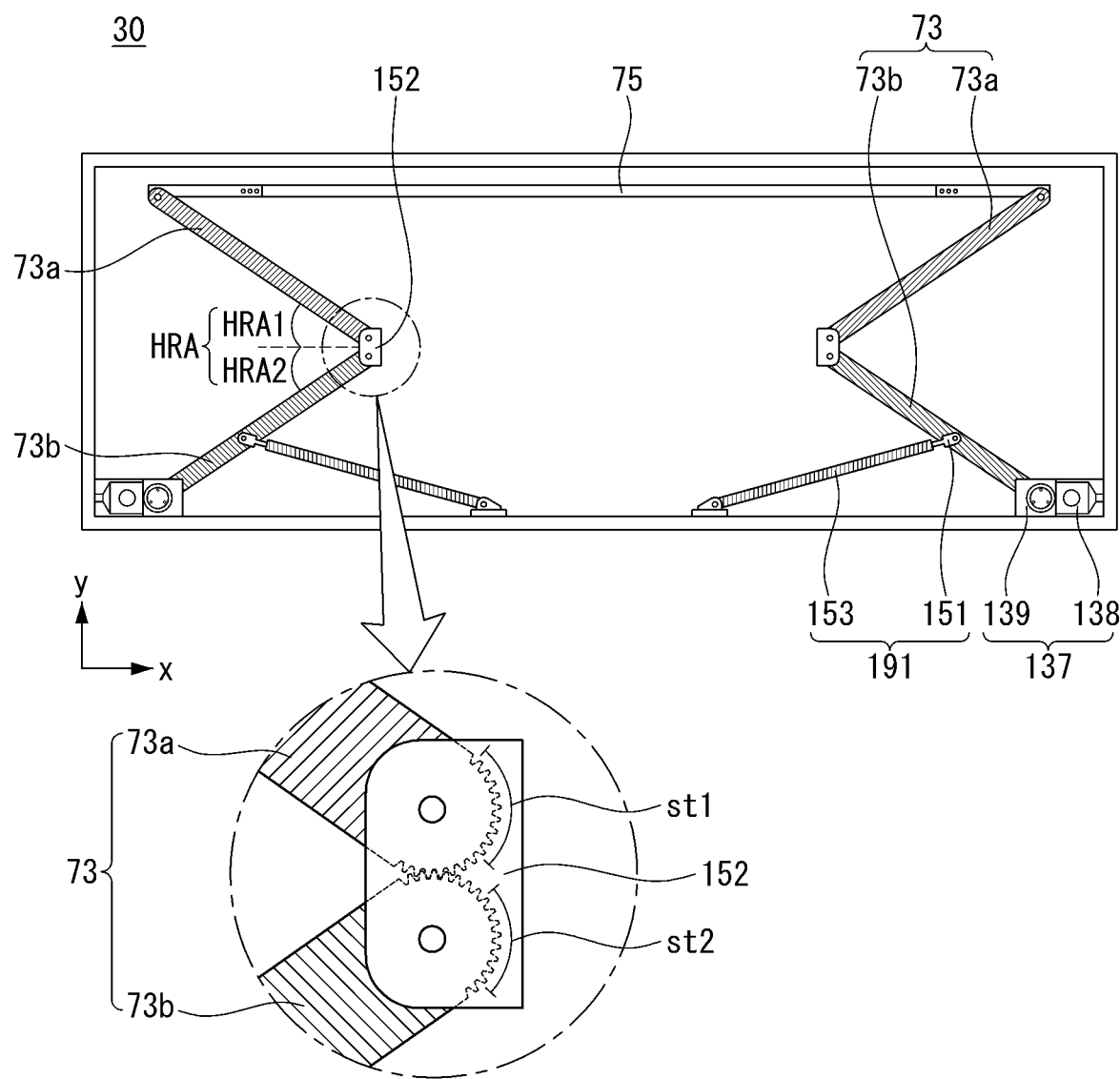
Figure 11:
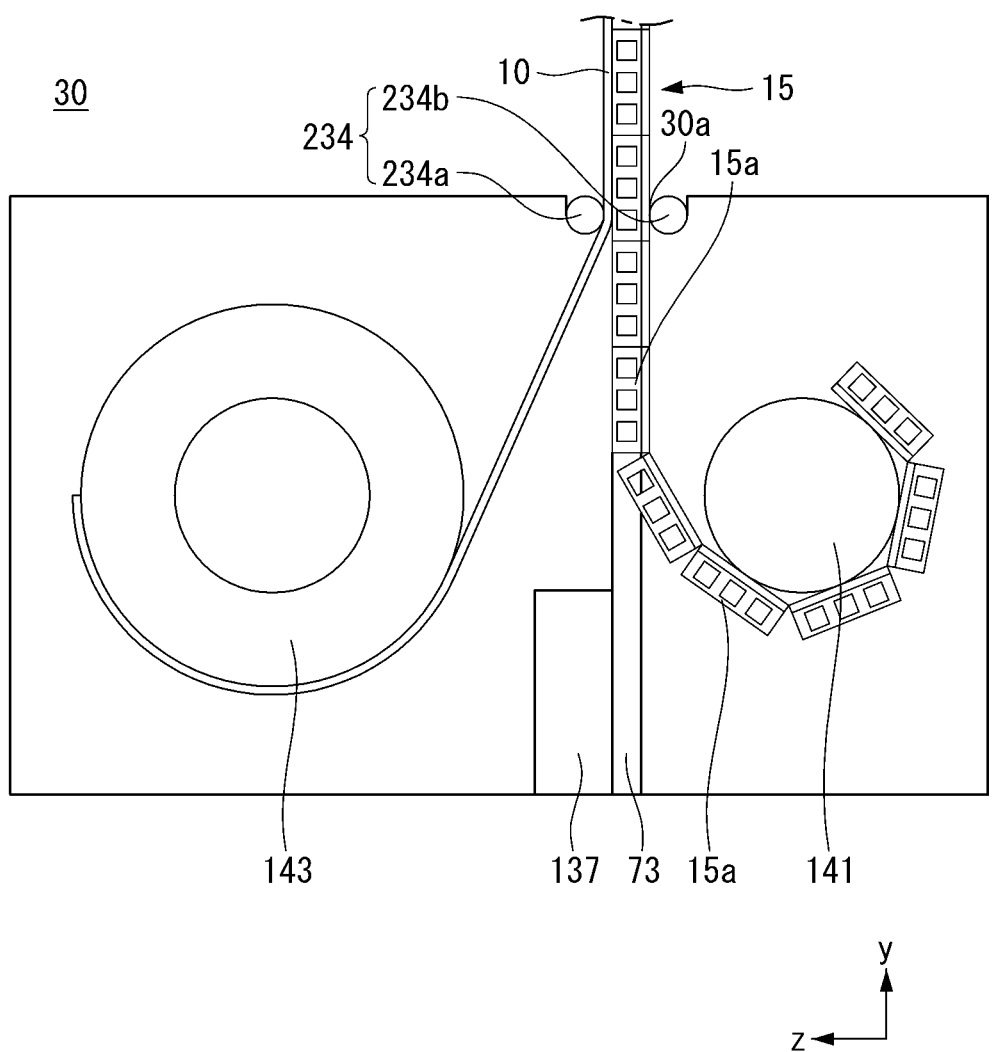

The assistant roller 556 can prevent the display panel 10 from inclining with respect to the base 31 (refer to FIG. 10A). The assistant roller 556 may stably guide the display panel 10 unwound from the panel roller 143. However, a radius/diameter formed by the assistant roller 556 and the protection sheet 472 wound on the assistant roller 556 may vary depending on the degree that the protection sheet 472 is wound on the assistant roller 556.

The guide assembly 731 is coupled to the assistant roller 556, and may adjust the location of the assistant roller 556 depending on the degree that the protection sheet 472 is wound on the assistant roller 556. Accordingly, the assistant roller 556 can stably guide the display panel 10 unwound from the panel roller 143 although a radius/diameter formed by the assistant roller 556 and the protection sheet 472 unwound from the assistant roller 556 varies.

The guide assembly 731 may include a guide arm 752, a pin bolt 761, a tension spring 764, and a supporter 772. The guide arm 752 may have one end connected to the assistant roller 556 and the other end connected to the tension spring 764. The guide arm 752 may be rotated around the pin bolt 761. The pin bolt 761 may be fixed to the housing. The assistant roller 556 is connected to the guide arm 752 and may be rotated around the pin bolt 761.

The tension spring 764 may have one end connected to the guide arm 762 and the other end connected to the supporter 772. The supporter 772 may be fixed to the housing.

When the panel roller 143 is unwound from the display panel 10, the assistant roller 556 may be wound on the protection sheet 472, and a radius/diameter formed by the assistant roller 556 and the protection sheet 472 wound on the assistant roller 556 may be increased. Furthermore, the assistant roller 556 may be rotated counterclockwise around the pin bolt 761. In this case, the tension spring 764 may apply a force so that the guide arm 752 is rotated clockwise.

The tension spring 764 can prevent the assistant roller 556 from excessively rotating counterclockwise around the pin bolt 761.

When the display panel 10 is wound on the roller 143, the protection sheet 472 may be unwound from the assistant roller 556, and a radius/diameter formed by the assistant roller 556 and the protection sheet 472 wound on the assistant roller 556 may be decreased. Furthermore, the assistant roller 556 may be rotated clockwise around the pin bolt 761.

In this case, the tension spring 764 can prevent the assistant roller 556 from rotating counterclockwise around the pin bolt 761.

Hereinafter, a configuration and operation different from those of the aforementioned embodiments are chiefly described, and the same or similar configuration as that of the aforementioned embodiments is omitted in order to avoid redundancy.

Figure 35:
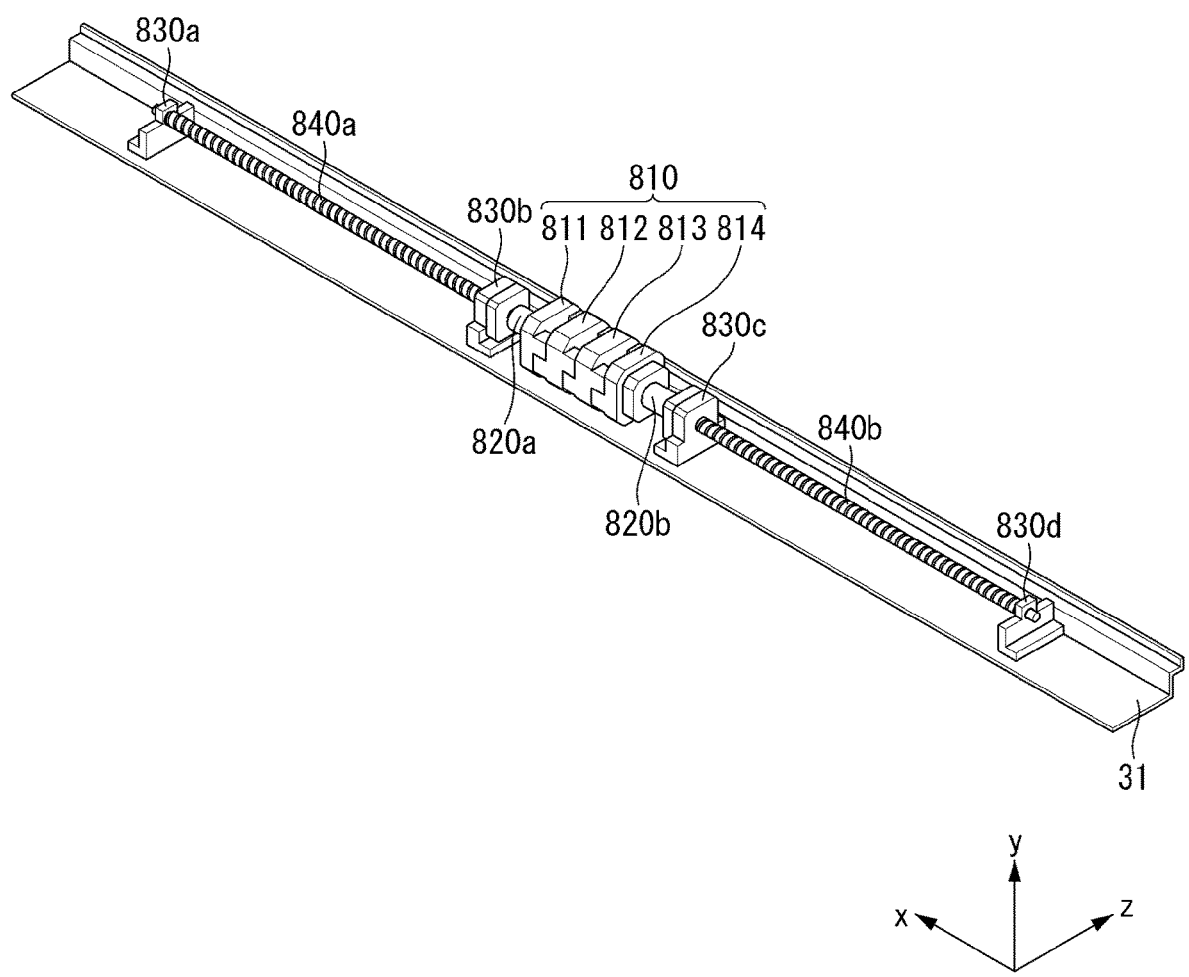
FIGS. 35 to 64 are diagrams showing a display device according to yet another embodiment of the present disclosure.

Referring to FIG. 35, a motor assembly 810 may be installed on the base 31. The base 31 may be the base side of the housing 30 (refer to FIG. 19). The driving shafts of the motor assembly 810 may be formed on both sides. The right driving shaft and left driving shaft of the motor assembly 810 may be rotated in the same direction. Alternatively, the right driving shaft and left driving shaft of the motor assembly 810 may be rotated in opposite directions.

The motor assembly 810 may include a plurality of motors. The plurality of motors may be connected in series. The plurality of motors may include a first motor 811, a second motor 812, a third motor 813, and a fourth motor 814 sequentially disposed from the right side to the left side. The right driving shaft of the motor assembly 810 may be formed in the first motor 811. Furthermore, the left driving shaft of the motor assembly 810 may be formed in the fourth motor 814. The motor assembly 810 can output high torque because the plurality of motors is connected in series.

The motor assembly 810 may be connected to lead screws 840a and 840b. The lead screws 840a and 840b may include a right lead screw 840a connected to the right side of the motor assembly 810 and a left lead screw 840b connected to the left side of the motor assembly 810. The right lead screw 840a may also be referred to as a first lead screw 840a. The left lead screw 840b may also be referred to as a second lead screw 840b.

The right driving shaft of the motor assembly 810 may be connected to the right lead screw 840a. Alternatively, the right driving shaft of the motor assembly 810 and the right lead screw 840a may be connected through a right coupling 820a. Alternatively, the driving shaft of the first motor 811 may be connected to the right lead screw 840a. Alternatively, the driving shaft of the first motor 811 and the right lead screw 840a may be connected through the right coupling 820a. The right driving shaft may also be referred to as a first driving shaft. The left driving shaft may also be referred to as a second driving shaft.

The left driving shaft of the motor assembly 810 may be connected to the left lead screw 840b. Alternatively, the left driving shaft of the motor assembly 810 and the left lead screw 840b may be connected through the left coupling 820b. Alternatively, the driving shaft of the fourth motor 814 may be connected to the left lead screw 840b. Alternatively, the driving shaft of the fourth motor 814 and the left lead screw 840b may be connected through the left coupling 820b.

The couplings 820a and 820b may include the right coupling 820a that connects the right driving shaft of the motor assembly 810 and the right lead screw 840a and the left coupling 820b that connects the left driving shaft of the motor assembly 810 and the left lead screw 840b.

Screw threads may be formed in the lead screws 840a and 840b in the length direction. The screw thread formed in the right lead screw 840a and the screw thread formed in the left lead screw 840b may have opposite directions. Alternatively, the screw thread formed in the right lead screw 840a and the screw thread formed in the left lead screw 840b may have the same direction.

Bearings 830a, 830b, 830c, and 830d may be installed on the base 31. A plurality of the bearings 830a, 830b, 830c, and 830d may be formed in the length direction of the base 31. The bearings 830a, 830b, 830c, and 830d may include right bearings 830a, 830b, 830c, and 830d disposed on the right side of the motor assembly 810 and left bearings 830a, 830b, 830c, and 830d disposed on the left side of the motor assembly 810.

The bearings 830a, 830b, 830c, and 830d may support the lead screws 840a and 840b. The lead screws 840a and 840b may be connected to the driving shaft of the motor assembly 810 and may rotate around the driving shaft. The bearings 830a, 830b, 830c, and 830d may support the lead screws 840a and 840b while not hindering the rotation of the lead screws 840a and 840b.

The right bearings 830a, 830b, 830c, and 830d may support the right lead screw 840a. The right bearings 830a, 830b, 830c, and 830d may include the first right bearing 830a that supports the right side of the right lead screw 840a and the second right bearing 830b that supports the left side of the right lead screw 840a. The first right bearing 830a may also be referred to as a first bearing 830a. The second right bearing 830b may also be referred to as a second bearing 830b.

The left bearings 830a, 830b, 830c, and 830d may support the left lead screw 840b. The left bearings 830a, 830b, 830c, and 830d may include the first left bearing 830c that supports the right side of the left lead screw 840b and the second left bearing 830d that supports the left side of the left lead screw 840b.

In the bearings 830a, 830b, 830c, and 830d, the couplings 820a and 820b, and the motor assembly 810, the first right bearing 830a, the second right bearing 830b, the right coupling 820a, the motor assembly 810, the left coupling 820b, the first left bearing 830c, and the second left bearing 830d may be sequentially disposed from the right side to the left side.

Figure 36:
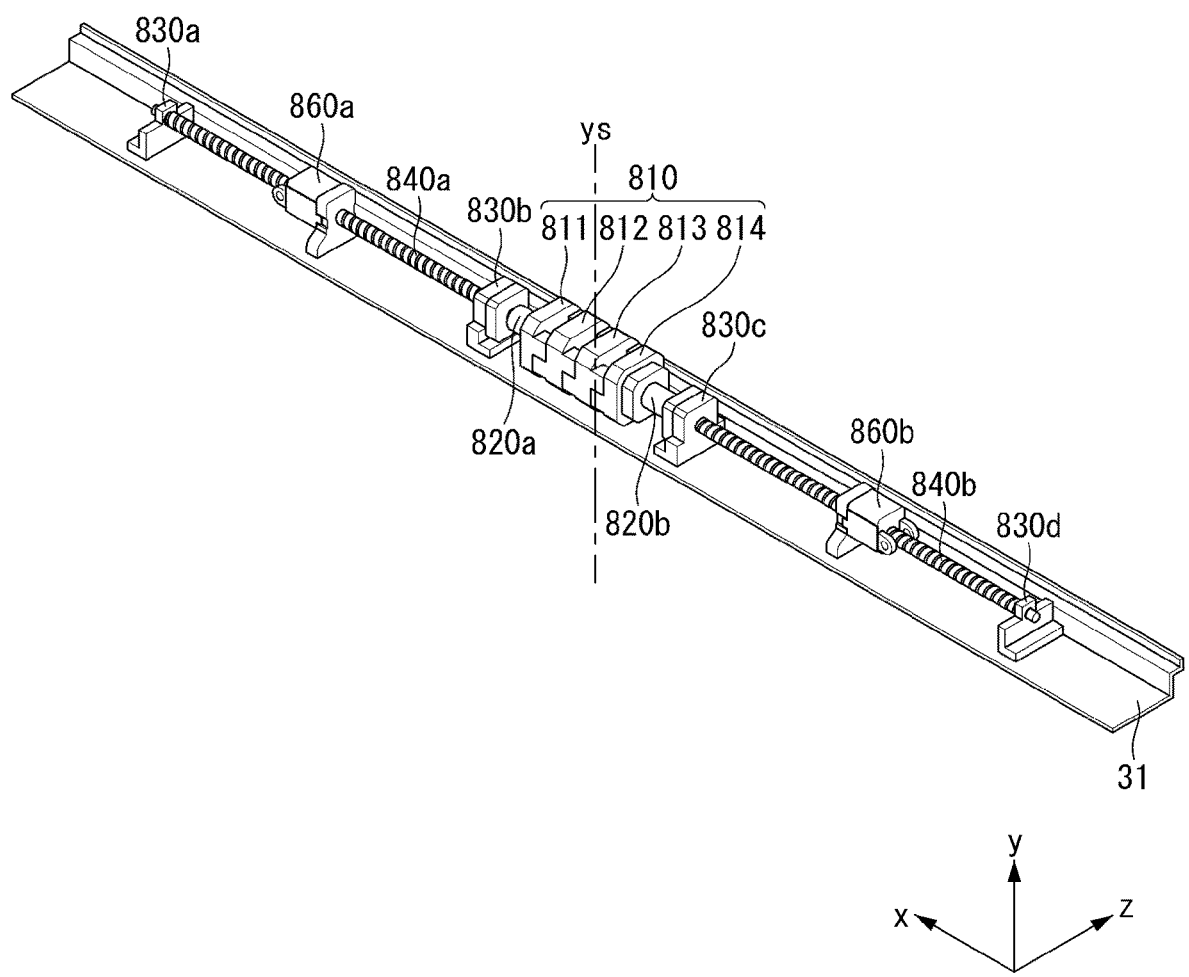
Figure 37:
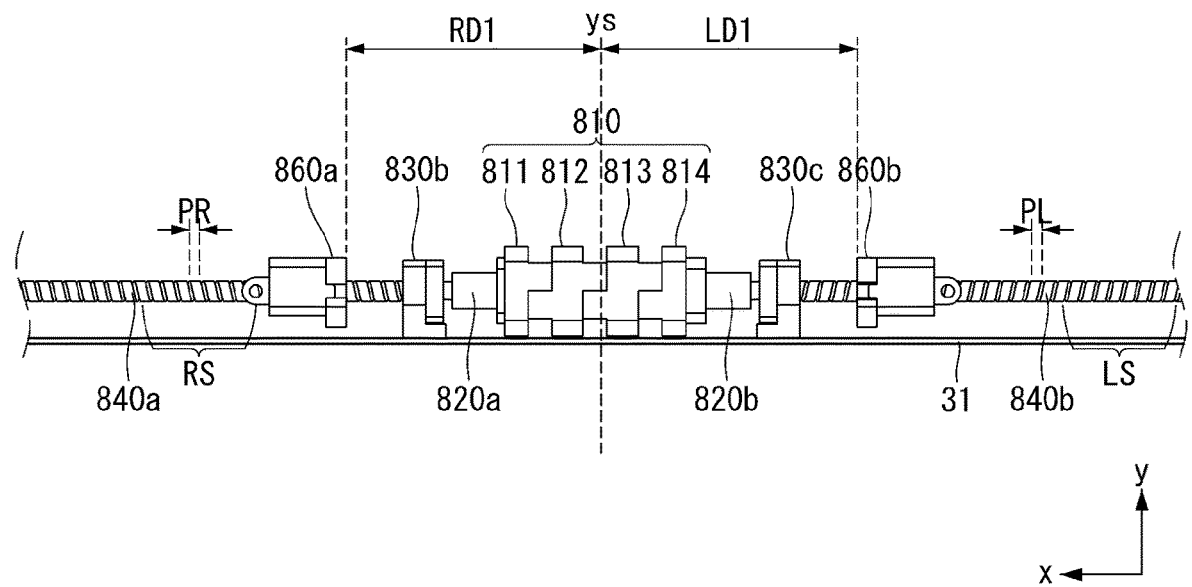

Referring to FIGS. 36 and 37, the display device may further include a slider 860a, 860b. The slider 860a, 860b may be coupled to the lead screws 840a and 840b. The lead screws 840a and 840b may be disposed to penetrate the slider 860a, 860b. A plurality of the sliders 860a and 860b may be formed. The sliders 860a and 860b may include a right slider 860a coupled to the right lead screw 840a and a left slider 860b coupled to the left lead screw 840b. The right slider 860a may also be referred to as a first slider 860a. The left slider 860b may also be referred to as a second slider 860b.

Figure 43:
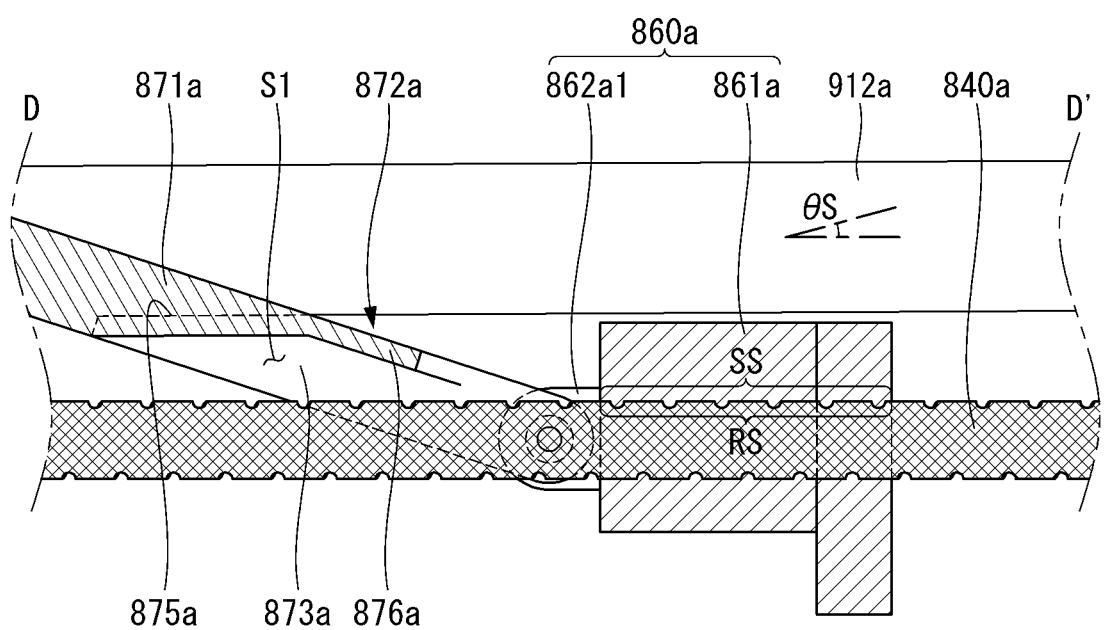
Figure 44A:
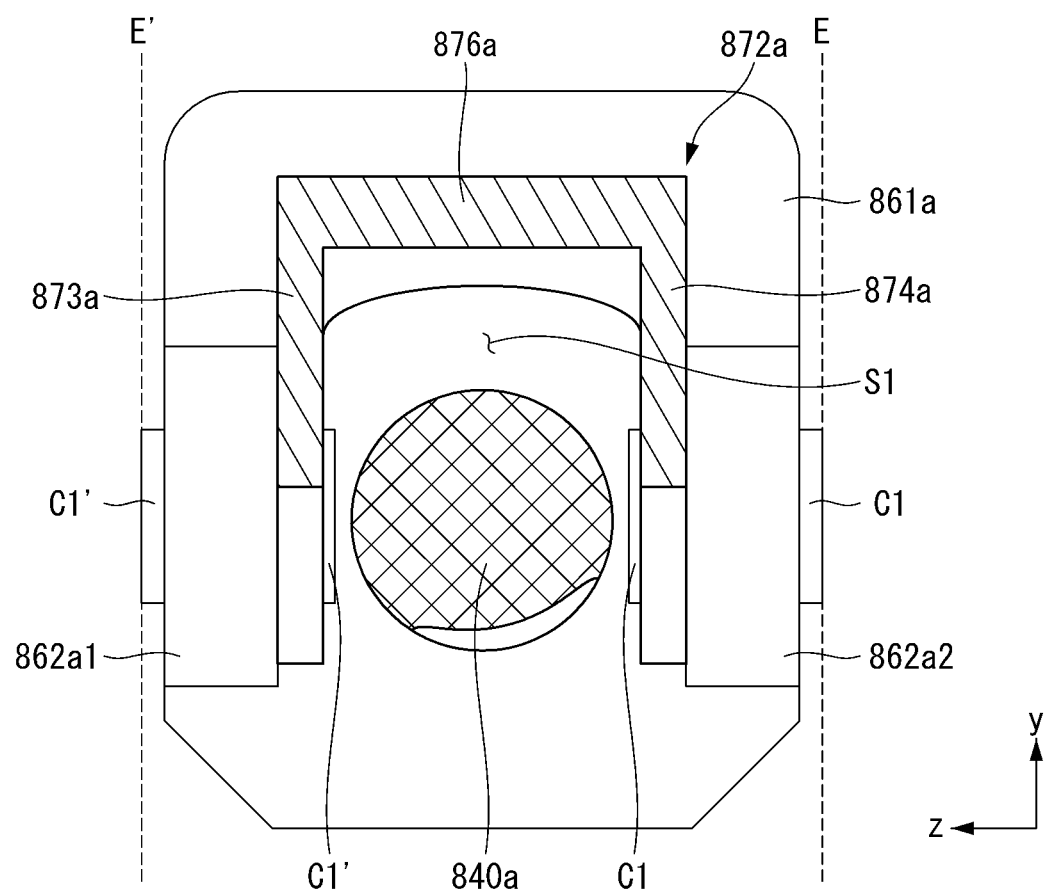
Figure 44B:
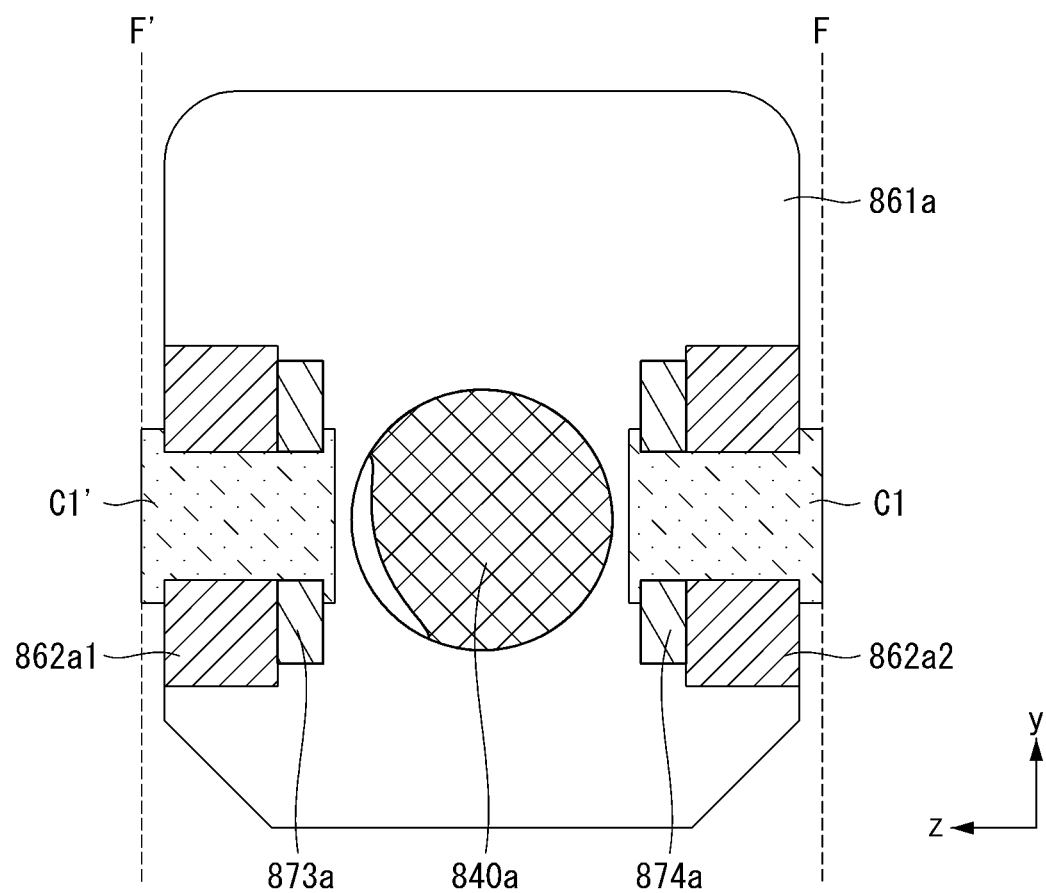

Screw threads SS (refer to FIG. 43) may be formed in the inner circumferential surfaces of the sliders 860a and 860b. The screw threads SS formed in the inner circumferential surfaces of the sliders 860a and 860b and screw threads RS and LS formed in the lead screws 840a and 840b may be engaged with each other. The sliders 860a and 860b may advance or retreat in the length direction of the lead screws 840a and 840b as the lead screws 840a and 840b are rotated.

The right slider 860a may be engaged with the right lead screw 840a. As the right lead screw 840a is rotated, the right slider 860a may advance or retreat between the first right bearing 830a and the second right bearing 830b.

The left slider 860b may be engaged with the left lead screw 840b. When the left lead screw 840b is rotated, the left slider 860b may advance or retreat between the first left bearing 830c and the second left bearing 830d.

The right slider 860a may be spaced apart from the symmetry axis "ys" of the motor assembly 810 at a distance RD1. The left slider 860b may be spaced apart from the symmetry axis "ys" of the motor assembly 810 at a distance LD1. The distance RD1 and the distance LD1 may have the same length. That is, the right slider 860a and the left slider 860b may be symmetrical to each other based on the symmetry axis "ys" of the motor assembly 810.

The rotating direction of the right driving shaft and the rotating direction of the left driving shaft may become the same by the motor assembly 810. Furthermore, the screw thread RS of the right lead screw 840a and the screw thread LS of the left lead screw 840b may have opposite directions. Accordingly, if the right slider 860a moves in the +x-axis direction as the right driving shaft rotates, the left slider 860b may move in the −x-axis direction as the left driving shaft rotates. Alternatively, when the right slider 860a moves in the −x-axis direction as the right driving shaft rotates, the left slider 860b may move in the +x-axis direction as the left driving shaft rotates.

Figure 38:
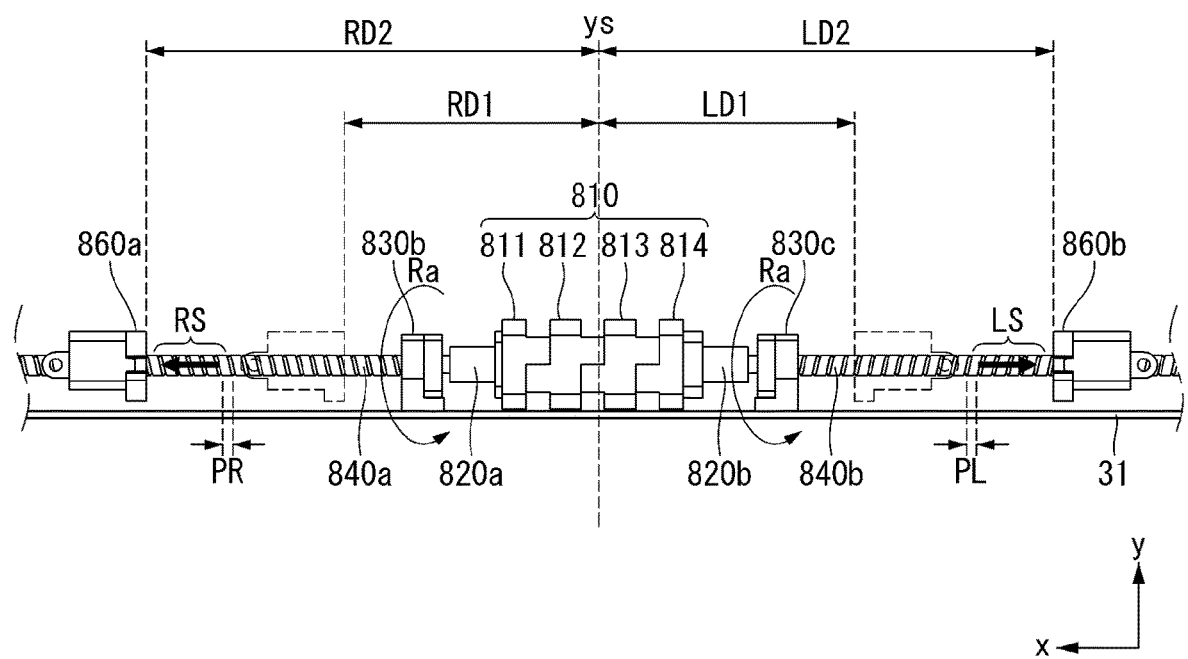

Referring to FIG. 38, the screw thread RS of the right lead screw 840a and the screw thread LS of the left lead screw 840b may have opposite directions. The right lead screw 840a may have a pitch PL, and the left lead screw 840b may have a pitch PR. The pitch PL of the right lead screw 840a and the pitch PR of the left lead screw 840b may have the same length.

The output of the right driving shaft and the output of the left driving shaft may become the same by the motor assembly 810. The rotating direction Ra of the right driving shaft and the rotating direction Ra of the left driving shaft may be the same. Furthermore, the number of revolutions of the right driving shaft per unit time and the number of revolutions of the left driving shaft per unit time may be the same. Furthermore, the torque of the right driving shaft and the torque of the left driving shaft may have the same direction. Furthermore, the amount of torque of the right driving shaft and the amount of torque of the left driving shaft may be the same.

The right slider 860a may move from the location where the right slider 860a has been spaced apart from the symmetry axis "ys" of the motor assembly 810 at the distance RD1 to the +x-axis direction as the right driving shaft rotates. When the right driving shaft rotates n times, the right slider 860a may be spaced apart from the symmetry axis "ys" of the motor assembly 810 at a distance LD2. In this case, the distance RD1 and the distance LD2 may have a difference corresponding to "(the number of revolutions n)*(the pitch PL of the right slider 860a)."

The left slider 860b may move from the location where the left slider 860b has been spaced apart from the symmetry axis "ys" of the motor assembly 810 at the distance LD1 to the −x axis direction as the left driving shaft rotates. When the left driving shaft rotates n times, the left slider 860b may be spaced apart from the symmetry axis "ys" of the motor assembly 810 at a distance RD2. In this case, the distance LD1 and the distance RD2 may have a difference corresponding to "(the number of revolutions n)*(the pitch PL of the left slider 860b)."

That is, if the pitch PR of the right slider 860a and the pitch PL of the left slider 860b are the same, the right slider 860a and the left slider 860b may have the same displacement, but have opposite directions.

Furthermore, if the initial locations of the right slider 860a and the left slider 860b are symmetrical to the symmetry axis "ys" of the motor assembly 810, the right slider 860a and the left slider 860b may become distant from each other while maintaining symmetry with respect to the symmetry axis "ys" of the motor assembly 810.

Figure 39:
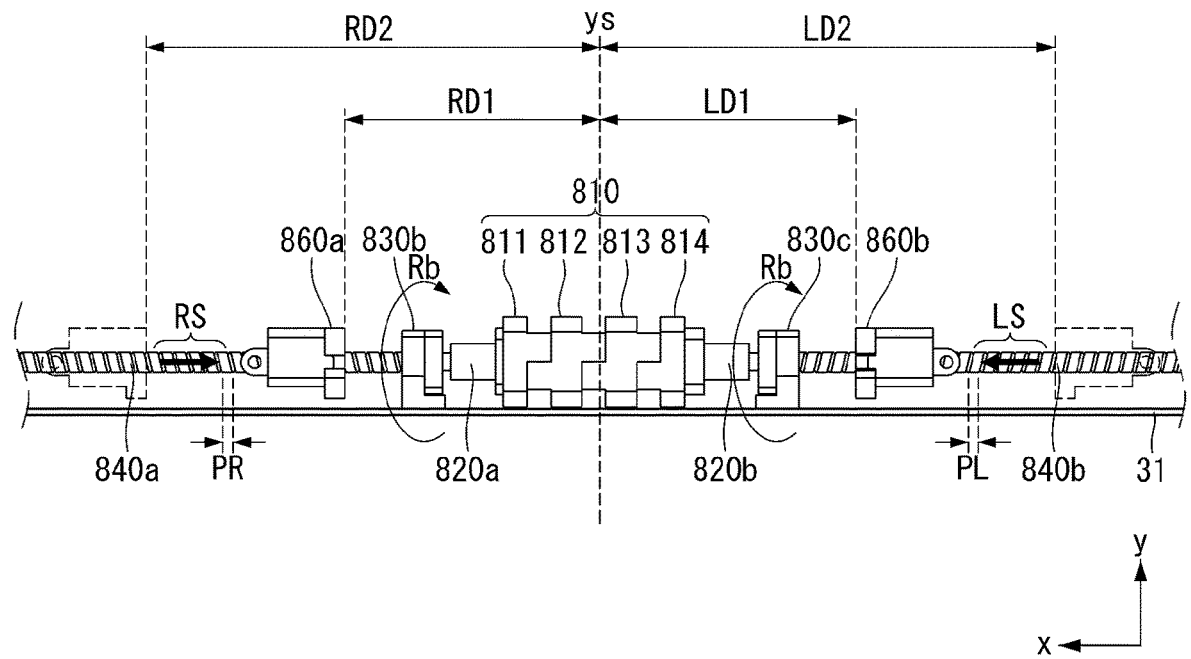

Referring to FIG. 39, the right slider 860a may move from the location where the right slider 860a has been spaced apart from the symmetry axis "ys" of the motor assembly 810 at the distance RD2 to the −x axis direction as the right driving shaft rotates. The rotating direction Rb of the right driving shaft and the rotating direction Rb of the left driving shaft may be the same. When the right driving shaft rotates n times, the right slider 860a may be spaced apart from the symmetry axis "ys" of the motor assembly 810 at the distance RD1. In this case, the distance RD1 and the distance RD2 may have a difference corresponding to "(the number of revolutions n)*(the pitch PR of the right slider 860a)."

The left slider 860b may move from the location where the left slider 860b has been spaced apart from the symmetry axis "ys" of the motor assembly 810 at the distance LD2 to the +x-axis direction as the left driving shaft rotates. When the left driving shaft rotates n times, the left slider 860b may be spaced apart from the symmetry axis "ys" of the motor assembly 810 at the distance LD1. In this case, the distance LD1 and the distance LD2 may have a difference corresponding to "(the number of revolutions n)*(the pitch PL of the left slider 860b)."

That is, if the pitch PR of the right slider 860a and the pitch PL of the left slider 860b are the same, the right slider 860a and the left slider 860b may have the same displacement, but have opposite directions.

Furthermore, if the initial locations of the right slider 860a and the left slider 860b are symmetrical to the symmetry axis "ys" of the motor assembly 810, the right slider 860a and the left slider 860b may become close to each other while maintaining symmetry with respect to the symmetry axis "ys" of the motor assembly 810.

Figure 40:
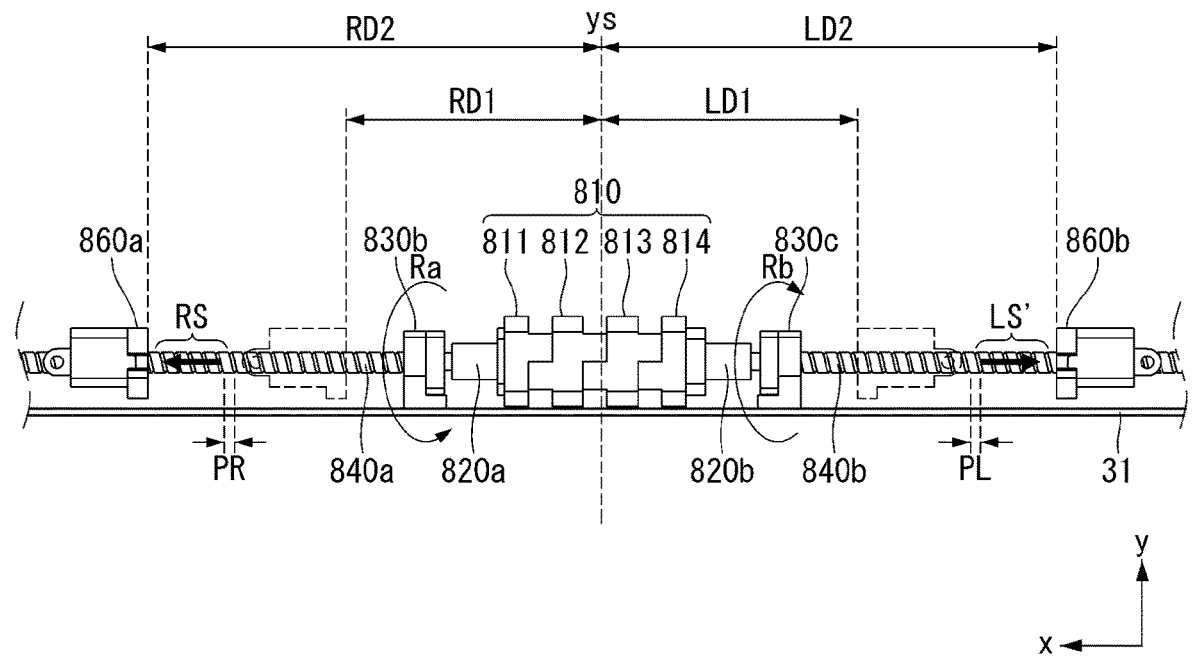

Referring to FIG. 40, the motor assembly 810 may make the right driving shaft Ra and the left driving shaft Rb have opposite rotating directions. The screw thread RS of the right lead screw 840a and the screw thread LS' of the left lead screw 840b may have the same direction. Accordingly, when the right slider 860a moves in the +x-axis direction as the right driving shaft rotates, the left slider 860b may move in the −x-axis direction as the left driving shaft rotates. Alternatively, when the right slider 860a moves in the +x-axis direction as the right driving shaft rotates, the left slider 860b may move in the −x-axis direction as the left driving shaft rotates.

The right lead screw 840a may have the pitch PR, and the left lead screw 840b may have the pitch PL. The pitch PR of the right lead screw 840a and the pitch PL of the left lead screw 840b may be formed to have the same length.

The right driving shaft and the left driving shaft may have the same output by the motor assembly 810. The rotating direction of the right driving shaft and the rotating direction of the left driving shaft may be opposite. Furthermore, the number of revolutions of the right driving shaft per unit time and the number of revolutions of the left driving shaft per unit time may be the same. Furthermore, the torque of the right driving shaft and the torque of the left driving shaft may have opposite directions. Furthermore, the amount of torque of the right driving shaft and the amount of torque of the left driving shaft may be the same.

The right slider 860a may move from the location where the right slider 860a has been spaced apart from the symmetry axis "ys" of the motor assembly 810 at the distance RD1 to the +x-axis direction as the right driving shaft rotates. When the right driving shaft rotates n times, the right slider 860a may be spaced apart from the symmetry axis "ys" of the motor assembly 810 at the distance RD2. In this case, the distance RD1 and the distance RD2 may have a difference corresponding to "(the number of revolutions n)*(the pitch PR of the right slider 860a)."

The left slider 860b may move from the location where the left slider 860b has been spaced apart from the symmetry axis "ys" of the motor assembly 810 at the distance LD1 to the −x-axis direction as the left driving shaft rotates. When the left driving shaft rotates n times, the left slider 860b may be spaced apart from the symmetry axis "ys" of the motor assembly 810 at the distance LD2. In this case, the distance LD1 and the distance LD2 may have a difference corresponding to "(the number of revolutions n)*(the pitch PL of the left slider 860b)."

That is, if the pitch PL of the right slider 860a and the pitch PR of the left slider 860b are the same, the right slider 860a and the left slider 860b may have the same displacement, but have opposite directions.

Furthermore, if the initial locations of the right slider 860a and the left slider 860b are symmetrical to the symmetry axis "ys" of the motor assembly 810, the right slider 860a and the left slider 860b may become distant from each other while maintaining symmetry with respect to the symmetry axis "ys" of the motor assembly 810.

Figure 41:
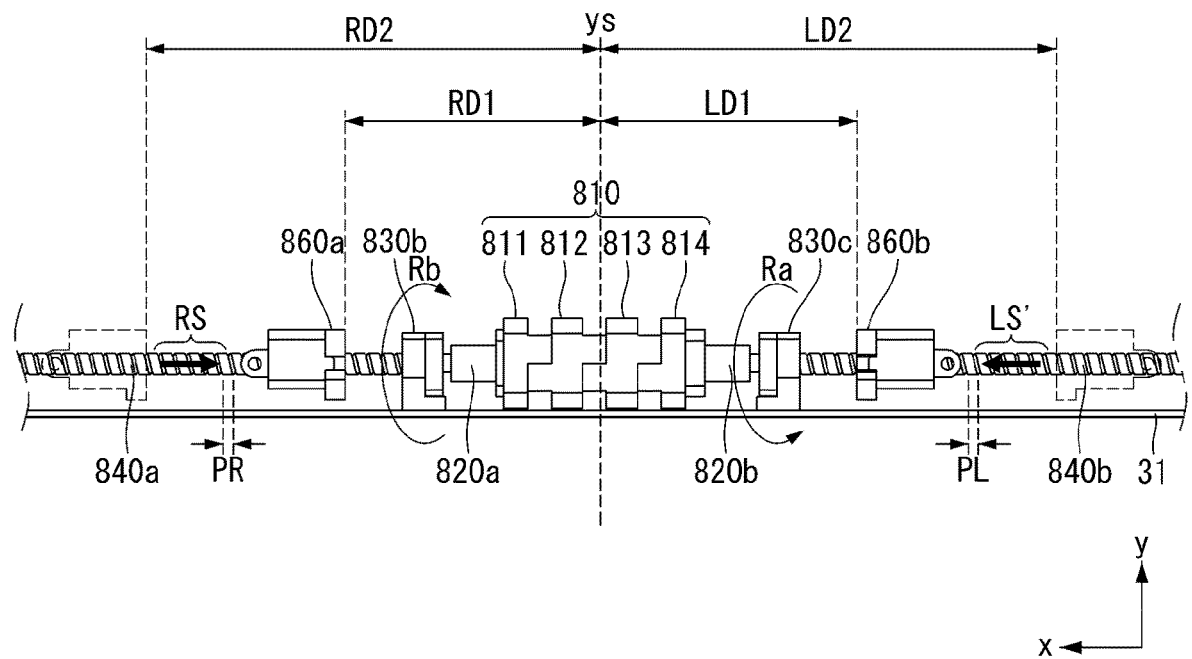
Figure 42:
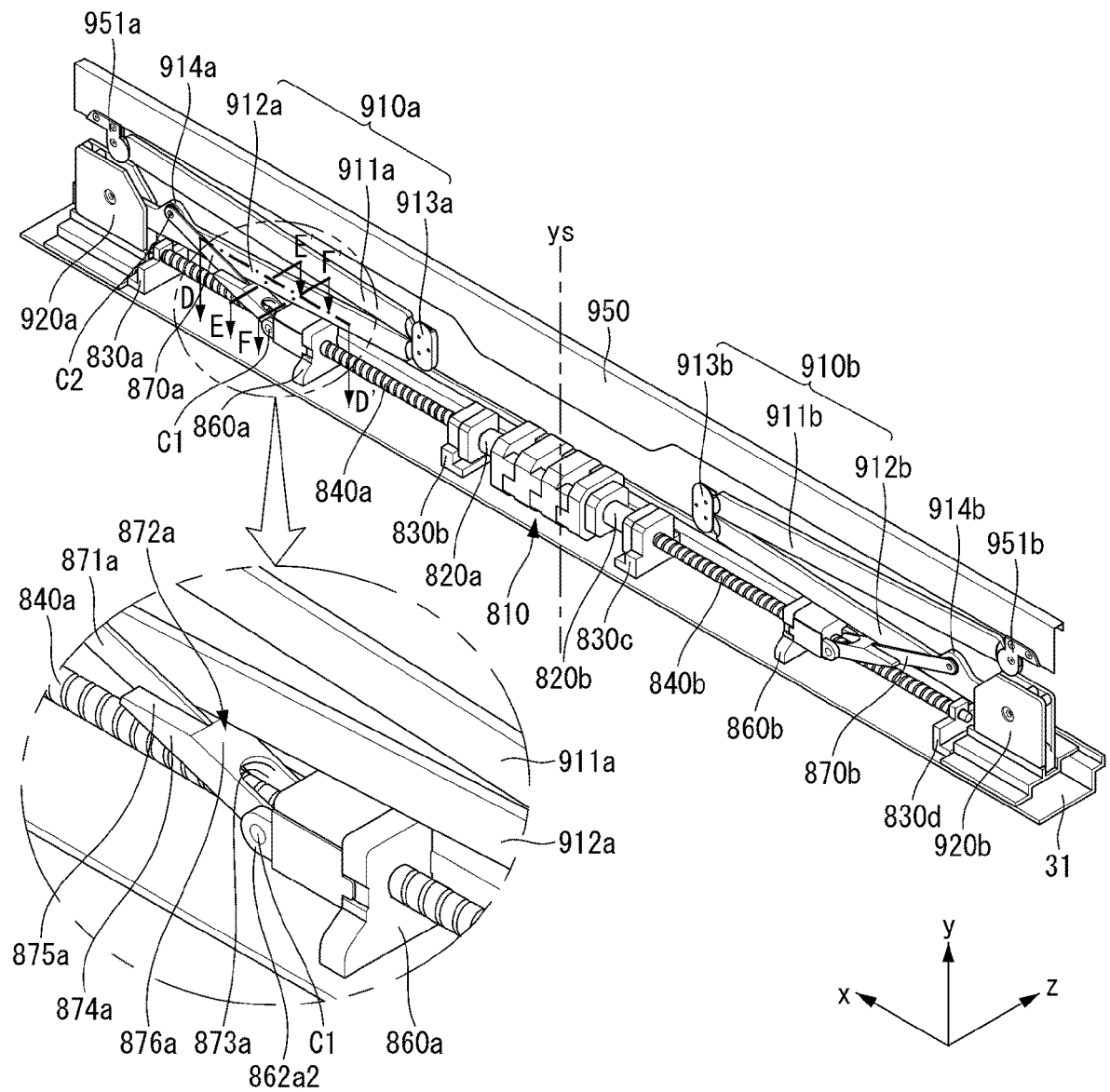

Referring to FIG. 41, the motor assembly 810 may make the right driving shaft Rb and the left driving shaft Ra have opposite rotating directions. The right slider 860a may move from the location where the right slider 860a has been spaced apart from the symmetry axis "ys" of the motor assembly 810 at the distance RD2 to the −x-axis direction as the right driving shaft rotates. When the right driving shaft rotates n times, the right slider 860a may be spaced apart from the symmetry axis "ys" of the motor assembly 810 at the distance RD1. In this case, the distance RD1 and the distance RD2 may have a difference corresponding to "(the number of revolutions n)*(the pitch PR of the right slider 860a)."

The left slider 860b may move from the location where the left slider 860b has been spaced apart from the symmetry axis "ys" of the motor assembly 810 at the distance LD2 to the +x-axis direction as the left driving shaft rotates. When the left driving shaft rotates n times, the left slider 860b may be spaced apart from the symmetry axis "ys" of the motor assembly 810 at the distance LD1. In this case, the distance LD1 and the distance LD2 may have a difference corresponding to "(the number of revolutions n)*(the pitch PL of the left slider 860b)."

That is, if the pitch PR of the right slider 860a and the pitch PL of the left slider 860b are the same, the right slider 860a and the left slider 860b may have the same displacement, but have opposite directions.

Furthermore, if the initial locations of the right slider 860a and the left slider 860b are symmetrical to the symmetry axis "ys" of the motor assembly 810, the right slider 860a and the left slider 860b may become close to each other while maintaining symmetry with respect to the symmetry axis "ys" of the motor assembly 810.

Referring to FIGS. 42 to 44B, link mounts 920a and 920b may be installed on the base 31. The link mounts 920a and 920b may include a right link mount 920a spaced apart from the first right bearing 830a to the right side and a left link mount 920b spaced apart from the second left bearing 830d to the left side.

Links 910a and 910b may be connected to the link mounts 920a and 920b. The links 910a and 910b may include a right link 910a connected to the right link mount 920a and a left link 910b connected to the left link mount 920b.

The right link 910a may also be referred to as a first link. The left link 910b may also be referred to as a second link. The right link mount 920a may also be referred to as a first link mount 920a. The left link mount 920b may also be referred to as a second link mount 920b.

The links 910a and 910b may include first arms 911a and 911b, second arms 912a and 912b, and arm joints 913a and 913b, respectively. One side of each of the second arms 912a and 912b may be pivotally connected to each of the link mounts 920a and 920b. The other side of each of the second arms 912a and 912b may be pivotally connected to each of the arm joints 913a and 913b. One side of each of the first arms 911a and 911b may be pivotally connected to each of the arm joints 913a and 913b. The other side of each of the first arms 911a and 911b may be pivotally connected to each of link brackets 951a and 951b.

The link brackets 951a and 951b may include a right link bracket 951a connected to the first arm 911a of the right link 910a and a left link bracket 951b connected to the first arm 911b of the left link 910b. The link brackets 951a and 951b may be connected to an upper bar 950.

The upper bar 950 may connect the right ink bracket 951a and the left link bracket 951b.

Rods 870a and 870b may connect the sliders 860a and 860b and the links 910a and 910b, respectively. One side of each of the rods 870a and 870b may be pivotally connected to each of the sliders 860a and 860b. The other side of each of the rods 870a and 870b may be pivotally connected to each of the second arms 912a and 912b. The rods 870a and 870b may include a right rod 870a that connects the right slider 860a and the second arm 912a of the right link 910a and a left rod 870b that connects the left slider 860b and the second arm 912b of the left link 910b. The right rod 870a may also be referred to as a first rod 870a. The left rod 870b may also be referred to as a second rod 870b.

More specifically, a structure formed by the right lead screw 840a, the right slider 860a, the right rod 870a, and the right link 910a is described. The right slider 860a may include a body 861a and a rod mount 862a. The screw thread SS may be formed in the inner circumferential surface of the body 861a. The screw thread formed in the body 861a may be engaged with the screw thread RS of the right lead screw 840a. The right lead screw 840a may penetrate the body 861a.

The rod mount 862a may be formed on the right side of the body 861a. The rod mount 862a may be pivotally connected to one side of the right rod 870a. The rod mount 862a may include a first rod mount 862a1 and a second rod mount 862a2. The first rod mount 862a1 may be disposed at the front of the right lead screw 840a. The second rod mount 862a2 may be disposed at the back of the right lead screw 840a. The first rod mount 862a1 and the second rod mount 862a2 may be spaced apart from each other. The second rod mount 862a2 may be spaced apart from the first rod mount 862a1 to the −z-axis direction. The right lead screw 840a may be located between the first rod mount 862a1 and the second rod mount 862a2.

The rod mount 862a may be pivotally connected to one side of the rod 870a through a connecting member C1. The connecting member C1 may penetrate the rod mount 862a and the right rod 870a.

The right rod 870a may be pivotally connected to the second arm 912a through a connecting member C2. The connecting member C2 may penetrate the second arm 912a and the right rod 870a.

The right rod 870a may include a transfer portion 871a connected to the second arm 912a of the right link 910a and a cover 872a connected to the rod mount 862a of the right slider 860a. The transfer portion 871a may transfer a force, generated when the right slider 860a advances or retreats along the right lead screw 840a, to the right link 910a.

The cover 872a may include a first plate 873a disposed at the front of the right lead screw 840a. The first plate 873a may be disposed in a direction vertical to the base 31. Alternatively, the first plate 873a may face the right lead screw 840a.

The cover 872a may include a second plate 874a disposed at the back of the right lead screw 840a. The second plate 874a may be disposed in a direction vertical to the base 31. Alternatively, the second plate 874a may face the right lead screw 840a. Alternatively, the second plate 874a may be spaced apart from the first plate 873a. The right lead screw 840a may be located between the first plate 873a and the second plate 874a.

The cover 872a may include a third plate 875a that connects the first plate 873a and the second plate 874a. The third plate 875a may be connected to the transfer portion. The third plate 875a may be located over the right lead screw 840a.

The cover 872a may include a fourth plate 876a that connects the first plate 873a and the second plate 874a. The fourth plate 876a may be connected to the third plate 875a. The fourth plate 876a may be located over the right lead screw 840a.

One side of the first plate 873a may be connected to the first rod mount 862a1. The first plate 873a and the first rod mount 862a1 may be connected through a connecting member C1'. The other side of the first plate 873a may be connected to the third plate 875a.

One side of the second plate 874a may be connected to the second rod mount 862a2. The second plate 874a and the second rod mount 862a2 may be connected through the connecting member C1. The other side of the second plate 874a may be connected to the third plate 875a.

When the right slider 860a moves close to the motor assembly 810, the right lead screw 840a and the right rod 870a may come into contact with each other. When the right lead screw 840a and the right rod 870a come into contact with each other, interference may be generated therebetween and thus a movement of the right slider 860a may be limited.

The cover 872a may provide a space S1 therein. The first plate 873a, the second plate 874a, the third plate 875a, and the fourth plate 876a may form the space S1. When the right slider 860a moves close to the motor assembly 810, the right lead screw 840a may be accommodated or escaped into the space S1 provided by the cover 872a. The right slider 860a may move close to the motor assembly 810 due to the space S1 provided by the cover 872a, compared to a case where the cover 872a is not present. That is, a movable range of the right slider 860a can be increased because the cover 872a provides the space S1 therein. Furthermore, there is an advantage in that the size of the housing 30 (refer to FIG. 2) can be reduced because the right lead screw 840a is accommodated in the cover 872a.

Furthermore, the cover 872a may limit a minimum value of an angle "theta S" formed by the second arm 912a and the base 31. When the angle "theta S" is sufficiently small, the third plate 875a of the cover 872a may come into contact with the second arm 912a and support the second arm 912a. Since the third plate 875a supports the second arm 912a, a minimum value of the angle "theta S" can be limited and the sagging of the second arm 912a can be prevented. That is, the cover 872a may play the role of a stopper to prevent the sagging of the second arm 912a. Furthermore, since the third plate 875a limits a minimum value of the angle "theta S", an initial load for standing the second arm 912a can be reduced.

The lead screws 840a and 840b may be driven by the single motor assembly 810. Since the lead screws 840a and 840b are driven by the single motor assembly 810, the second arms 912a and 912b can stand up while forming symmetry. If the lead screws 840a and 840b are driven by the single motor assembly 810, however, a load applied to the motor assembly 810 to stand the second arms 912a and 912b may be excessively increased. In this case, the third plate 875a may limit a minimum value of the angle "theta S", thereby being capable of reducing a load applied to the motor assembly 810 in order to stand the second arms 912a and 912b.

A structure formed by the left lead screw 840b, the left slider 860b, the left rod 870b, and the left link 910b may be symmetrical to the structure formed by the right lead screw 840a, the right slider 860a, the right rod 870a, and the right link 910a. In this case, the symmetry axis may be the symmetry axis "ys" of the motor assembly 810.

In the present disclosure, the disclosed structure to raise and lower the flexible display may be referred to herein as a lift assembly. The lift assembly may include various components including lever assemblies. The lever assemblies may include various components including a plurality of arms in linkage with each other and may be provided in plurality, e.g., on the left and right sides.

Figure 45:
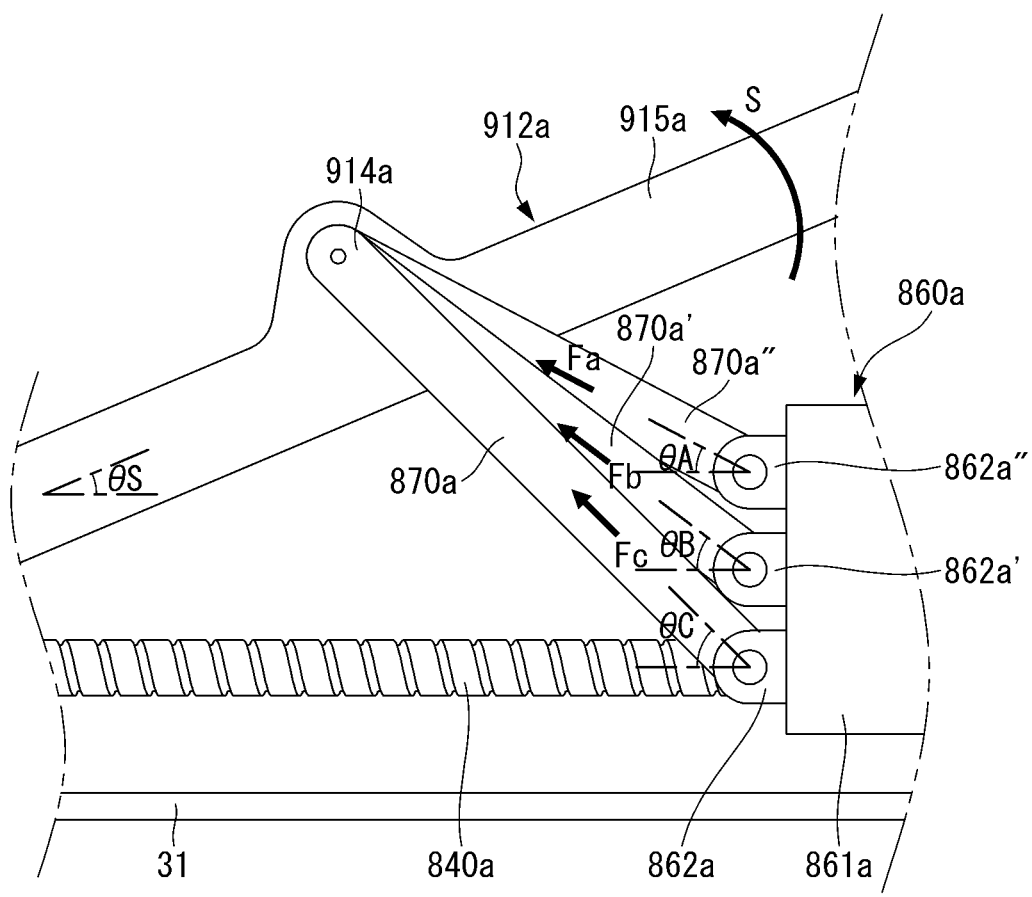
Figure 46:
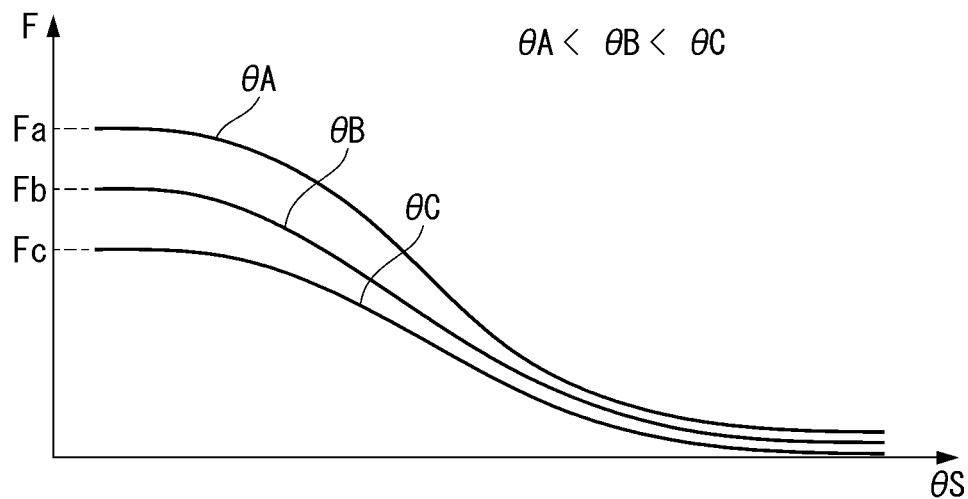

FIGS. 45 and 46 are diagrams showing that the right rod 870a has been connected to a protruding portion 914a. The protruding portion 914a may also be referred to as a connecting portion 914a.

An angle formed by the right rod 870a and the base 31 may be different depending on the location of the connecting portion. An angle formed by the second arm 912a and the base 31 may be called an angle "theta S". If the right slider 860a is located close to the motor assembly 810 within its movable range, the second arm 912a may be said to be the state in which it has fully lain down with respect to the base 31. If the second arm 912a has fully lain down with respect to the base 31, the angle "theta S" may have a minimum value. For example, if the second arm 912a has fully lain down with respect to the base 31, the angle "theta S" may have a value close to 0 degree.

When the right slider 860a moves to the +x-axis direction, the angle "theta S" may gradually increase. Alternatively, when the right slider 860a moves to the +x-axis direction, it may be said that the second arm 912a stands up with respect to the base 31. Alternatively, if the angle "theta S" gradually increases, it may be said that the second arm 912a stands up with respect to the base 31.

If the right slider 860a is located farthest from the motor assembly 810 within the movable range, it may be said that the second arm 912a has fully stood up with respect to the base 31. If the second arm 912a has fully stood up with respect to the base 31, the angle "theta S" may have a maximum value. For example, if the second arm 912a has fully stood up with respect to the base 31, the second arm 912a may be vertical to the base 31. Alternatively, if the second arm 912a has fully stood up with respect to the base 31, an angle formed by the base 31 may have a value close to 90 degrees.

The direction in which an angle "theta S" formed by the second arm 912a of the right link 910a and the base 31 increases may be called a standing direction S. Alternatively, the direction in which an angle formed by the second arm 912a of the left link 910b and the base 31 increases may be called a standing direction S.

If a rod mount 862a" is located over the body 861a, an angle formed by a right rod 870a" and the base 31 may be called an angle "theta A", and a minimum force that is necessary for the right rod 870a" to stand the second arm 912a may be called Fa.

If a rod mount 862a" is located in the middle height of the body 861a, an angle formed by the right rod 870a" and the base 31 may be called "theta B", and a minimum force that is necessary for the right rod 870a" to stand the second arm 912a may be called Fb.

If the rod mount 862a' is located on the lower side of the body 861a, an angle formed by the right rod 870a and the base 31 may be called "theta C", and a minimum force that is necessary for the right rod 870a to stand the second arm 912a may be called Fc.

In this case, a relation "theta A<theta B<theta B" may be established with respect to the same angle "theta S." Furthermore, a relation "Fc<Fb<Fa" may be established with respect to the same angle "theta S."

That is, if the second arm 912a and the base 31 form the same angle, a force required to stand the second arm 912a may be reduced as an angle formed by the right rod 870a and the base 31 increases.

The cover 872a (refer to FIG. 43) of the right rod 870a may provide the space S1 (refer to FIG. 43) in which the right lead screw 840a can be accommodated, so the rod mount 862a can be coupled close to the lower side of the body 861b or the right lead screw 840a.

The lead screws 840a and 840b may be driven by the single motor assembly 810. Since the lead screws 840a and 840b are driven by the single motor assembly 810, the second arms 912a and 912b can stand up while forming symmetry. If lead screws 840a and 840b are driven by the single motor assembly 810, however, a load applied to the motor assembly 810 in order to stand the second arms 912a and 912b may be excessively increased. In this case, a load applied to the motor assembly 810 in order to stand the second arm 912a can be reduced by increasing the angle formed by the right rod 870a and the base 31.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this case, the symmetry axis may be the symmetry axis "ys" of the motor assembly 810.

Figure 47:
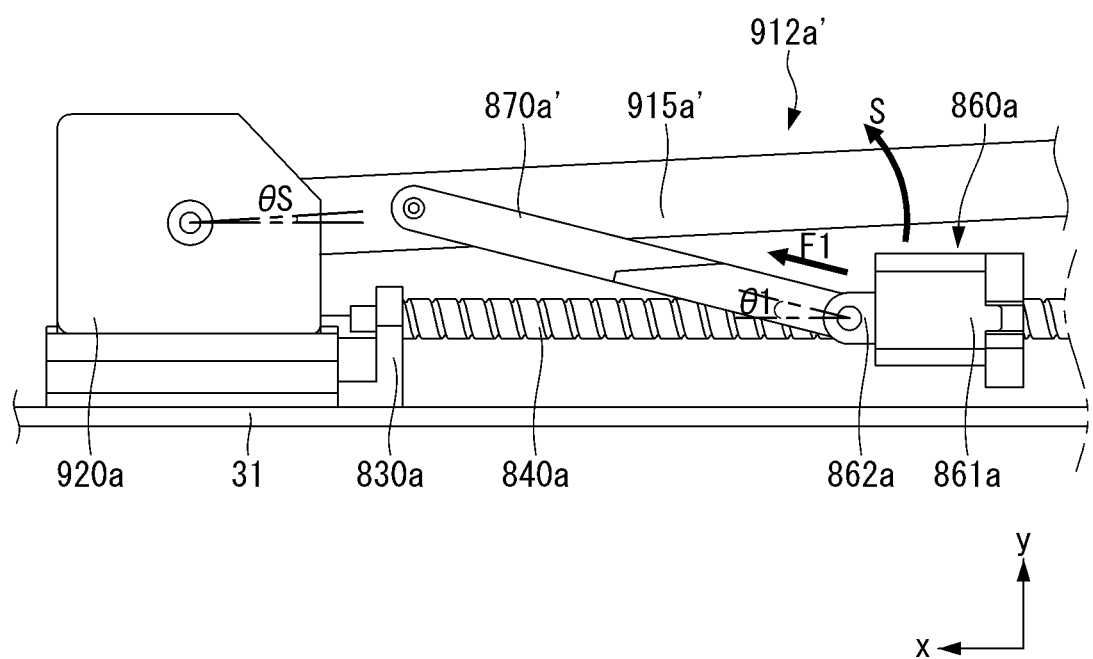
Figure 48:
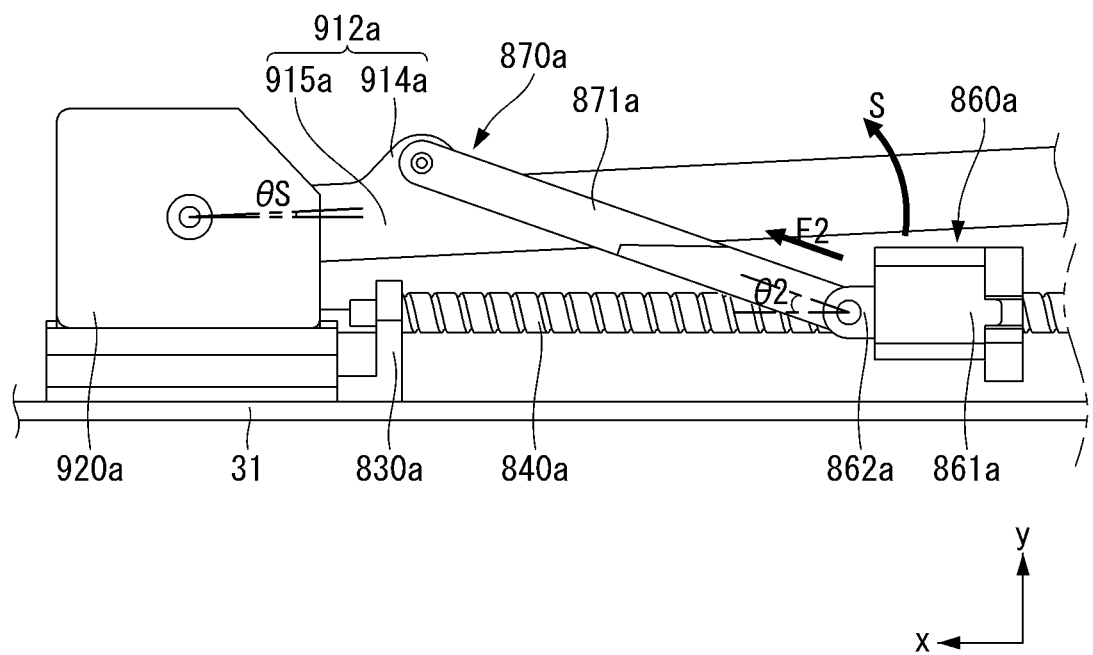
Figure 49:
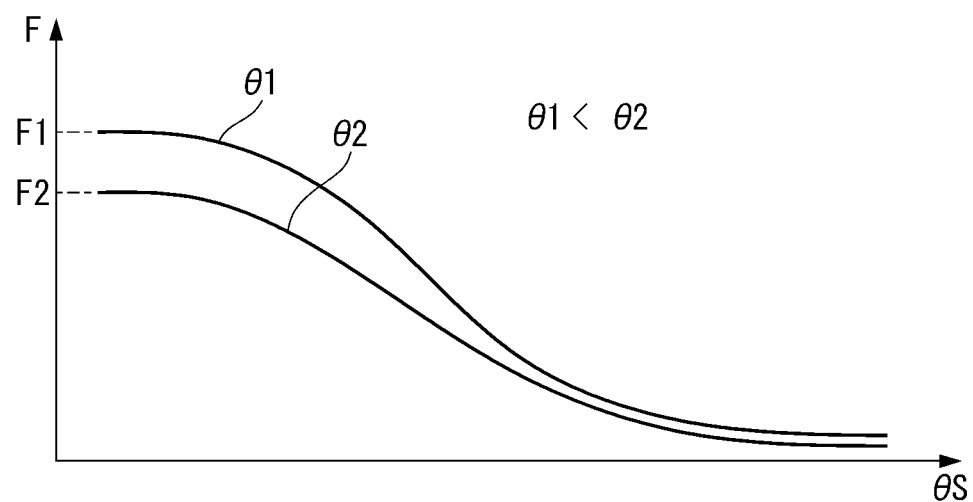

Referring to FIGS. 47 to 49, the second arm 912a and 912a' may include a bar 915a and 915a' and a protruding portion 914a. FIG. 47 is a diagram showing that the right rod 870a' has been connected to the bar 915a'. FIG. 48 is a diagram showing that the right rod 870a has been connected to the protruding portion 914a. The protruding portion 914a may also be referred to as a connecting portion 914a.

An angle formed by the second arm 912a and 912a' and the base 31 may be called "theta S. " If the right slider 860a is located closest to the motor assembly 810 within its movable range, it may be said to be the state in which the second arm 912a and 912a' has fully lain down with respect to the base 31. If the second arm 912a has fully lain down with respect to the base 31, the angle "theta S" may have a minimum value. For example, if the second arm 912a and 912a' has fully lain down with respect to the base 31, the angle "theta S" may have a value close to 0 degree.

When the right slider 860a moves to the +x-axis direction, the angle "theta S" may gradually increase. Alternatively, when the right slider 860a moves to the +x-axis direction, it may be said that the second arm 912a and 912a' stands up with respect to the base 31. Alternatively, when the angle "theta S" gradually increases, it may be said that the second arm 912a stands up with respect to the base 31.

If the right slider 860a is located farthest from the motor assembly 810 within the movable range, it may be said that the second arm 912a and 912a' has fully stood up with respect to the base 31. If the second arm 912a has fully stood up with respect to the base 31, the angle "theta S" may have a maximum value. For example, if the second arm 912a and 912a' has fully stood up with respect to the base 31, the second arm 912a and 912a' may be vertical to the base 31. Alternatively, if the second arm 912a and 912a' has fully stood up with respect to the base 31, an angle formed by the base 31 may have a value close to 90 degrees.

The direction in which the angle "theta S" formed by the second arm 912a and 912a' of the right link 910a and the base 31 increases may be called a standing direction S. Alternatively, the direction in which the angle formed by the second arm 912a of the left link 910b and the base 31 increases may be called a standing direction S.

Referring to FIG. 47, an angle formed by the right rod 870a and the right lead screw 840a may be called "theta 1." If the second arm 912a' has fully lain down with respect to the base 31, the angle "theta 1" may have a minimum value.

In order to stand the second arm 912a', the motor assembly 810 may rotate the driving shaft. When the driving shaft rotates, the right slider 860a may move to the +x-axis direction. The right slider 860a may apply a force to the right rod 870a', and the rod 870a' may transfer the force to the bar 915a' of the second arm 912a'. The second arm 912a' may receive the force from the right rod 870a' and rotate to the standing direction S. When the right link 910a (refer to FIG. 42) stands up, the angle "theta S" and the angle "theta 1" may increase.

If the second arm 912a' has fully lain down with respect to the base 31, a minimum force for standing the second arm 912a' may be called F1. That is, the minimum force F1 may mean a minimum force that needs to be transferred from the right rod 870a' to the bar 915a' of the second arm 912a' in order to stand the second arm 912a'.

Referring to FIG. 48, an angle formed by the right rod 870a and the right lead screw 840a may be called "theta 2." If the second arm 912a has fully lain down with respect to the base 31, the angle "theta 2" may have a minimum value.

In order to stand the second arm 912a, the motor assembly 810 may rotate the driving shaft. When the driving shaft rotates, the right slider 860a may move to the +x-axis direction and the left slider 860b may move to the −x-axis direction. The sliders 860a and 860b may apply a force to the rods 870a and 870b, and the rods 870a and 870b may transfer the force to the bar 915a of the second arm 912a. The second arm 912a may receive the force from the rods 870a and 870b and rotate to the standing direction S. When the links 910a and 910b stand up, the angle "theta S" and the angle "theta 2" may increase.

If the second arm 912a has fully lain down with respect to the base 31, a minimum force for standing the second arm 912a may be called F2. That is, the minimum force F2 may mean a minimum force that needs to be transferred from the right rod 870a to the bar 915a of the second arm 912a in order to stand the second arm 912a.

The case where the right rod 870a' is connected to the bar 915a' of the second arm 912a' and the case where the right rod 870a is connected to the protruding portion 914a of the second arm 912a are compared with each other with reference to FIGS. 47 and 48. If an angle "theta S" formed by the second arm 912a and 912a' and the base 31 is the same, an angle "theta 2" formed by the right lead screw 840a and the right rod 870a connected to the protruding portion 914a of the second arm 912a may be greater than an angle "theta 1" formed by the right lead screw 840a and the right rod 870a' connected to the bar 915a' of the second arm 912a'.

Furthermore, if an angle "theta S" formed by the second arm 912a and 912a' and the base 31 is the same, the force F1 necessary to stand the second arm 912a' if the right rod 870a' has been connected to the bar 915a' of the second arm 912a' may be greater than the force F2 necessary to stand the second arm 912a if the right rod 870a has been connected to the protruding portion 914a of the second arm 912a.

That is, if an angle formed by the second arm 912a and 912a' and the base 31 is the same, a force required to stand the second arm 912a and 912a' may be reduced as an angle formed by the right rod 870a, 870a' and the right lead screw 840a increases. Alternatively, since the right rod 870a is connected to the protruding portion 914a, the second arm 912a can be stood up by a small force compared to a case where the right rod 870a' is connected to the bar 915a'.

The lead screws 840a and 840b may be driven by the single motor assembly 810. Since the lead screws 840a and 840b are driven by the single motor assembly 810, the second arms 912a and 912b can stand up while forming symmetry. If the lead screws 840a and 840b are driven by the single motor assembly 810, however, a load applied to the motor assembly 810 in order to stand the second arms 912a and 912b may be excessively increased. In this case, since the right rod 870a is connected to the protruding portion 914a of the second arm 912a, an angle formed by the right rod 870a and the base 31 may be increased. A load applied to the motor assembly 810 may be reduced in order to stand the second arm 912a.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this case, the symmetry axis may be the symmetry axis "ys" of the motor assembly 810.

Figure 50:
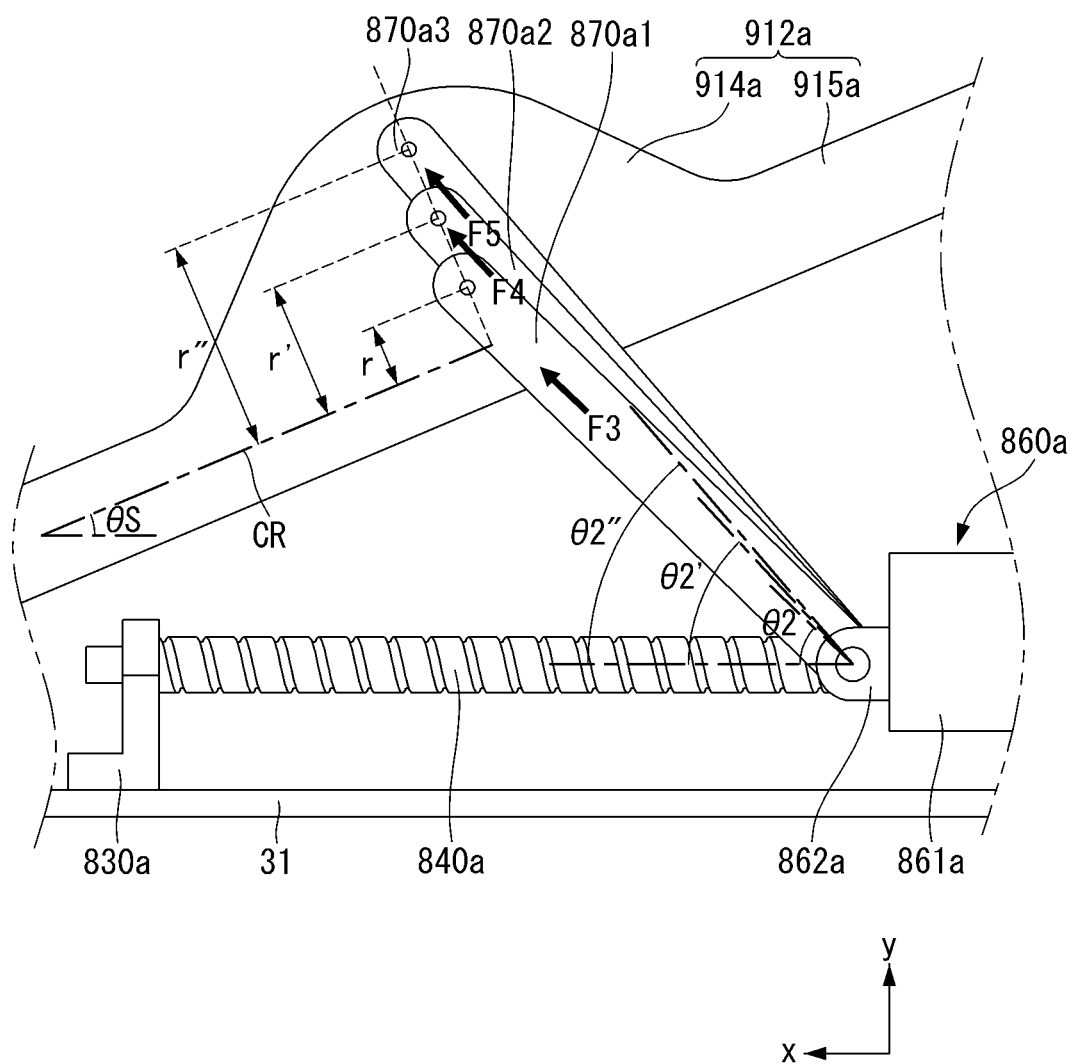
Figure 51:
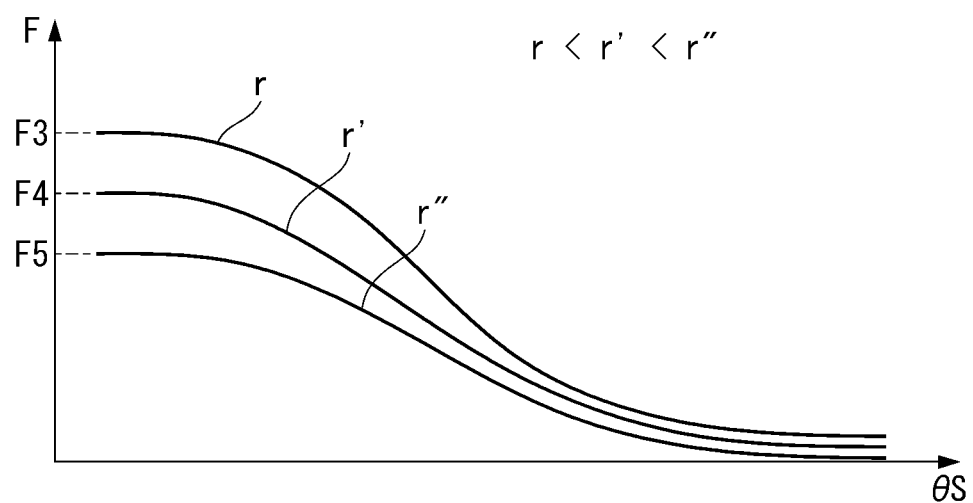

FIGS. 50 and 51 are diagrams showing that the right rod 870a has been connected to the protruding portion 914a. The protruding portion 914a may also be referred to as a connecting portion 914a.

An angle formed by the right rod 870a and the base 31 may be different depending on the location where the protruding portion 914a and the right rod 870a are connected. An angle formed by the second arm 912a and the base 31 may be called "theta S." If the right slider 860a is located closest to the motor assembly 810 within its movable range, it may be said to be the state in which the second arm 912a has fully lain down with respect to the base 31. If the second arm 912a has fully lain down with respect to the base 31, the angle "theta S" may have a minimum value. For example, if the second arm 912a has fully lain down with respect to the base 31, the angle "theta S" may have a value close to 0 degree.

When the right slider 860a moves to the +x-axis direction, the angle "theta S" may gradually increase. Alternatively, when the right slider 860a moves to the +x-axis direction, it may be said that the second arm 912a stands up with respect to the base 31. Alternatively, when the angle "theta S" gradually increases, it may be said that the second arm 912a stands up with respect to the base 31.

If the right slider 860a is located farthest from the motor assembly 810 within the movable range, it may be said to be the state in which the second arm 912a has fully stood up with respect to the base 31. If the second arm 912a has fully stood up with respect to the base 31, the angle "theta S" may have a maximum value. For example, if the second arm 912a has fully stood up with respect to the base 31, the second arm 912a may be vertical to the base 31. Alternatively, if the second arm 912a has fully stood up with respect to the base 31, an angle formed by the base 31 may have a value close to 90 degrees.

The direction in which the angle "theta S" formed by the second arm 912a of the right link 910a and the base 31 increases may be called a standing direction S. Alternatively, the direction in which the angle formed by the second arm 912a of the left link 910b and the base 31 increases may be called a standing direction S.

If a right rod 870a1 and the protruding portion 914a are coupled together at a distance "r" from the central axis CR of the second arm 912a, an angle formed by the right rod 870a1 and the base 31 may be called "theta 2", and a minimum force that is necessary for the right rod 870a1 to stand the second arm 912a may be called F3.

If a right rod 870a2 and the protruding portion 914a are coupled together at a distance r' from the central axis CR of the second arm 912a, an angle formed by the right rod 870a2 and the base 31 may be called theta 2', and a minimum force that is necessary for the right rod 870a2 to stand the second arm 912a may be called F4.

If a right rod 870a3 and the protruding portion 914a are coupled together at a distance r" from the central axis CR of the second arm 912a, an angle formed by the right rod 870a3 and the base 31 may be called theta 2", and a minimum force that is necessary for the right rod 870a3 to stand the second arm 912a may be called F5.

In this case, a relation "theta 2 <theta 2'<theta 2'"" may be established with respect to the same angle "theta S." Furthermore, a relation "F5<F4<F3" may be established with respect to the same angle "theta S."

That is, if an angle formed by the second arm 912a and the base 31 is the same, a force required to stand the second arm 912a may be decreased as an angle formed by the right rod 870a and the base 31 increases.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this case, the symmetry axis may be the symmetry axis "ys" of the motor assembly 810.

Figure 52:
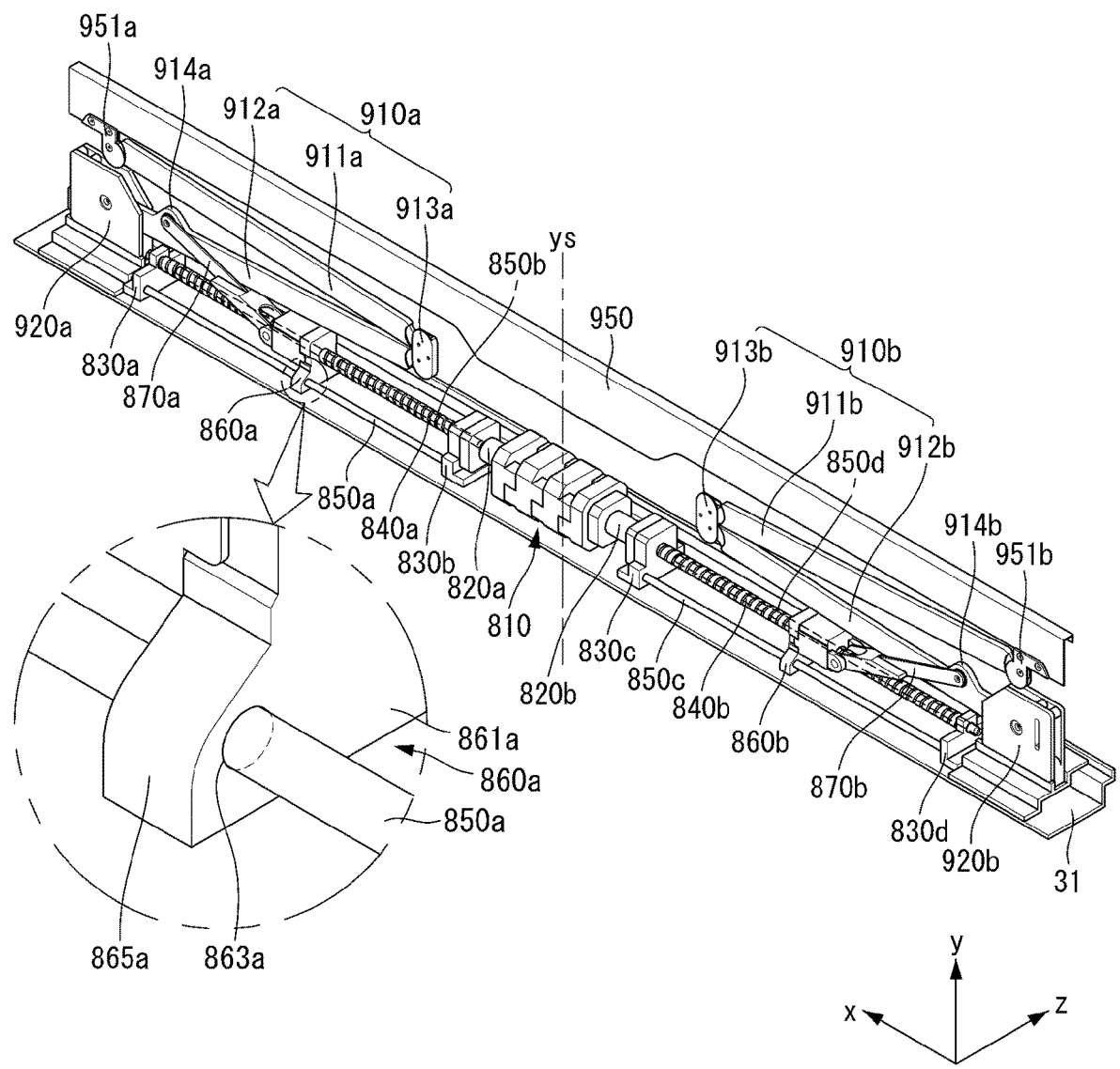

Referring to FIG. 52, a guide 850a, 850b, 850c, and 850d may be connected to a bearing 830a, 830b, 830c, and 830d. The guide 850a, 850b, 850c, and 850d may include right guides 850a and 850b disposed on the right side of the motor assembly 810 and left guides 850c and 850d disposed on the left side of the motor assembly 810.

The right guide 850a and 850b may have one side connected to the first right bearing 830a and the other side connected to the second right bearing 830b. The right guide 850a and 850b may be located in parallel to the right lead screw 840a. Alternatively, the right guide 850a and 850b may be spaced apart from the right lead screw 840a.

The right guide 850a and 850b may include a first right guide 850a and a second right guide 850b. The first right guide 850a and the second right guide 850b may be spaced apart from each other. The right lead screw 840a may be located between the first right guide 850a and the second right guide 850b.

The right slider 860a may include a protruding portion. Alternatively, the display device may include a protruding portion formed in the right slider 860a. The protruding portion may be formed in the body of the slider. The protruding portion may include a front protruding portion that protrudes from the body 861a of the right slider 860a to the +z-axis direction and a back protruding portion 865a that protrudes from the body of the slider to the −z-axis direction.

The first right guide 850a may penetrate the back protruding portion 865a. Alternatively, a first hole 863a may be formed in the back protruding portion, and the first right guide 850a may pass through the first hole 863a. The first hole 863a may be formed in the x-axis direction. The first hole 863a may also be referred to as a hole 863a.

The second right guide may penetrate the front protruding portion. Alternatively, a second hole may be formed in the front protruding portion, and the second right guide may penetrate the second hole. The second hole may be formed in the x-axis direction.

The right guides 850a and 850b may guide the right slider 860a so that it moves more stably when the right slider 860a advances or retreats along the right lead screw 840a. Since the right guides 850a and 850b stably guide the right slider 860a, the right slider 860a may advance or retreat along the right lead screw 840a without rotating with respect to the right lead screw 840a.

A structure formed by the left guides 850c and 850d, the left bearings 830a, 830b, 830c, and 830d, the left slider 860b, and the left lead screw 840b may be symmetrical to the structure formed by the right guides 850a and 850b, the right bearings 830a, 830b, 830c, and 830d, the right slider 860a, and the right lead screw 840a. In this case, the symmetry axis may be the symmetry axis "ys" of the motor assembly 810.

Figure 53:
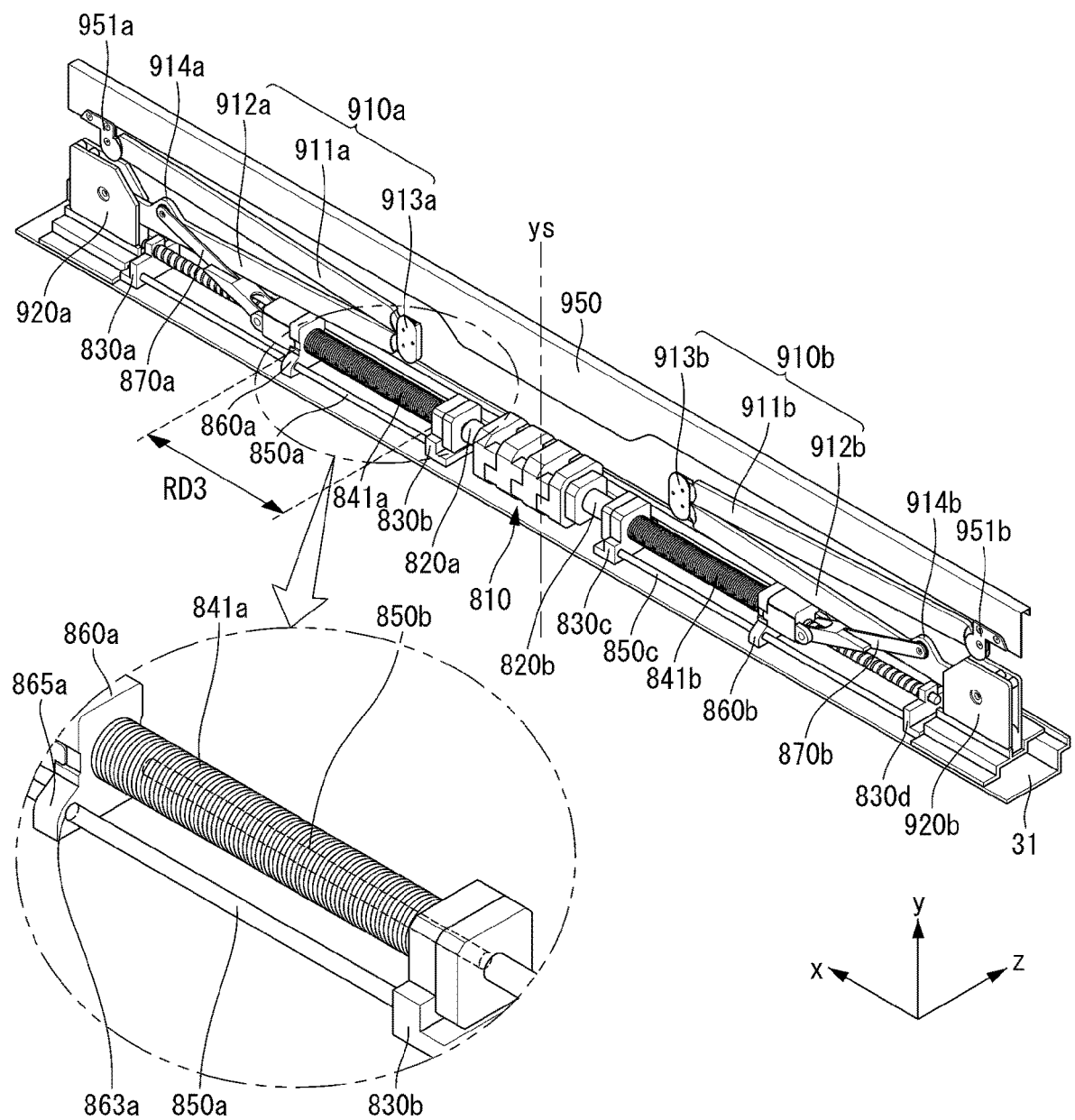

Referring to FIG. 53, first springs 841a and 841b may be inserted into the lead screws 840a and 840b. Alternatively, the lead screws 840a and 840b may penetrate the first springs 841a and 841b. The first springs 841a and 841b may include a first right spring 841a disposed on the right side of the motor assembly 810 and a first left spring 841b disposed on the left side of the motor assembly 810.

The first right spring 841a may be disposed between the right slider 860a and the second right bearing 830b. One end of the first right spring 841a may be brought into contact with or separated from the right slider 860a, The other end of the first right spring 841a may be brought into contact with or separated from the second right bearing 830b.

If the second arm 912a has fully lain down with respect to the base 31, the distance between the right slider 860a and the second right bearing 830b may be a distance RD3. The first right spring 841a may have a longer length than the distance RD3 in the state in which the first right spring 841a has not been compressed or extended. Accordingly, if the second arm 912a has fully lain down with respect to the base 31, the first right spring 841a may be compressed between the right slider 860a and the second right bearing 830b. Furthermore, the first right spring 841a may provide a restoring force to the right slider 860a in the +x-axis direction.

If the second arm 912a changes from the state in which it has fully lain down with respect to the base 31 to the standing state, a restoring force provided by the first right spring 841a may assist the second arm 912a to stand up. A load of the motor assembly 810 can be reduced because the first right spring 841a assists the second arm 912a to stand up.

The lead screws 840a and 840b may be driven by the single motor assembly 810. Since the lead screws 840a and 840b are driven by the single motor assembly 810, the second arms 912a and 912b can stand up while forming symmetry. If the lead screws 840a and 840b are driven by the single motor assembly 810, however, a load applied to the motor assembly 810 in order to stand the second arms 912a and 912b may be excessively increased. In this case, since the first right spring 841a assists the second arm 912a to stand up, a load of the motor assembly 810 can be reduced and a load applied to the motor assembly 810 in order to stand the second arm 912a can be reduced.

Alternatively, if the second arm 912a changes from the state in which hit has stood up with respect to the base 31 to the state in which it has fully lain down, a restoring force provided by the first right spring 841a can reduce an impact generated when the second arm 912a lies down with respect to the base 31. That is, when the second arm 912a lies down with respect to the base 31, the first right spring 841a plays the role of a damper. A load of the motor assembly 810 can be reduced because the first right spring 841a plays the role of a damper.

A structure formed by the first left spring 841b, the left bearings 830a, 830b, 830c, and 830d, the left slider 860b, the left lead screw 840b, and the second arm 912a may be symmetrical to the structure formed by the first right spring 841a, the right bearings 830a, 830b, 830c, and 830d, the right slider 860a, the right lead screw 840a, and the second arm 912a. In this case, the symmetry axis may be the symmetry axis "ys" of the motor assembly 810.

Figure 54:
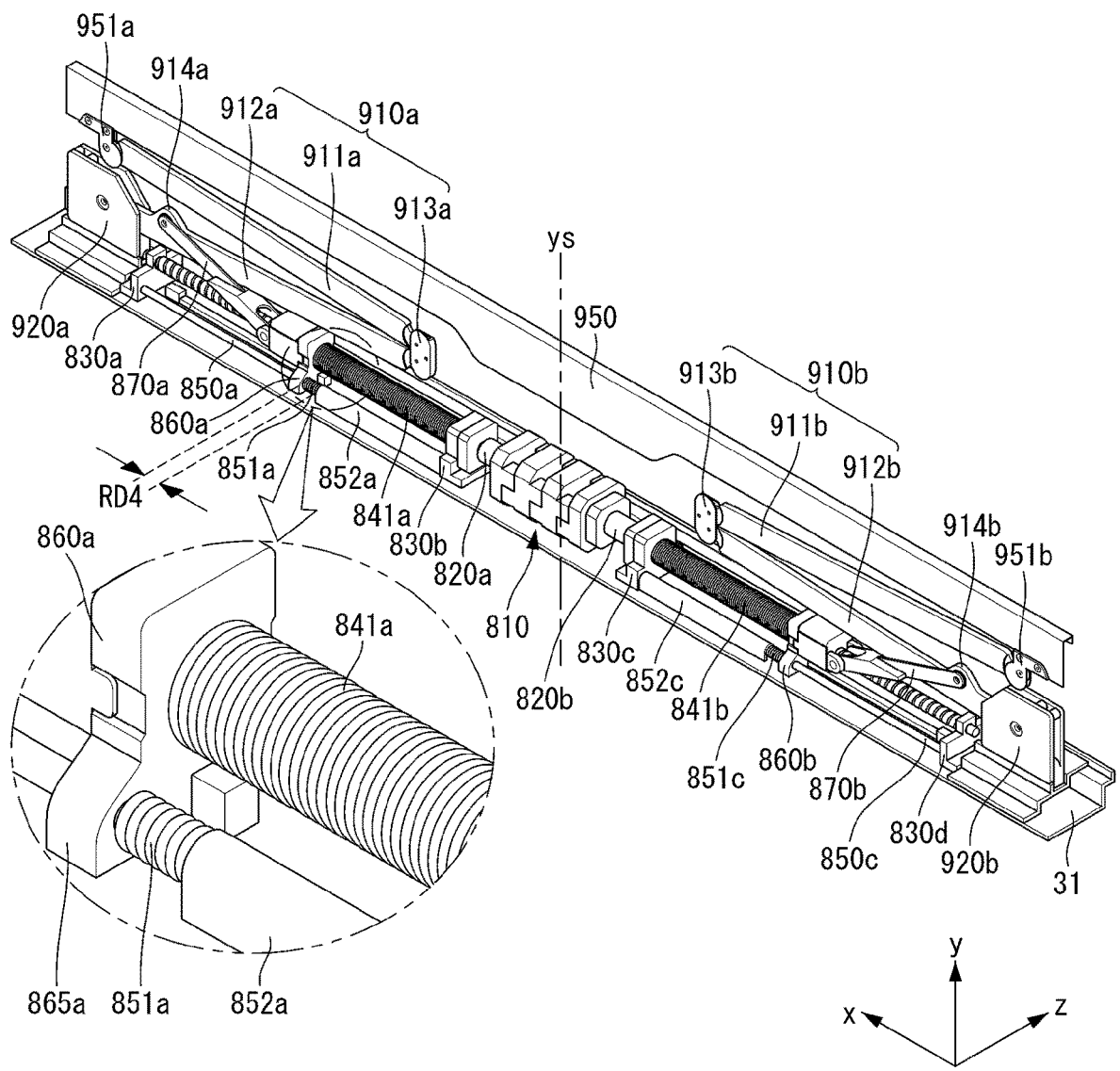

Referring to FIG. 54, second springs 851a and 851b may be inserted into the guides 850a, 850b, 850c, and 850d. Alternatively, the guides 850a, 850b, 850c, and 850d may penetrate the second springs 851a and 851b. The second springs 851a and 851b may include a second right spring 851a disposed on the right side of the motor assembly 810 and a second left spring 851b disposed on the left side of the motor assembly 810.

A plurality of the second right springs 851a may be formed. The second right spring 851a may include springs 940a and 940b inserted into the first right guide 850a and springs 940a and 940b inserted into the second right guide 850b. Alternatively, the second right spring 851a may include springs 940a and 940b through which the first right guide 850a penetrates and springs 940a and 940b through which the second right guide 850b penetrates.

The guides 850a, 850b, 850c, and 850d may include locking protrusions 852a and 852b. The locking protrusions 852a and 852b may include a right locking protrusion 852a disposed on the right side of the motor assembly 810 and a left locking protrusion 852b disposed on the left side of the motor assembly 810.

The right locking protrusion 852a may be disposed between the right slider 860a and the second right bearing 830b. Furthermore, the second right spring 851a may be disposed between the right slider 860a and the second right bearing 830b. One end of the second right spring 851a may be brought into contact with or separated from the right slider 860a. The other end of the second right spring 851a may be brought into contact with or separated from the right locking protrusion 852a.

If the second arm 912a has fully lain down with respect to the base 31, the distance between the right slider 860a and the right locking protrusion 852a may be a distance RD4. The second right spring 851a may have a length greater than the distance RD4 in the state in which it has not been compressed or extended. Accordingly, if the second arm 912a has fully lain down with respect to the base 31, the second right spring 851a may be compressed between the right slider 860a and the right locking protrusion 852a. Furthermore, the second right spring 851a may provide a restoring force to the right slider 860a in the +x-axis direction.

If the second arm 912a changes from the state in which it has fully lain down with respect to the base 31 to the standing state, a restoring force provided by the second right spring 851a may assist the second arm 912a to stand up. A load of the motor assembly 810 can be reduced because the second right spring 851a assists the second arm 912a to stand up.

The lead screws 840a and 840b may be driven by the single motor assembly 810. Since the lead screws 840a and 840b are driven by the single motor assembly 810, the second arms 912a and 912b can stand up while forming symmetry. If the lead screws 840a and 840b are driven by the single motor assembly 810, however, a load applied to the motor assembly 810 in order to stand the second arms 912a and 912b may be excessively increased. In this case, since the second right spring 851a assists the second arm 912a to stand up, a load of the motor assembly 810 can be reduced and a load applied to the motor assembly 810 in order to stand the second arm 912a can be reduced.

Alternatively, if the second arm 912a changes from the state in which it has fully stood up with respect to the base 31 to the state in which it has fully lain down, a restoring force provided by the second right spring 851a can reduce an impact generated when the second arm 912a lies down with respect to the base 31. That is, when the second arm 912a lies down with respect to the base 31, the second right spring 851a plays the role of a damper. A load of the motor assembly 810 can be reduced because the second right spring 851a plays the role of a damper.

A structure formed by the second left spring 851b, the left locking protrusion 852b, the left slider 860b, the left guides 850c and 850d, and the second arm 912a may be symmetrical to the structure formed by the second right spring 851a, the right locking protrusion 852a, the right slider 860a, the right guides 850a and 850b, and the second arm 912a. In this case, the symmetry axis may be the symmetry axis "ys" of the motor assembly 810.

Figure 55:
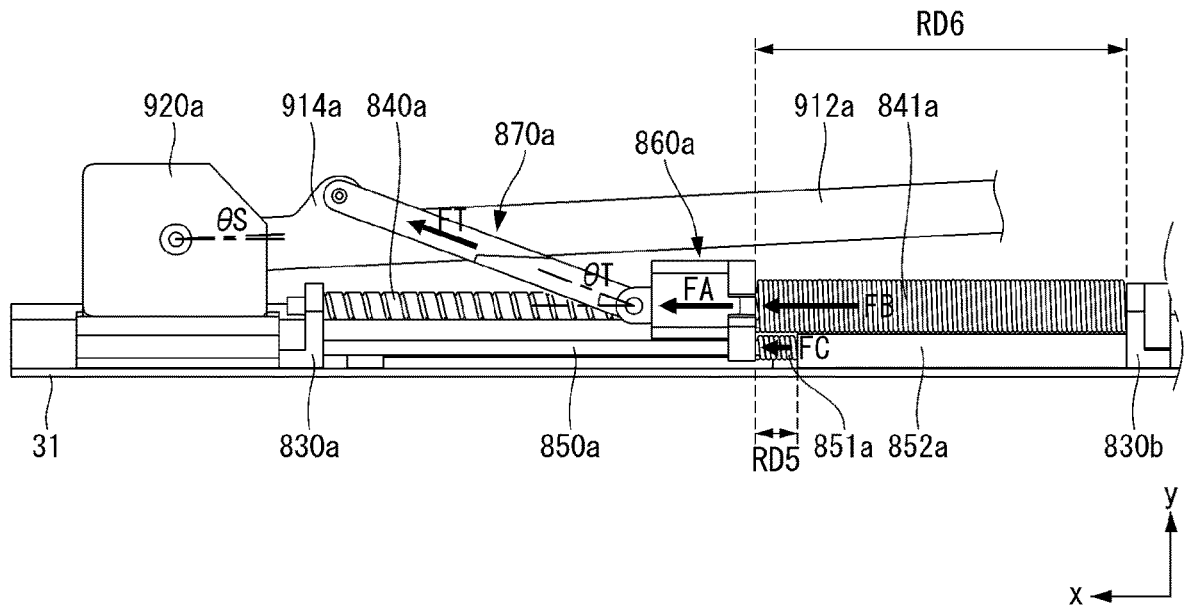
Figure 56:
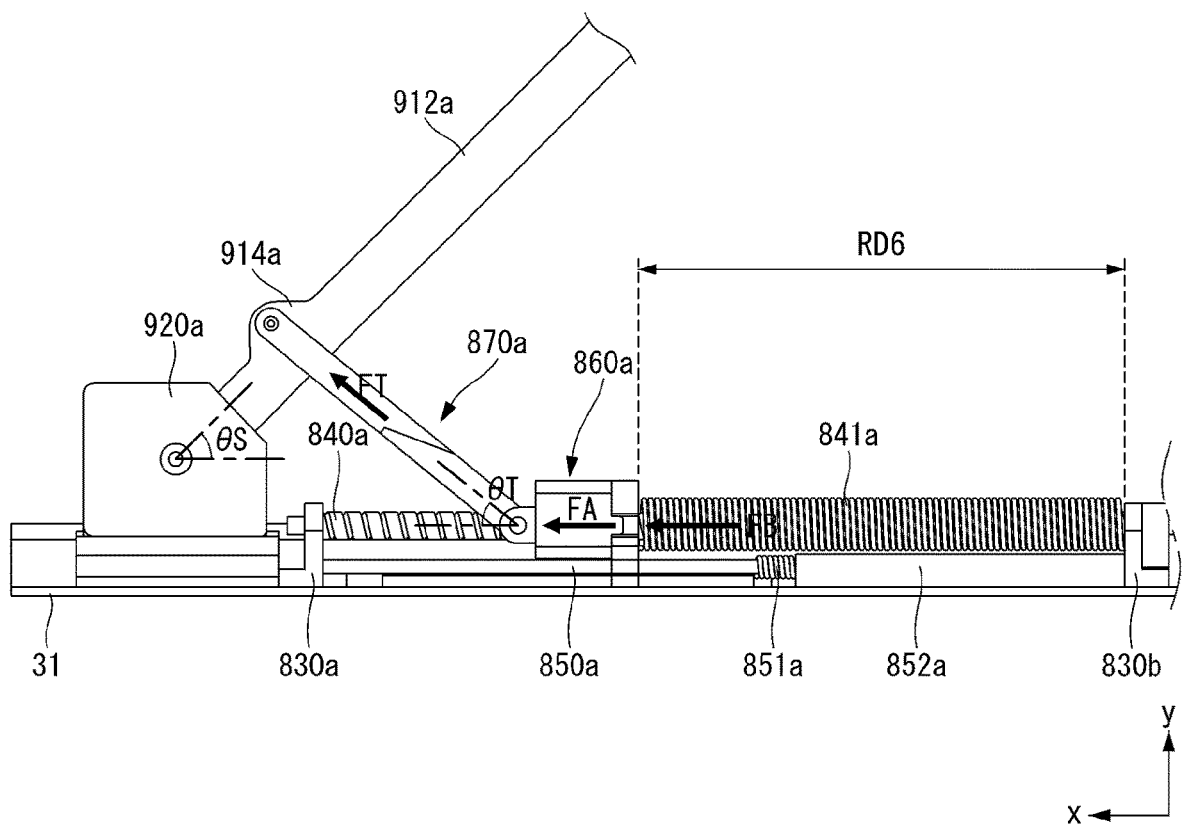
Figure 57:
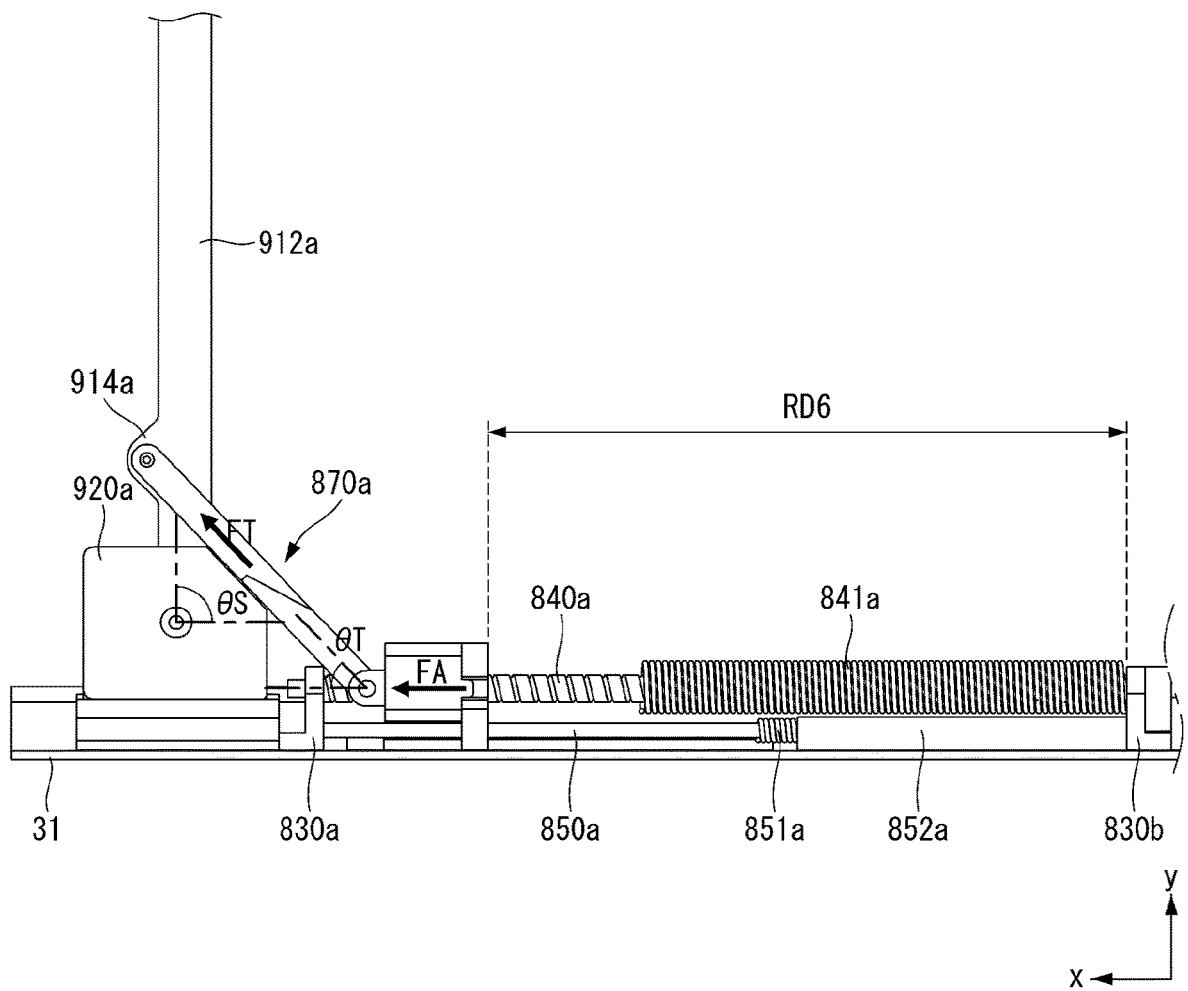

Referring to FIGS. 55 to 57, the second arm 912a may stand up by restoring forces provided by the first right spring 841a and the second right spring 851a.

An angle formed by the second arm 912a and the base 31 may be called "theta S." An angle formed by the right rod 870a and the base 31 may be called "theta T." A force by which the motor assembly 810 moves the right slider 860a to the +x-axis direction may be called FA. A force that is applied from the first right spring 841a to the right slider 860a may be called FB. A force that is applied from the second right spring 851a to the right slider 860a may be called FC. A force that is transferred from the right rod 870a to the second arm 912a may be called FT.

If the second arm 912a has fully lain down with respect to the base 31, the angle "theta S" and the angle "theta T" may have a minimum value. If the second arm 912a changes from the state in which it has fully lain down with respect to the second base 31 to the standing state, the angle "theta S" and the angle "theta T" may gradually increase.

If the second arm 912a has fully lain down with respect to the base 31, the first right spring 841a may be compressed. The compressed first right spring 841a may provide the restoring force FB to the right slider 860a. The restoring force FB may act in the +x direction. If the second arm 912a has fully lain down with respect to the base 31, compression displacement of the first right spring 841a may be a maximum, and the restoring force FB may have a maximum value. If the second arm 912a changes from the state in which it has fully lain down with respect to the base 31 to the standing state, compression displacement of the first right spring 841a may be gradually decreased, and the amount of the restoring force FB may be gradually decreased.

If the second arm 912a has fully lain down with respect to the base 31, the second right spring 851a may be compressed. The compressed second right spring 851a may provide the restoring force FC to the right slider 860a. The restoring force FC may act in the +x direction. If the second arm 912a has fully lain down with respect to the base 31, compression displacement of the second right spring 851a may be a maximum, and the restoring force FC may have a maximum value. If the second arm 912a changes from the state in which it has fully lain down with respect to the base 31 to the standing state, compression displacement of the second right spring 851a may be gradually decreased, and the amount of the restoring force FC may be gradually decreased.

The force FT that is transferred from the right rod 870a to the second arm 912a may be the resultant force of the force FA by which the motor assembly 810 moves the right slider 860a to the +x-axis direction, the restoring force FB of the first right spring 841a, and the restoring force FC of the second right spring 851a.

If the second arm 912a starts to stand up in the state in which the second arm 912a has fully lain down with respect to the base 31, a load of the motor assembly 810 may be a maximum. In this case, the restoring force FB provided by the first right spring 841a may be a maximum. Furthermore, the restoring force FC provided by the second springs 851a and 851b may be a maximum.

If the second arm 912a changes from the state in which it has fully lain down with respect to the base 31 to the standing state, the restoring forces provided by the first right spring 841a and the second right spring 851a may assist the second arm 912a to stand up. A load of the motor assembly 810 can be reduced because the first right spring 841a and the second right spring 851a assist the second arm 912a to stand up.

The first right spring 841a and the second right spring 851a may provide restoring forces (i.e., the resultant force of the restoring force FB and the restoring force FC) to the right slider 860a at the same time. The restoring forces (i.e., the resultant force of the restoring force FB and the restoring force FC) may be provided to the right slider 860a until a distance RD5 between the right slider 860a and the right locking protrusion 852a becomes equal to the length of the second right spring 851a.

When the distance RD5 between the right slider 860a and the right locking protrusion 852a becomes equal to the length of the second right spring 851a, compression displacement of the second right spring 851a may become 0. When compression displacement of the second right spring 851a becomes 0, the restoring force FC that is provided from the second right spring 851a to the right slider 860a may become 0.

if the distance RD5 between the right slider 860a and the right locking protrusion 852a becomes greater than the length of the second right spring 851a, only the first right spring 841a may provide the restoring force FB to the right slider 860a. The restoring force FB may be provided to the right slider 860a until a distance RD6 between the right slider 860a and the second right bearing 830b becomes equal to the length of the first right spring 841a.

When the distance RD6 between the right slider 860a and the second right bearing 830b becomes equal to the first right spring 841a, compression displacement of the first right spring 841a may become 0. When compression displacement of the first right spring 841a becomes 0, the restoring force FB that is provided from the first right spring 841a to the right slider 860a may become 0.

When the distance RD6 between the right slider 860a and the second right bearing 830b becomes greater than the length of the first right spring 841a, the motor assembly 810 may stand the second arm 912a without using a restoring force provided by the first right spring 841a or the second right spring 851a.

A structure formed by the first left spring 841b, the second left spring 851b, the left locking protrusion 852b, the left slider 860b, the left guides 850c and 850d, the left lead screw 840b, the left rod 870b, and the second arm 912a may be symmetrical to the structure formed by the first right spring 841a, the second right spring 851a, the right locking protrusion 852a, the right slider 860a, the right guides 850a and 850b, the right lead screw 840a, the right rod 870a, and the second arm 912a. In this case, the symmetry axis may be the symmetry axis "ys" of the motor assembly 810.

Figure 58:
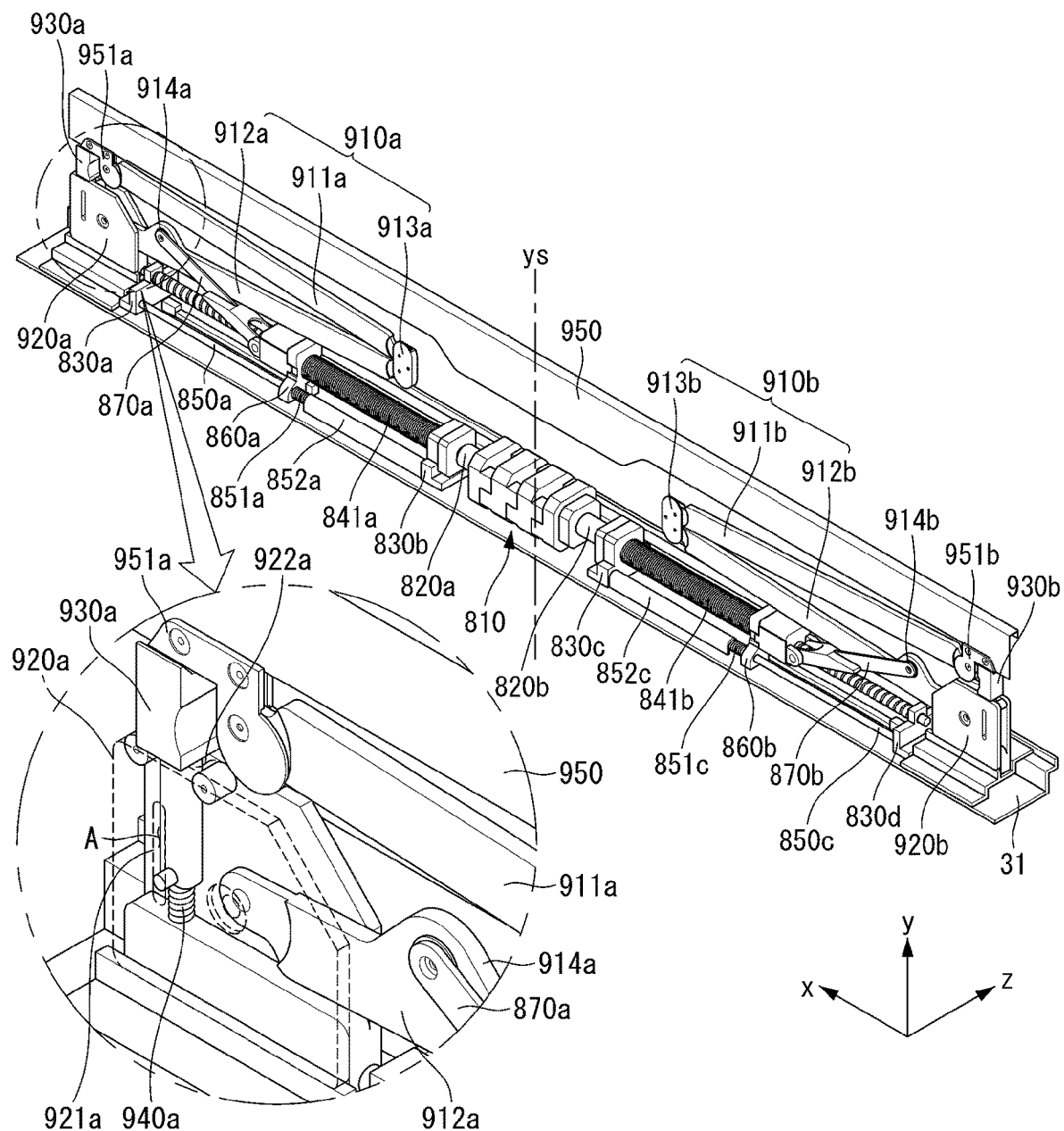

Referring to FIG. 58, pushers 930a and 930b may be connected to the link mounts 920a and 920b. The pushers 930a and 930b may include a right pusher 930a disposed on the right side of the motor assembly 810 and a left pusher 930b disposed on the left side of the motor assembly 810. The pushers 930a and 930b may be referred to herein as elastic members.

The link mounts 920a and 920b may form an accommodation space A. The accommodation space A may accommodate springs 940a and 940b and the pushers 930a and 930b. The springs 940a and 940b may include the right spring 940a disposed on the right side of the motor assembly 810 and the left spring 940b disposed on the left side of the motor assembly 810. The accommodation space A may also be referred to as an internal space A.

The link mount 920a and 920b may include a first hole 922a (e.g., a first hole for the link mounts 920a and 920b) that connects the accommodation space A and an external space. The first hole 922a may be formed in the top surface of the link mounts 920a and 920b. The first hole 922a may also be referred to as a hole 922a.

The pushers 930a and 930b may be disposed in a direction vertical to the base 31. Alternatively, the pushers 930a and 930b may be disposed in parallel to the y axis. The springs 940a and 940b may be located in a direction vertical to the base 31. Alternatively, the springs 940a and 940b may be disposed in a direction parallel to the y axis.

The pushers 930a and 930b may include first parts 931a and 931b and second parts 932a and 932b, respectively. The second parts 932a and 932b may be connected to the lower sides of the first parts 931a and 931b. The bottoms of the second parts 932a and 932b may be connected to the springs 940a and 940b. Some of or the entire second parts 932a and 932b may be accommodated in the accommodation space A formed by the link mounts 920a and 920b. Each of the second parts 932a and 932b may have the same diameter as the first hole 922a or may have a smaller diameter than the first hole 922a. The second parts 932a and 932b may pass through the first hole 922a.

The first parts 931a and 931b may be located outside the link mounts 920a and 920b. Alternatively, the first parts 931a and 931b may be located outside the accommodation space A of the link mounts 920a and 920b. Each of the first parts 931a and 931b may have a greater diameter than the first hole 922a.

The first parts 931a and 931b may be brought into contact with an upper surface of the display screen. For example, the first parts 931a and 931b may contact the upper bar and/or the link brackets 951a and 951b or may be spaced apart from each other. For example, if the second arms 912a and 912b have fully lain down with respect to the base 31 the first parts 931a and 931b may come into contact with the link brackets 951a and 951b. Alternatively, if the second arms 912a and 912b have fully stood up with respect to the base 31 the first parts 931a and 931b may be spaced apart from the link brackets 951a and 951b.

If the first parts 931a and 931b come into contact with the link brackets 951a and 951b, forces from the link brackets 951a and 951b may be applied to the pushers 930a and 930b. The forces applied to the pushers 930a and 930b may be downward. Alternatively, the forces applied to the pushers 930a and 930b may be the −y-axis direction. Alternatively, the link brackets 951a and 951b may pressurize the pushers 930a and 930b. The direction in which the link brackets 951a and 951b pressurize the pushers 930a and 930b may be downward. Alternatively, the direction in which the link brackets 951a and 951b pressurize the pushers 930a and 930b may be the −y-axis direction.

When the forces are applied to the first parts 931a and 931b, the springs 940a and 940b may be compressed. The compressed springs 940a and 940b may provide restoring forces to the pushers 930a and 930b. The restoring forces may have a direction opposite the direction in which the forces are applied to the first parts 931a and 931b. Alternatively, the restoring force may act in the +y-axis direction.

The link mount 920a and 920b may include a second hole 921a (e.g., a second hole for the link mounts 920a and 920b). The second hole 921a may connect the accommodation space A and an external space. Some of or the entire springs 940a and 940b may be exposed to the outside through the second hole 921a. Some of or the entire pushers 930a and 930b may be exposed to the outside through the second hole 921a. When the display device is to be maintained or repaired, a service provider may check the operating state of the pushers 930a and 930b through the second hole 921a. The second hole 921a may provide a service provider with maintenance or repair convenience.

Figure 59:
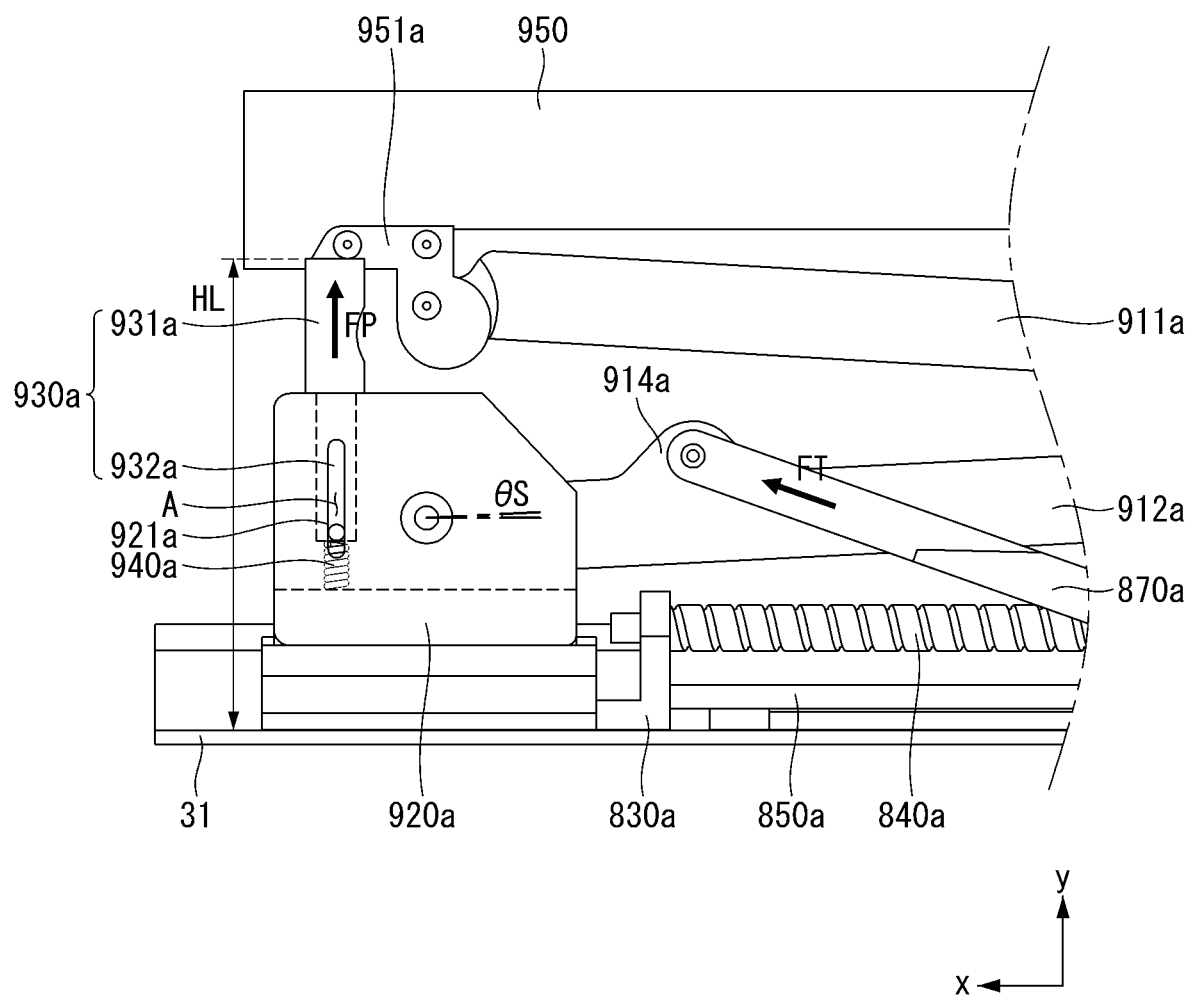
Figure 60:
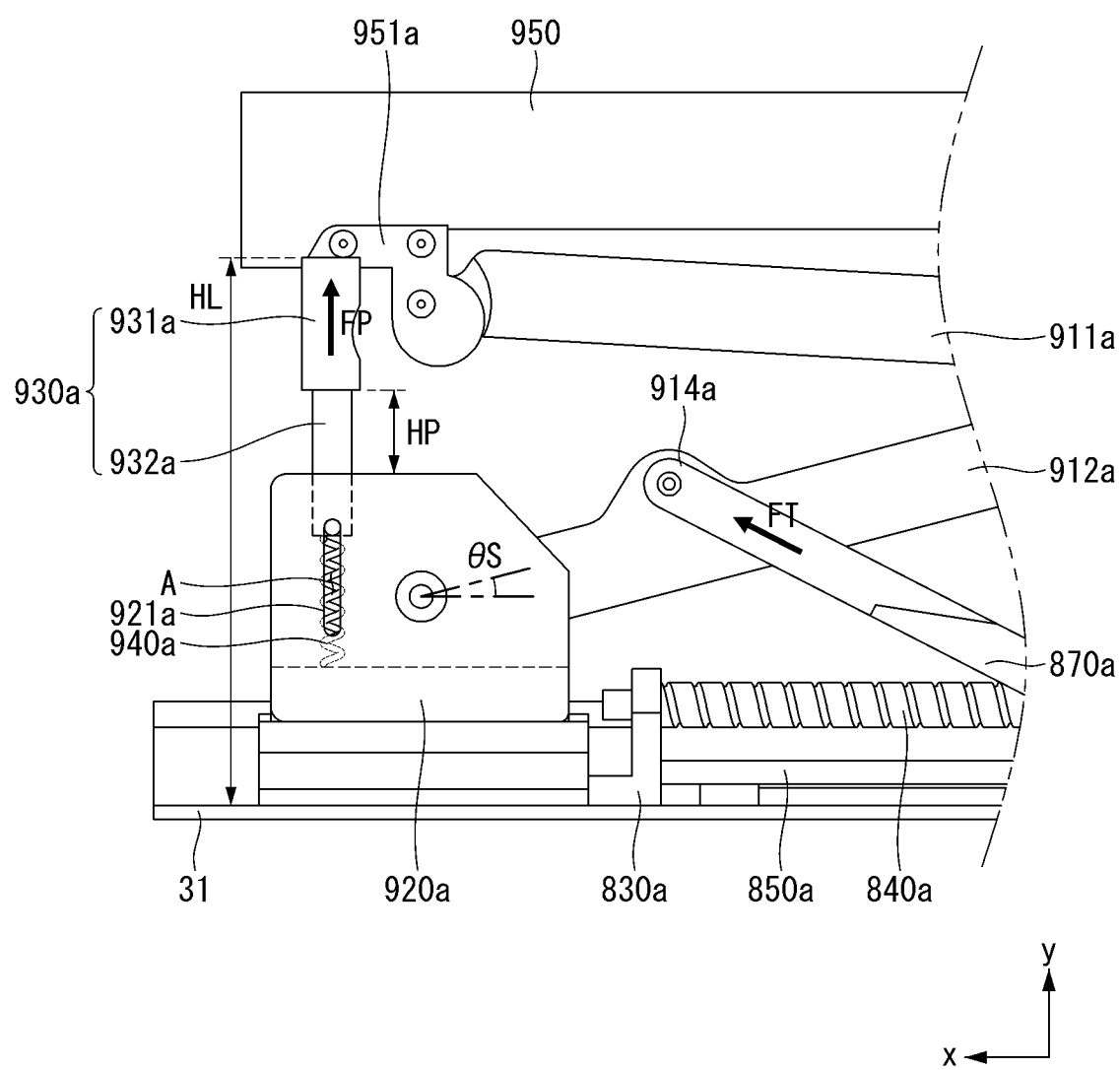
Figure 61:
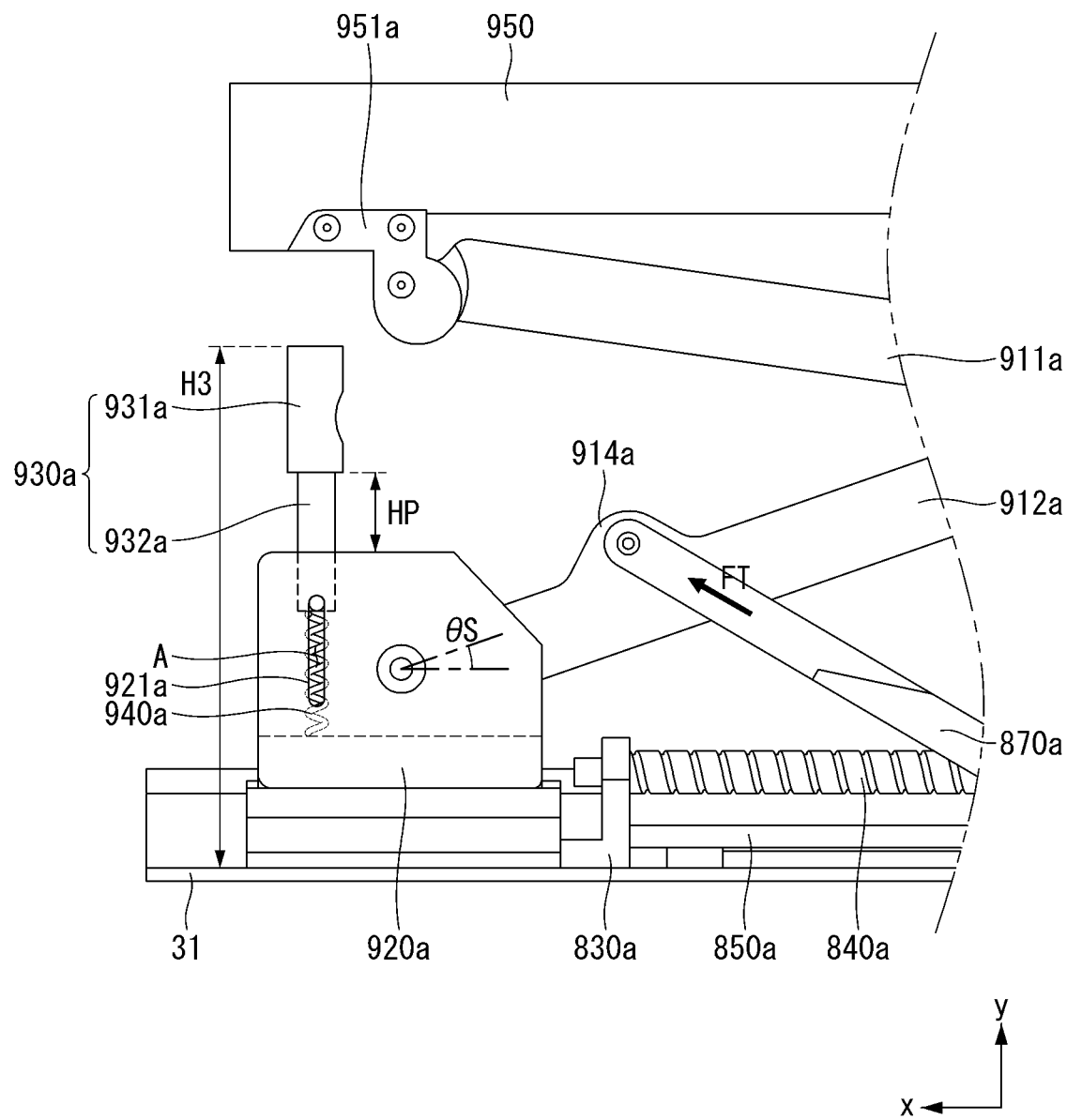

Referring to FIGS. 59 to 61, the right link 910a may stand up by the restoring force provided by the right pusher 930a. The right link 910a is described below, for example.

An angle formed by the second arm 912a and the base 31 may be called "theta S." A force that is transferred from the right rod 870a to the second arm 912a may be called FT. A force that is transferred from the right pusher 930a to the right link bracket 951a may be called FP.

Referring to FIG. 59, if the second arm 912a has fully lain down with respect to the base 31, the angle "theta S" may have a minimum value. The right spring 940a connected to the right pusher 930a may be compressed to as much as possible, and the amount of the restoring force FP may have a maximum value. The compressed right spring 940a may provide the restoring force FP to the right pusher 930a. The right pusher 930a may transfer the restoring force FP to the right link bracket 951a. The restoring force FP may act in the +y-axis direction.

If the second arm 912a has fully lain down with respect to the base 31, the distance HL from the base 31 to the top of the right pusher 930a may have a minimum value. The first part 931a of the right pusher 930a may protrude to the outside the right link mount 920a. The second part 932a of the right pusher 930a may be fully accommodated in the accommodation space 923a of the right link mount 920a.

Referring to FIG. 60, if the second arm 912a changes from the state in which it has fully lain down with respect to the base 31 to the standing state, the angle "theta S" may gradually increase. Compression displacement of the right spring 940a may be gradually decreased, and the amount of the restoring force FP may gradually decrease.

As the angle "theta S" gradually increases, at least part of the second part 932a of the right pusher 930a may be protruded to the outside of the right link mount 920a. The length in which the second part 932a of the right pusher 930a has protruded to the outside of the right link mount 920a may be referred to as HP. The distance HL from the base 31 to the top of the right pusher 930a may be increased by the length HP compared to a case where the second arm 912a has fully lain down with respect to the base 31.

Referring to FIG. 61, when the standing up of the second arm 912a with respect to the base 31 is in progress, the right pusher 930a and the right link bracket 951a may be separated from each other. In this case, compression displacement of the right spring 940a may become 0. When compression displacement of the right spring 940a becomes 0, the restoring force FP that is provided from the right pusher 930a to the right link bracket 951a may become 0. For example, the right pusher 930a may extend initially and a fraction of a total distance in which the arms 911a and 912a must move to fully extend the flexible display. As illustrated, for example, in FIG. 61, a length of the first portion 931a in the vertical direction is smaller than a height of the link mount 920a in the vertical direction such that the first portion 931a no longer makes contact after the initial phase of the movement.

Furthermore, the length HP in which the second part 932a of the right pusher 930a has protruded to the outside of the right link mount 920a may have a maximum value. Furthermore, the distance HL from the base 31 to the top of the right pusher 930a may have a maximum value.

That is, while the right pusher 930a comes into contact with the right link bracket 951a, the restoring force may be applied to the right link bracket 951a. Accordingly, the restoring force can assist the second arm 912a to stand up and can reduce a load of the motor assembly 810.

The lead screws 840a and 840b may be driven by the single motor assembly 810. Since the lead screws 840a and 840b are driven by the single motor assembly 810, the second arms 912a and 912b can stand up while forming symmetry. If the lead screws 840a and 840b are driven by the single motor assembly 810, however, a load applied to the motor assembly 810 in order to stand the second arms 912a and 912b may be excessively increased. In this case, since the right pusher 930a applies the restoring force to the right link bracket 951a, the restoring force can assist the second arm 912a to stand up and can reduce a load of the motor assembly 810.

Alternatively, if the second arm 912a changes from the state in which it has stood up with respect to the base 31 to the state in which it has fully lain down, the restoring force that is provided from the right pusher 930a to the right link bracket 951a can reduce an impact generated when the link 910a lies down with respect to the base 31. That is, the restoring force that is provided from the right pusher 930a to the right link bracket 951a plays the role of a damper when the link 910a lies down with respect to the base 31. A load of the motor assembly 810 can be reduced because the right pusher 930a plays the role of a damper.

A structure formed by the left pusher 930b, the left spring 940b, the left link bracket 951b, the left link mount 920b, and the left rod 870b may be symmetrical to the structure formed by the right pusher 930a, the right spring 940a, the right link bracket 951a, the right link 910a, and the right rod 870a. In this case, the symmetry axis may be the symmetry axis "ys" of the motor assembly 810.

Figure 62:
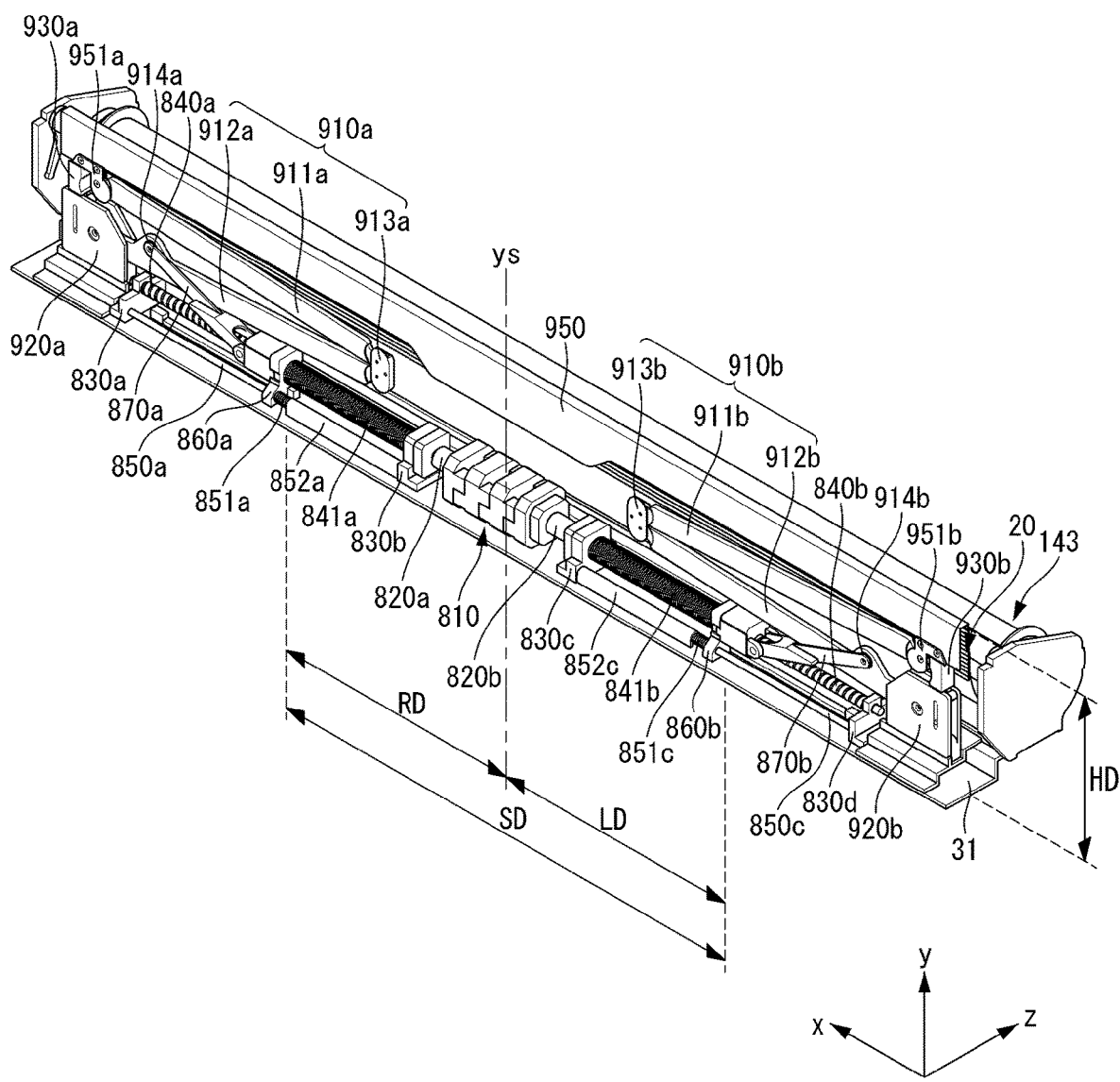
Figure 63:
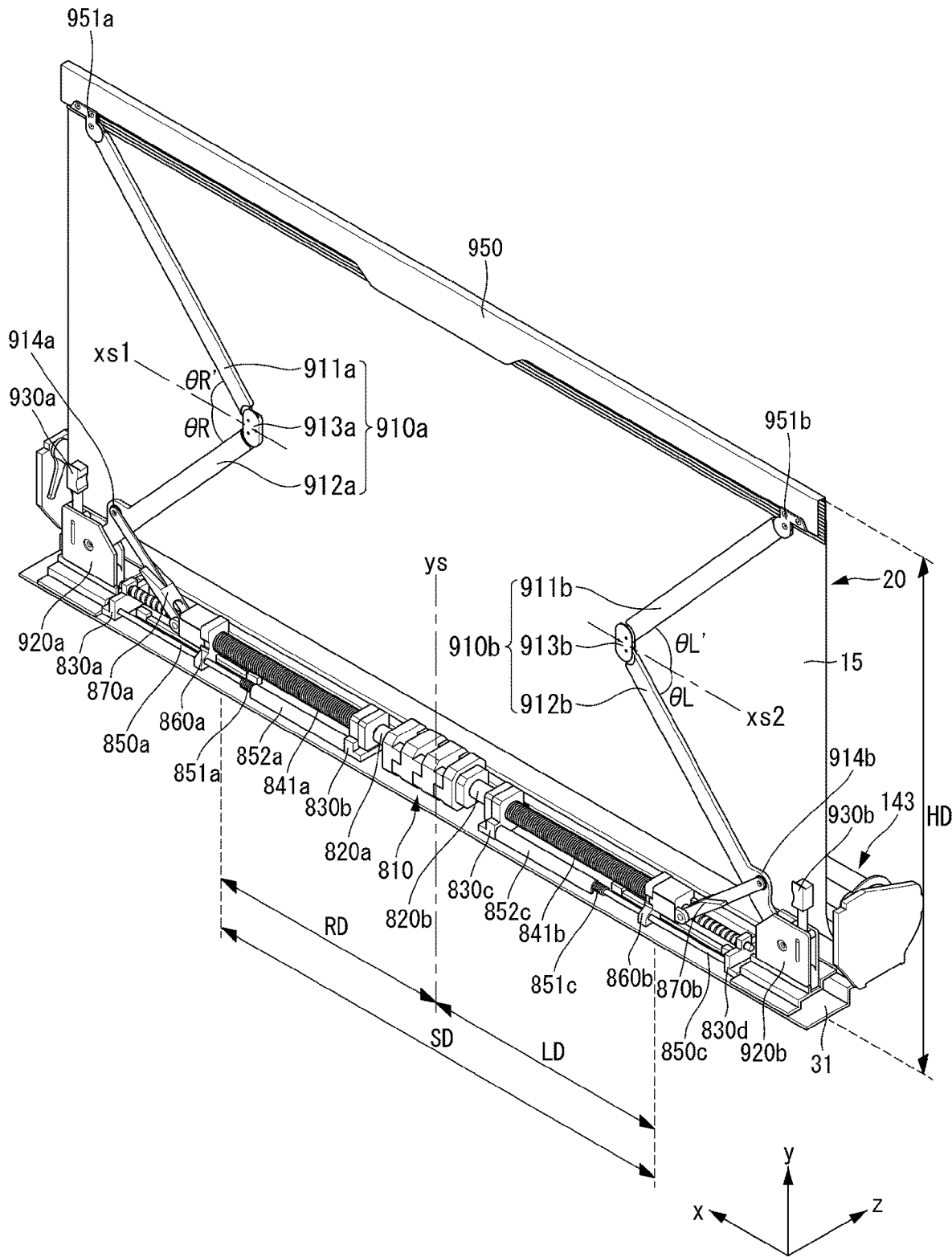
Figure 64:
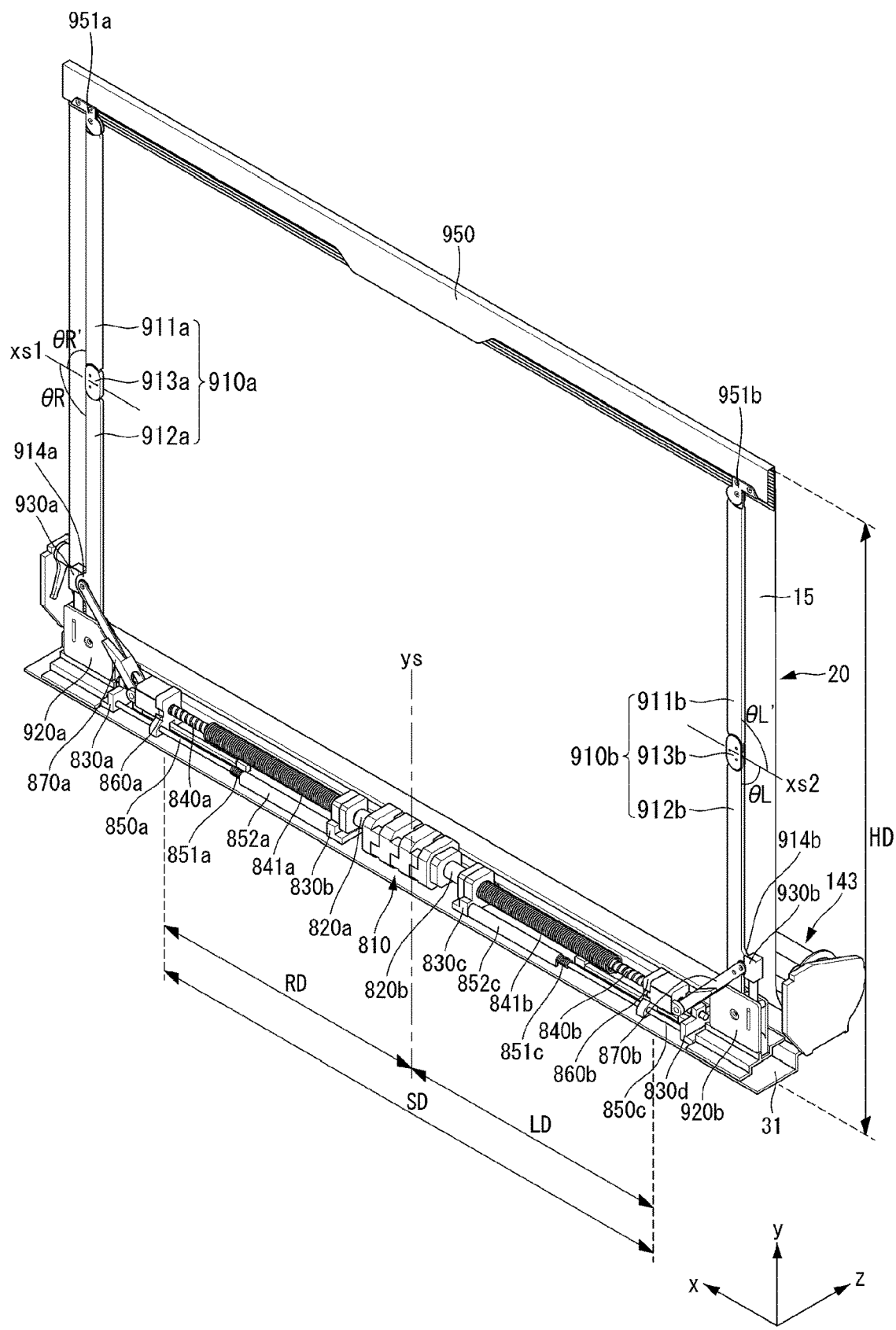

Referring to FIGS. 62 to 64, the panel roller 143 may be installed on the base 31. The panel roller 143 may be disposed at the front of the lead screws 840a and 840b. Alternatively, the panel roller 143 may be disposed in parallel to the length direction of the lead screws 840a and 840b. Alternatively, the panel roller 143 may be spaced apart from the lead screws 840a and 840b.

The display portion 20 may include the display panel 10 and the module cover 15. The lower side of the display portion 20 may be connected to the panel roller 143, and the upper side of the display portion 20 may be connected to the upper bar 75. The display portion 20 may be wound on or unwound from the panel roller 143.

A distance from the symmetry axis "ys" of the motor assembly 810 to the right slider 860a may be called a distance RD. A distance from the symmetry axis "ys" of the motor assembly 810 to the left slider 860b may be called a distance LD. The distance between the right slider 860a and the left slider 860b may be called a distance SD. The distance SD may be the sum of the distance RD and the distance LD. A distance from the base 31 to the top of the display portion 20 may be called a distance HD.

Referring to FIG. 62, if the second arms 912a and 912b have fully lain down with respect to the base 31, the distance SD between the right slider 860a and the left slider 860b may have a minimum value. The distance RD from the symmetry axis "ys" of the motor assembly 810 to the right slider 860a and the distance LD from the symmetry axis "ys" of the motor assembly 810 to the left slider 860b may be the same.

If the second arms 912a and 912b have fully lain down with respect to the base 31, the distance HD from the base 31 to the top of the display portion 20 may have a minimum value.

If the second arms 912a and 912b have fully lain down with respect to the base 31, the first springs 841a and 841b may come into contact with the sliders 860a and 860b. Furthermore, the second springs 851a and 851b may come into contact with the sliders 860a and 860b. Furthermore, the pushers 930a and 930b may come into contact with the link brackets 951a and 951b.

If the second arms 912a and 912b have fully lain down with respect to the base 31, the amount of compression of the first springs 841a and 841b may have a maximum value and the amount of restoring forces provided from the first springs 841a and 841b to the sliders 860a and 860b may have a maximum value.

If the second arms 912a and 912b have fully lain down with respect to the base 31, the amount of compression of the second springs 851a and 851b may have a maximum value and the amount of restoring forces provided from the second springs 851a and 851b to the sliders 860a and 860b may have a maximum value.

If the second arms 912a and 912b have fully lain down with respect to the base 31, the amount of compression of the springs 940a and 940b may have a maximum value and the amount of restoring forces provided from the springs 940a and 940b to the pushers 930a and 930b may have a maximum value.

If the second arms 912a and 912b start to stand up with respect to the base 31, the second arms 912a and 912b may stand up using the restoring forces provided by the first springs 841a and 841b, the second springs 851a and 851b, and the springs 940a and 940b. Accordingly, a load applied to the motor assembly 810 can be reduced.

Referring to FIG. 63, as the standing up of the second arms 912a and 912b with respect to the base 31 is in progress, the distance SD between the right slider 860a and the left slider 860b may gradually increase. Although the distance SD increases, the distance LD and the distance RD may be the same. That is, the right slider 860a and the left slider 860b may be located while forming symmetry based on the symmetry axis "ys" of the motor assembly 810. Furthermore, the degree that the second arms 912a and 912b of the right link 910a stands up with respect to the base 31 and the degree that the second arms 912a and 912b of the left link 910b stand up with respect to the base 31 may be the same.

As the standing up of the second arms 912a and 912b with respect to the base 31 is in progress, the distance HD from the base 31 to the top of the display portion 20 may gradually increase. The display portion 20 may be unwound from the panel roller 143. Alternatively, the display portion 20 may be unfolded from the panel roller 143.

When the second arms 912a and 912b sufficiently stand up with respect to the base 31, the first springs 841a and 841b may be separated from the sliders 860a and 860b. Furthermore, when the second arms 912a and 912b sufficiently stand up with respect to the base 31, the second springs 851a and 851b may be separated from the sliders 860a and 860b. Furthermore, when the second arms 912a and 912b sufficiently stand up with respect to the base 31, the pushers 930a and 930b may be separated from the link brackets 951a and 951b.

The separation of the first springs 841a and 841b from the sliders 860a and 860b, the separation of the second springs 851a and 851b from the sliders 860a and 860b, and the separation of the pushers 930a and 930b from the link brackets 951a and 951b may be independently performed. That is, the sequence of the separation of the first springs 841a and 841b from the sliders 860a and 860b, the separation of the second springs 851a and 851b from the sliders 860a and 860b, and the separation of the pushers 930a and 930b from the link brackets 951a and 951b may be varied.

An angle formed by an axis "xs1" parallel to the base 31 and the second arm 912a may be referred to as "theta R." Furthermore, an angle formed by the axis "xs1" parallel to the base 31 and the first arm 911a may be referred to as theta R'. The axis "xs" and the x axis may be parallel.

If the second arm 912a has fully lain down with respect to the base 31 or while the second arm 912a stands up with respect to the base 31 or if the standing up of the second arm 912a with respect to the base 31 has been completed, the angle "theta R" and the angle theta R' may remain identical.

An angle formed by an axis "xs2" parallel to the base 31 and the second arm 912b may be referred to as "theta L.". Furthermore, an angle formed by the axis "xs2" parallel to the base 31 and the first arm 911b may be referred to as theta L'. The axis "xs2" and the x axis may be parallel.

If the second arm 912b has fully lain down with respect to the base 31 or while the second arm 912b stands up with respect to the base 31 or if the standing up of the second arm 912b with respect to the base 31 has been completed, the angle "theta L" and the angle theta L' may remain identical.

The axis "xs1" and the axis "xs2" may be the same axis.

Referring to FIG. 64, when the second arms 912a and 912b fully stand up with respect to the base 31, the distance SD between the right slider 860a and the left slider 860b may have a maximum value. Although the distance SD is a maximum, the distance LD and the distance RD may be the same.

When the second arms 912a and 912b fully stand up with respect to the base 31, the distance HD from the base 31 to the top of the display portion 20 may have a maximum value.

The aforementioned embodiments of the present disclosure are not mutually exclusive and distinct from each other. In the aforementioned embodiments of the present disclosure, elements or functions may be used in combination or combined.

In the aforementioned drawings, the structure of the display device in which the display portion is rolled up from the inside of the housing has been illustrated, but the present disclosure is not limited thereto. The present disclosure may be applied to the structure of a display device in which the display portion is rolled down from the inside of the housing.

A display device according to an embodiment of the present disclosure includes a housing, a flexible display having an upper surface, a lift assembly provided in the housing and coupled to the upper surface of the flexible display screen to extend the flexible display screen outside the housing, a motor provided in the housing and coupled to the lift assembly to raise the flexible display screen, and an elastic member provided adjacent to the upper surface of the flexible display screen, the elastic member configured to apply a vertical force to the upper surface of the flexible display screen.

The flexible display may be an OLED display configured to be rolled and stored in the housing.

The lift assembly may include a left lever assembly provided on a left side of the housing and a right lever assembly provided on a right side of the housing, The motor may be provided between the left lever assembly and the right lever assembly and coupled to simultaneously raise the left and right lever assemblies.

The left and right lever assemblies may include a first arm coupled to the upper portion of the flexible display, a second arm coupled between the first arm and the housing. The first arm and the second arm may be folded when the flexible display is fully retracted in the housing and the first arm and the second arm are vertically aligned when the flexible display is fully extended.

The lift assembly may include a screw rod rotatably coupled to the motor, a pair of screw nuts in moveable engagement with the screw rod and configured to laterally move in opposite directions. The pair of screw nuts may be coupled to the left and right arm assemblies to raise the left and right lever assemblies.

The motor may rotate the screw rod to simultaneously raise both the left and right lever assemblies.

The upper surface of the flexible display may be engaged with the elastic member when the flexible display is fully retracted in the housing.

The elastic member may have a body and a protruding member that extends from the body.

The elastic member may be configured to extend a prescribed distance from a compressed state to an extended state.

The elastic member may apply the vertical force to the upper surface of the flexible display for the prescribed distance when the flexible display is fully retracted in the housing.

An upper portion of the elastic member may be positioned inside the housing when the elastic member is fully extended.

The elastic member may include a left elastic member and a right elastic member. The left elastic member may be provided at a left side of the housing to apply a vertical force at a left side of the upper surface of the flexible display. The right elastic member may be provided at a right side of the housing to apply a vertical force at a right side of the upper surface of the flexible display.

The foregoing embodiments are merely examples and are not to be considered as limiting the present disclosure. The present teachings may be readily applied to other types of methods and apparatuses. The features, structures, methods, and other characteristics of the embodiments described herein may be combined in various ways to obtain additional and/or alternative embodiments.

Certain embodiments or other embodiments of the disclosure described above are not mutually exclusive or distinct from each other. Any or all elements of the embodiments of the disclosure described above may be combined or combined with each other in configuration or function.

Although a plurality of the illustrative embodiments have been described, it should be understood that numerous other modifications and embodiments may be devised by those skilled in the art that will fall within the scope of the principles of this disclosure. More particularly, various variations and modifications are possible in the elements and/or arrangements of the subject combination arrangement within the scope of the disclosure, the drawings and the appended claims. In addition to the variations and modifications in the elements and/or arrangements, alternative uses will also be apparent to those skilled in the art.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present disclosure.

Spatially relative terms, such as "lower" "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a" and "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising: a housing; a motor; a roller disposed in the housing; a flexible display configured to be rolled around the roller; an upper assembly coupled to an upper region of the flexible display; a lift assembly comprising a plurality of arms coupled to the upper assembly and configured to extend the flexible display from the housing by operation of the motor; a module cover comprises a plurality of segments, each segment coupled to a rear of the flexible display along a widthwise direction of the flexible display, wherein the plurality of segments is configured to be rolled around a module cover roller; at least one magnet disposed at each of the plurality of arms and positioned to face the rear of the flexible display; and a panel protection portion disposed between the flexible display and the module cover, wherein the module cover is forced against the plurality of arms by a magnetic force of the at least one magnet to maintain a close adhesion of the flexible display and the module cover to the plurality of arms as the flexible display is extended from the housing by the lift assembly, wherein the panel protection portion is pulled toward the at least one magnet by the magnetic force, wherein a position of the at least one magnet with respect to the flexible display changes in response to a movement of the plurality of arms, and wherein the at least one magnet is elongated and positioned along a lengthwise direction of each of the plurality of arms and aligned vertically when the lift assembly is fully extended.

2. The display device of claim 1, wherein the panel protection portion is disposed on a rear surface of the flexible display such that the flexible display is supported against the plurality of arms based on the magnetic force on the panel protection portion.

3. The display device of claim 1, wherein the at least one magnet is accommodated within a depressed portion at one of the plurality of arms.

4. The display device of claim 3, wherein a surface of the at least one magnet is flush with a surface of the one of the plurality of arms surrounding the depressed portion.

5. The display device of claim 1, wherein the at least one magnet comprises a plurality of magnets spaced apart from each other at the plurality of arms.

6. The display device of claim 5, wherein the plurality of arms comprises a first arm and a second arm and the plurality of magnets are correspondingly positioned at each of the first arm and the second arm.

7. The display device of claim 6, wherein a corresponding one of the plurality of magnets is positioned along each segment of the first arm and the second arm.

8. The display device of claim 6, wherein corresponding two or more of the plurality of magnets are positioned along the first arm and the second arm.

* * * * *